United States Patent [19]

Egara et al.

[11] Patent Number: 5,367,216
[45] Date of Patent: Nov. 22, 1994

[54] SURFACE ACOUSTIC WAVE ELEMENT AND COMMUNICATION SYSTEM USING THE SAME

[75] Inventors: Koichi Egara, Tokyo; Kenji Nakamura, Atsugi; Norihiro Mochizuki, Machida, all of Japan

[73] Assignee: Canon Kabushiki Kaisha, Tokyo, Japan

[21] Appl. No.: 921,746

[22] Filed: Jul. 30, 1992

[30] Foreign Application Priority Data

| Aug. 2, 1991 | [JP] | Japan | 3-194125 |
| Aug. 2, 1991 | [JP] | Japan | 3-194128 |
| Nov. 5, 1991 | [JP] | Japan | 3-288625 |
| Nov. 6, 1991 | [JP] | Japan | 3-289933 |

[51] Int. Cl.$^5$ .................................................. H01L 41/08
[52] U.S. Cl. ............................ 310/313 R; 310/313 B; 310/313 D; 333/151; 333/194; 333/195; 364/821
[58] Field of Search ........... 310/313 R, 313 A, 313 B, 310/313 C, 313 D; 364/821; 333/150–155, 193–196

[56] References Cited

U.S. PATENT DOCUMENTS

| 3,753,164 | 8/1973 | De Vries | 310/313 D X |
| 3,886,484 | 5/1975 | Dias et al. | 310/313 R X |
| 4,055,819 | 10/1977 | Wagers et al. | 310/313 R X |
| 4,056,793 | 11/1977 | Wagers et al. | 310/313 R X |
| 4,063,198 | 12/1977 | Wagers et al. | 310/313 R X |
| 4,193,045 | 3/1980 | Houkawa et al. | 310/313 R X |
| 4,434,481 | 2/1984 | Toda et al. | 310/313 R X |
| 4,798,987 | 1/1989 | Nakamura | 310/313 |

FOREIGN PATENT DOCUMENTS

| 0373404 | 6/1990 | European Pat. Off. |
| 3729014 | 3/1989 | Germany |

OTHER PUBLICATIONS

"Application of Surface Acoustic Waves" by Kimio Shibayama; Research Institute of Electrical Communication, Tohoku University, Sendai; pp. 457–463.

"Surface Acoustic Wave Technology"; by Kimio Shibayama; Institute of Electronics Communication Engineers of Japan; pp. 82–87 Television; No. 30, vol. 6 (1976) pp. 457–463.

"Surface Acoustic Wave Convolver Using Multiple Waveguide" by Y. Nakagawa et al., Electronic Communication Society Journal, vol. J69-C, No. 2 pp. 190–198 (1986), Extracted English Translation.

"Interaction Between Elastic Surface Waves In Piezoelectric Materials" by L. O. Svaasand, Applied Physics Letter., vol. 15, No. 9, 1 Nov. 1969 pp. 300–302.

"Bulk–wave generation due to the nonlinear interaction of surface acoustic waves" by Yasuhiko Nakagawa et al., Journal of Applied Physics vol. 49, No. 12, Dec. 1978.

"Surface Acoustic Wave Devices and Applications" by D. P. Morgan; Ultrasonics. Mar. 1974 pp. 74–75.

*Primary Examiner*—Mark O. Budd
*Attorney, Agent, or Firm*—Fitzpatrick, Cella, Harper & Scinto

[57] ABSTRACT

A surface acoustic wave element is provided with a piezoelectic substrate, a first input transducer, a second input transducer and an output device such as output electrode. The piezoelectric substrate has a first and a second surfaces which are mutually faced. The first input transducer is formed on the first surface of the substrate to generate a first surface acoustic wave which propagates in a predetermined direction. The second transducer is formed on the first surface of the substrate to generate a second surface acoustic wave which propagates in a direction opposite to the predetermined direction. The output device is formed on the first surface of the substrate to extract a signal produced by an interaction of the first and second surface acoustic waves. At least part of the second surface of the substrate is caused to be inclined in a direction perpendicular to the predetermined direction with respect to the first surface.

113 Claims, 25 Drawing Sheets

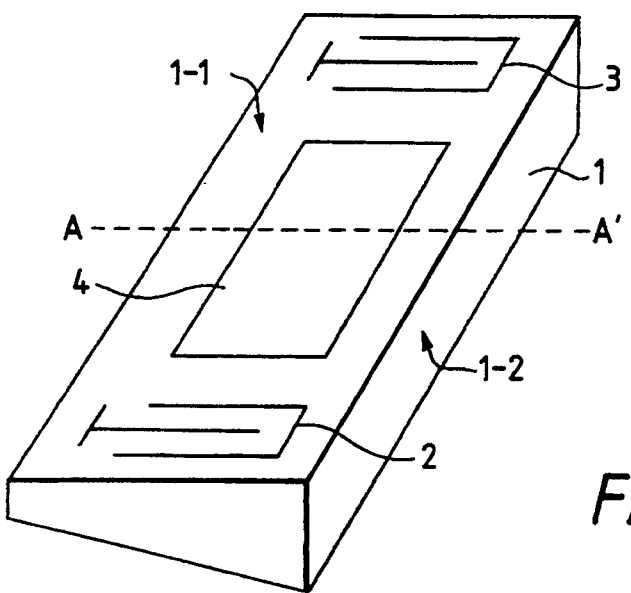
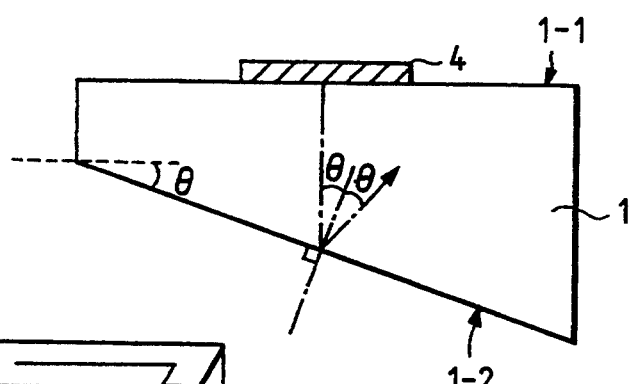
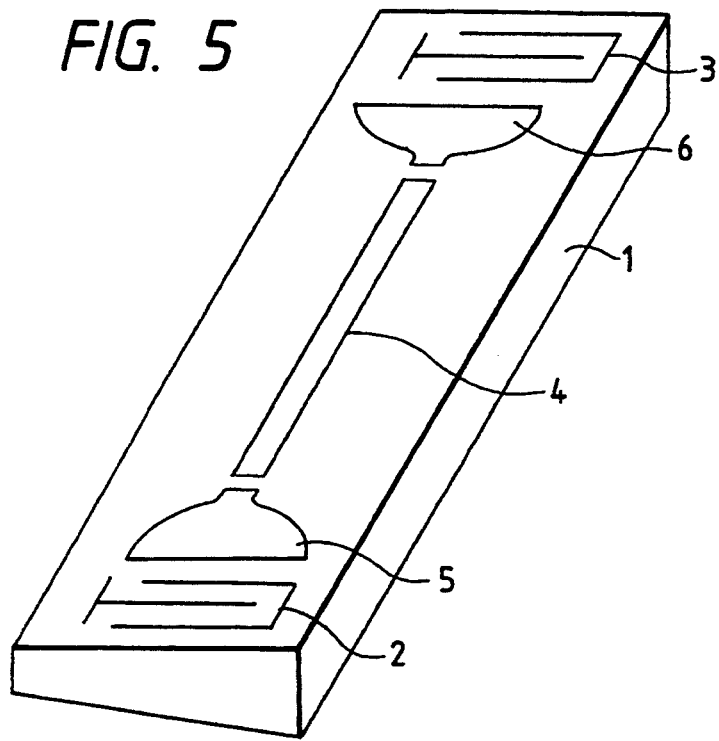

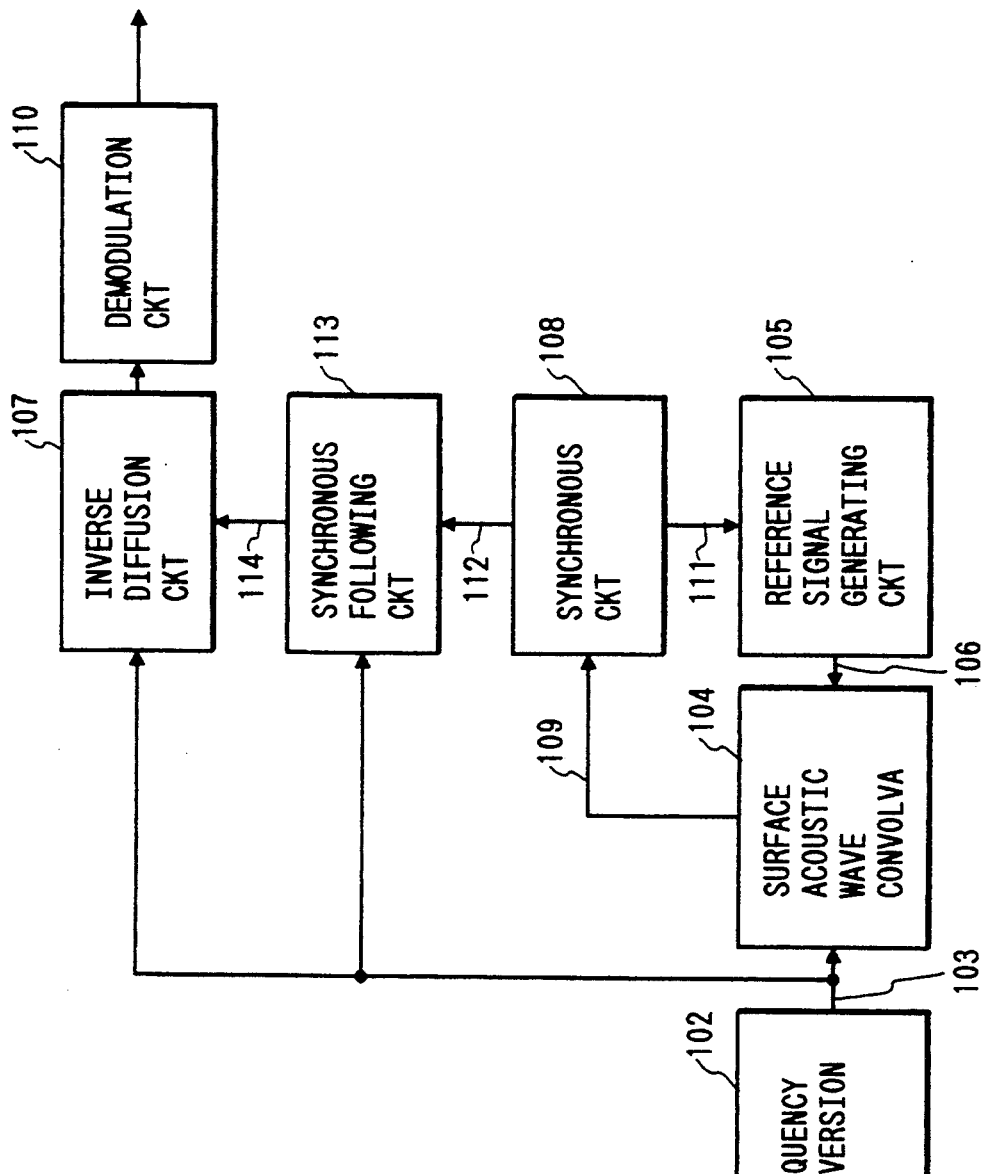
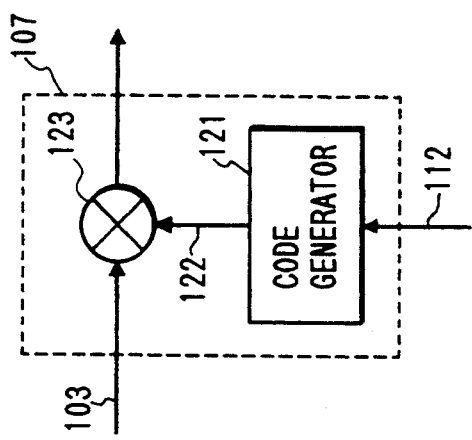
FIG. 51
FIG. 50

SURFACE ACOUSTIC WAVE ELEMENT AND COMMUNICATION SYSTEM USING THE SAME

BACKGROUND OF THE INVENTION

1. Field of the Invention

The present invention relates to a surface acoustic wave element for obtaining a convolution output by utilizing an interaction of a plurality of surface acoustic waves and a communication system using the surface acoustic wave element.

2. Related Background Art

A surface acoustic wave element has received a great of attention as a key device for spread spectrum communication. The surface acoustic wave element is also used in a variety of applications as a real-time signal processing device, and extensive studies have been made on the surface acoustic wave element.

A surface acoustic wave convolver shown in FIG. 1 is known as such a surface acoustic wave element. Input interdigital transducers (comb electrodes) 12 and 13 and an output electrode 14 are formed on a piezoelectric substrate 11 made of Y-cut (Z-propagation) lithium niobate to obtain this element. When electrical signals are supplied to the input transducers 12 and 13, a surface acoustic wave is excited in the piezoelectric substrate 11 and is extracted as a convolution signal at the output terminal 14.

These transducers and output electrode are formed by pattering a conductive material such as aluminum in accordance with photolithography.

In order to extract a convolution output using such a surface acoustic wave convolver, two input signals each having a carrier angular frequency $\omega$ are input to the input transducers 12 and 13 and are converted into surface acoustic wave signals. These surface acoustic waves propagate on the surface of the piezoelectric substrate 11 in opposite directions. A convolution signal having a carrier angular frequency $2\omega$ is extracted from the output electrode 14 by utilizing a physical nonlinear effect of the substrate.

If the above two surface acoustic waves are defined as follows:

$$F\left(t - \frac{X}{V}\right)e^{j(kx+\omega t)}, \quad G\left(t + \frac{X}{V}\right)e^{j(-kx+\omega t)}$$

a surface acoustic wave as a product of these two input surface acoustic waves appears on the substrate according to the nonlinear effect of the substrate:

$$F\left(t - \frac{X}{V}\right)e \cdot G\left(t + \frac{X}{V}\right)e^{2j\omega t}$$

This signal is integrated within the uniform output electrode area and is extracted as a signal represented as follows if l be the length of an interaction region:

$$S(t) = Ke^{2j\omega t} \int_{-\frac{l}{2}}^{\frac{l}{2}} F\left(t - \frac{X}{V}\right) \cdot G\left(t + \frac{X}{V}\right) dx \quad (1)$$

This integral range can be substantially $\pm \infty$ when the interaction length is larger than the signal length.

If the following conditions is given:

$$\tau = \left(t - \frac{X}{V}\right)$$

equation (1) can be rewritten as follows:

$$S(t) = -VKe^{2j\omega t} \int_{-\infty}^{\infty} F(t) \cdot G(2t - \tau) \cdot d\tau \quad (2)$$

The signal is obtained as a convolution signal of the two surface acoustic surface waves.

This convolution mechanism is described in detail in, e.g., Shibayama, "Application of Surface Acoustic Wave", Television 30, 457 (1976).

On the other hand, when two surface acoustic waves propagate on the surface of the substrate in opposite directions, as described above, a bulk wave having a carrier angular frequency $2\omega$ which propagates in a direction perpendicular to the surface of the substrate is generated by the physical nonlinear effect of the substrate, as described in Journal of Applied Physics, Vol. 49, No. 12, PP. 5924–5927, 1978.

This bulk wave is reflected on the lower surface of the substrate 11 and returns to the upper surface of the substrate 11. The returning bulk wave is partially extracted by the output electrode 14, and another part thereof is reflected by the upper surface of the substrate 11, propagates toward the lower surface of the substrate, and returns again toward the upper surface upon reflection on the lower surface.

The bulk wave generated toward the lower surface of the substrate is repeatedly reflected by the lower surface of the substrate, and the signal of the reflected wave can be extracted from the output electrode 14, thereby adversely affecting the convolution signal.

On the other hand, in order to suppress the adverse influences by reflection of the bulk wave on the lower surface of the substrate, a surface acoustic wave element having a substrate of a shape tapered toward the propagation direction of the surface acoustic wave is proposed in Applied Physics Letters, Vol. 15, No. 9, PP. 300–302, 1969.

An example of this conventional element is shown in FIG. 2. The same reference numerals as in FIG. 1 denote the same parts in FIG. 2, and a detailed description thereof will be omitted.

The thickness of a piezoelectric substrate 15 in the element shown in FIG. 2 is changed in the propagation direction of the surface acoustic wave.

Since the element shown in FIG. 2 is a tapered element in which the thickness of the substrate is changed in the propagation direction of the surface acoustic wave, the thickness of the substrate is larger than a conventional surface acoustic wave element having parallel upper and lower surfaces of the substrate, resulting in inconvenience. That is, when a surface acoustic wave is to propagate on the substrate and its wavelength is $\lambda$, the substrate must have a minimum thickness which is several times the wavelength $\lambda$. For this reason, when the tapered substrate is employed, the thickness of the substrate at one side is much larger than the thickness of the surface acoustic wave element having the parallel upper and lower surfaces of the substrate, thus posing a problem.

In addition, since a bulk wave reflected by the lower surface of the substrate at a taper angle of the conventional example is extracted as an electrical signal at the output electrode, a convolution signal cannot be extracted at a high S/N ratio.

SUMMARY OF THE INVENTION

It is the first object of the present invention to solve the conventional problems described above and to provide a surface acoustic wave element which does not require a large thickness of a substrate and can suppress influences of a bulk wave on an output signal and a communication system using the surface acoustic wave element.

It is the second object of the present invention to provide a surface acoustic wave element almost free from influences on an output signal by a bulk wave reflected by the lower surface of a substrate and a communication system using the surface acoustic wave element.

In order to achieve the first object according to an aspect of the present invention, there is provided a surface acoustic wave element comprising:

- a piezoelectric substrate having a first surface and a second surface opposing the first surface;
- a first input transducer, formed on the first surface of the substrate, for generating a first surface acoustic wave which propagates in a predetermined direction;
- a second input transducer, formed on the first surface of the substrate, for generating a second surface acoustic wave which propagates in a direction opposite to the predetermined direction; and
- output means, formed on the first surface of the substrate, for extracting a signal produced by an interaction of the first and second surface acoustic waves,
- wherein at least part of the second surface of the substrate comprises a surface inclined in a direction perpendicular to the predetermined direction with respect to the first surface.

In order to achieve the first object according to another aspect of the present invention, there is provided a surface acoustic wave element comprising:

- a piezoelectric substrate having a first surface and a second surface opposing the first surface;
- a first input transducer, formed on the first surface of the substrate, for generating a first surface acoustic wave which propagates in a predetermined direction;
- a second input transducer, formed on the first surface of the substrate, for generating a second surface acoustic wave which propagates in a direction opposite to the predetermined direction; and
- output means, formed on the first surface of the substrate, for extracting a signal produced by an interaction of the first and second surface acoustic waves,
- wherein at least part of the second surface of the substrate comprises two surfaces inclined in opposite directions along the predetermined direction with respect to the first surface.

In order to achieve the second object according to an aspect of the present invention, there is provided a surface acoustic wave element comprising:

- a piezoelectric substrate having a first surface and a second surface opposing the first surface;
- a first input transducer, formed on the first surface of the substrate, for generating a first surface acoustic wave;
- a second input transducer, formed on the first surface of the substrate, for generating a second surface acoustic wave; and
- an output electrode, formed on the first surface of the substrate, for extracting a signal produced by an interaction of the first and second surface acoustic waves,
- wherein at least part of the second surface of the substrate comprises a surface inclined along the predetermined direction with respect to the first surface, and the following condition is satisfied:

$$\tan 2\theta \geq L/d$$

where $\theta$ is an inclination angle of the inclined surface, $\underline{d}$ is a thickness of the substrate at a given position where the thickness of the substrate from the first surface to the second surface is smallest, and L is a length of the output electrode from the given position along the predetermined direction.

In order to achieve the second object according to another aspect of the present invention, there is provided a surface acoustic wave element comprising:

- a piezoelectric substrate having a first surface and a second surface opposing the first surface;
- a first input transducer, formed on the first surface of the substrate, for generating a first surface acoustic wave;
- a second input transducer, formed on the first surface of the substrate, for generating a second surface acoustic wave; and
- a plurality of waveguides, formed on the first surface of the substrate, for generating a third surface acoustic wave by an interaction of the first and second surface acoustic waves,
- wherein at least part of the second surface of the substrate comprises a surface inclined along the predetermined direction with respect to the first surface, and the following condition is satisfied:

$$\tan 2\theta \geq L/d$$

where $\theta$ is an inclination angle of the inclined surface, $\underline{d}$ is a thickness of the substrate at a given position where the thickness of the substrate from the first surface to the second surface is smallest, and L is a length of a region of the waveguides on the first surface from the given position along the predetermined direction.

In order to achieve the second object according to still another aspect of the present invention, there is provided a surface acoustic wave element comprising:

- a piezoelectric substrate having a first surface and a second surface opposing the first surface;
- a first input transducer, formed on the first surface of the substrate, for generating a first surface acoustic wave;
- a second input transducer, formed on the first surface of the substrate, for generating a second surface acoustic wave;
- a plurality of waveguides, formed on the first surface of the substrate, for generating a third surface acoustic wave by an interaction of the first and second surface acoustic waves; and
- an output transducer, formed on the first surface of the substrate, for converting the third surface acoustic wave into an electrical signal and extracting the electrical signal, wherein at least part of the second surface of the substrate comprises a surface inclined along the predetermined direction with respect to the first surface, and the following condition is satisfied:

$$\tan 2\theta \geq L/d$$

where $\theta$ is an inclination angle of the inclined surface, $\underline{d}$ is a thickness of the substrate at a given position where the thickness of the substrate from the first surface to the second surface is smallest, and L is a length of a region of the waveguides and the output transducer on the first surface from the given position along the predetermined direction.

In order to achieve the second object according to still another aspect of the present invention, there is provided a surface acoustic wave element comprising:

a piezoelectric substrate having a first surface and a second surface opposing the first surface;

a first input transducer, formed on the first surface of the substrate, for generating a first surface acoustic wave;

a second input transducer, formed on the first surface of the substrate, for generating a second surface acoustic wave; and a plurality of waveguides, formed on the first surface of the substrate, for generating a third surface acoustic wave by an interaction of the first and second surface acoustic waves, wherein at least part of the second surface of the substrate comprises a surface inclined along the predetermined direction with respect to the first surface, and the following condition is satisfied:

$$L \geq 3\lambda_B/\sin 2\theta$$

where $\theta$ is an inclination angle of the inclined surface, L is a length of a region of the waveguides on the first surface along the predetermined direction, and $\lambda_B$ is a wavelength of a bulk wave generated by an interaction of the first and second surface acoustic waves.

According to the present invention, there is further provided a signal receiver using the surface acoustic wave element comprising:

(a) a circuit for receiving a signal transmitted from a transmitter;

(b) a surface acoustic wave element of any one of the above aspects of the present invention, for outputting a convolution signal of the received signal and a reference signal;

(c) a circuit for generating the reference signal; and (d) a circuit for demodulating the received signal by using the convolution signal.

According to the present invention, there is further provided a communication system using a surface acoustic wave element, comprising:

(a) a transmitter for transmitting a signal modulated with information;

(b) a circuit for receiving a signal transmitted from the transmitter;

(c) a surface acoustic wave element of any one of the above aspects of the present invention, for outputting a convolution signal of the received signal and a reference signal;

(d) a circuit for generating the reference signal; and (e) a circuit for demodulating the received signal by using the convolution signal.

BRIEF DESCRIPTION OF THE DRAWINGS

FIG. 3 is a schematic perspective view showing a surface acoustic wave element according to the first embodiment of the present invention;

FIG. 4 is a schematic sectional view of the element shown in FIG. 3 along the line A-A' thereof;

FIG. 5 is a schematic perspective view showing a surface acoustic wave element according to the second embodiment of the present invention;

FIG. 50 is a block diagram showing a detailed arrangement of an inverse diffusion circuit shown in FIG. 49;

FIG. 51 is a block diagram showing A modification of a receiver shown in FIG. 49;

DETAILED DESCRIPTION OF THE PREFERRED EMBODIMENTS

An embodiment for suppressing influences of a bulk wave on an output signal without much increasing the thickness of a substrate will be described below.

FIG. 3 is a schematic perspective view showing a surface acoustic wave element according to the first embodiment of the present invention, and FIG. 4 is a schematic sectional view of the element shown in FIG. 3 along the line A-A' thereof.

Referring to FIGS. 3 and 4, a piezoelectric substrate 1 is made of Y-cut (Z propagation) lithium niobate. Comb input electrodes (input interdigital transducers) 2 and 3 are formed on the substrate 1. An output electrode 4 is formed between the input electrodes 2 and 3 on the substrate 1. The input electrodes 2 and 3, and the output electrode 4 are generally formed by photolithographic patterning using a conductive material such as aluminum.

In the element of this embodiment, the lower surface of the substrate, i.e., a second surface 1-2 of the substrate 1 which opposes a first surface 1-1 on which the input electrodes and the like Are formed, is inclined in a direction perpendicular to the propagation direction of a surface acoustic wave.

In the surface acoustic wave element having the above arrangement, when the first signal having a carrier angular frequency $\omega$ is input to the first input electrode (transducer) 2, the first surface acoustic wave corresponding to the first input signal is generated by the electrode (transducer) 2. Meanwhile, when the second signal having a carrier angular frequency $\omega$ is input to the second input electrode (transducer) 3, the second surface acoustic wave corresponding to the second input signal is generated by the electrode 3. The first and second surface acoustic waves propagate in opposite directions and interact with each other in a region where the output electrode 4 is formed. An electrical signal having a carrier angular frequency $2\omega$ and corresponding to a convolution signal of the first and second input signals is extracted from the output electrode 4 in accordance with the physical nonlinear effect of the substrate.

While the signal is being extracted from the electrode 4, as described above, a bulk wave having the carrier angular frequency $2\omega$ is generated in the interaction region of the surface acoustic waves and propagates in a direction perpendicular Go the first surface 1-1. If the inclination angle of the second surface from the first surface is defined as $\theta$, the bulk wave is obliquely reflected by the second surface 1-2 at an angle $2\theta$ and does not return to the output electrode. Therefore, the influence of the bulk wave on the output signal from the electrode 4 can be suppressed.

Figure 1:
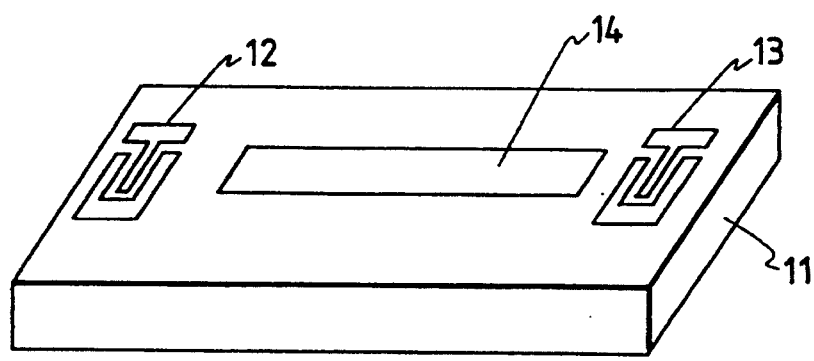
FIG. 1 is a schematic perspective view showing the first conventional surface acoustic wave element.
Figure 2:
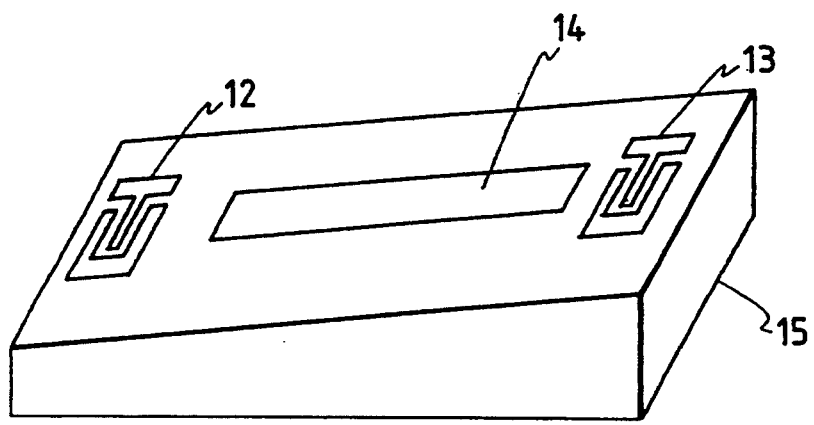
FIG. 2 is a schematic perspective view showing the second conventional surface acoustic wave element.

The surface acoustic wave element is elongated in the propagation direction of the surface acoustic wave so as to increase the length of interaction between the surface acoustic waves. For this reason, when the lower surface of the substrate is inclined along the propagation direction, as shown in FIG. 2, sufficient suppression of the influence of the bulk wave does not allow a large inclination angle or a large thickness of a portion having the maximum thickness of the substrate. According to the present invention, the lower surface of the substrate is inclined in a given direction perpendicular to the propagation direction. The substrate length in the given direction is smaller than that in the propagation direction of the surface acoustic wave. For this reason, the influence of the bulk wave on the signal output can be suppressed even if the inclination angle $\theta$ is not largely increased. Therefore, the thickness of the substrate can be made small as compared with the conventional element shown in FIG. 2.

FIG. 5 is a schematic perspective view showing a surface acoustic wave element according to the second embodiment of the present invention. The same reference numerals as in FIGS. 3 and 4 denote the same parts in FIG. 5, and a detailed description thereof will be omitted.

In the second embodiment, horn type waveguides 5 and 6 for compressing beam widths of surface acoustic waves excited by input electrodes 2 and 3 and guiding the compressed beam widths to an output electrode 4 are additionally arranged between the input electrodes 2 and 3 and the output electrode 4 in the arrangement of the first embodiment.

With the above arrangement, as compared with the element of the first embodiment, the width of the output electrode 4 can be reduced. In the second embodiment, the horn type waveguides 5 and 6 can reduce the width of the output electrode 4 to ⅓ as compared with the element of the first embodiment. In this manner, when the width of the output electrode is reduced, the influence of the bulk wave on the output signal can be suppressed even if the inclination angle of the lower surface of a substrate 1 is small. Therefore, the thickness of the substrate 1 can be further reduced.

In this embodiment, the horn type waveguides are used as beam width compressors. However, a multistrip coupler or an arcuated cob electrode as an input electrode may be used to obtain the same effect as described above.

Figure 6:
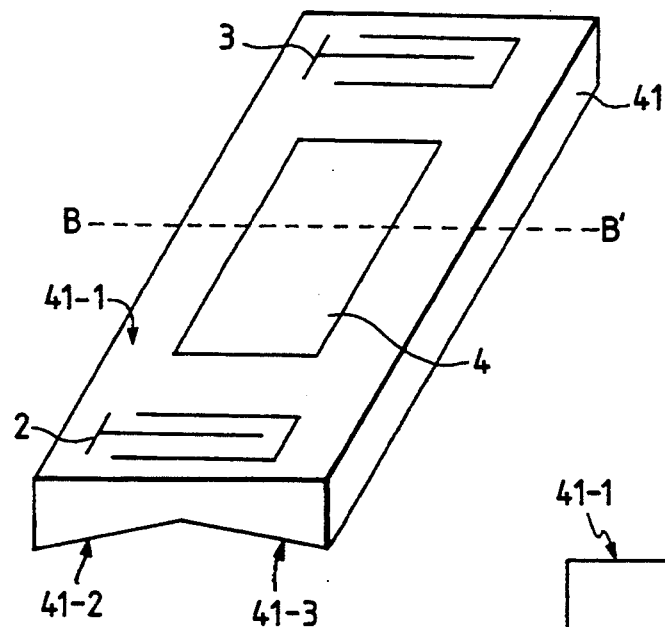
FIG. 6 is a schematic perspective view showing a surface acoustic wave element according to the third embodiment of the present invention.
Figure 7:
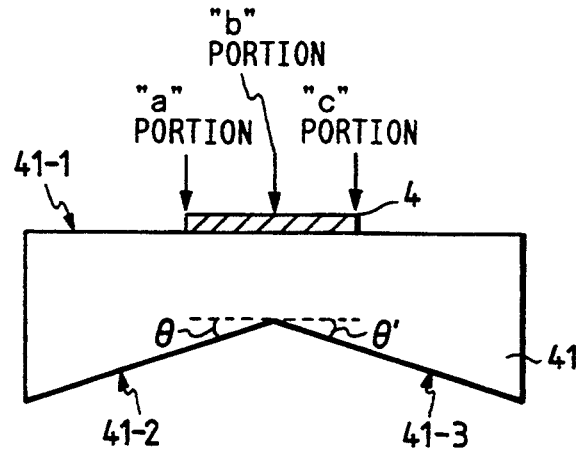
FIG. 7 is a schematic sectional view of the element shown in FIG. 6 along the line B-B' thereof.

FIG. 6 is a schematic perspective view showing a surface acoustic wave according to the third embodiment of the present invention. FIG. 7 is a schematic sectional view of the element shown in FIG. 6 along the line B-B' thereof. The same reference numerals as in FIGS. 3 and 4 denote the same parts in FIGS. 6 and 7, and a detailed description thereof will be omitted.

The third embodiment is different from the first embodiment in that the lower surface of a substrate 41, i.e., the second surface of the substrate 41 which opposes a first surface 41-1 on which input electrodes and the like are formed, is constituted by two inclined surfaces 41-2 and 41-3 having opposite inclinations along a direction perpendicular to the propagation direction of the surface acoustic wave. These two inclined surfaces constitute an inverted tapered structure so that the thickness of the substrate is increased away from almost the central portion (b portion) of the substrate 41 as a boundary in a direction perpendicular to the propagation direction of the surface acoustic wave. When the inclination angles of the inclined surfaces 41-2 and 41-3 with respect to the first surface 41-1 are defined as $\theta$ and $\theta'$, respectively, condition $\theta = \theta'$ is generally satisfied. However, the angles $\theta$ and $\theta'$ may be different from each other. The boundary (b portion) of the two inclination angles may be shifted from the central portion to either side.

In the surface acoustic wave element having the above arrangement, when the first signal having a carrier angular frequency $\omega$ is input to the first input electrode 2, the first surface acoustic wave corresponding to the first input signal is generated by the electrode 2. Meanwhile, when the second signal having a carrier angular frequency $\omega$ is input to the second input electrode (transducer) 3, the second surface acoustic wave corresponding to the second input signal is generated by the electrode 3. The first and second surface acoustic waves propagate in opposite directions and interact with each other in a region where the output electrode 4 is formed. An electrical signal having a carrier angular frequency $2\omega$ and corresponding to a convolution signal of the first and second input signals is extracted from the output electrode 4 in accordance with the physical nonlinear effect of the substrate.

While the signal is being extracted from the electrode 4, as described above, bulk waves having the carrier angular frequency $2\omega$ are generated in the interaction region of the surface acoustic waves and propagate in a direction perpendicular to the first surface 41-1. Of these bulk waves, a wave generated between the a portion and the b portion is incident on the inclined surface 41-2. Since the inclined surface 41-2 has an inclination angle $\theta$ with respect to the first surface, this bulk wave is reflected at an angle $2\theta$ with respect to the normal to the first surface, so that the influence on the output signal to be extracted from the electrode 4 can be suppressed. Similarly, a bulk wave generated between the b portion and the c portion is reflected by the inclined surface 41-3 at an angle $2\theta$ with respect to the normal to the first surface, thereby reducing the influence on the output signal to be extracted from the electrode 4.

In the element of this embodiment, since the lower surface of the substrate is divided into the two inclined surfaces, the influence of the bulk wave on the output signal can be suppressed even if the inclination angle is reduced. Therefore, the thickness of the substrate can be made smaller than that of the first embodiment.

Figure 8:
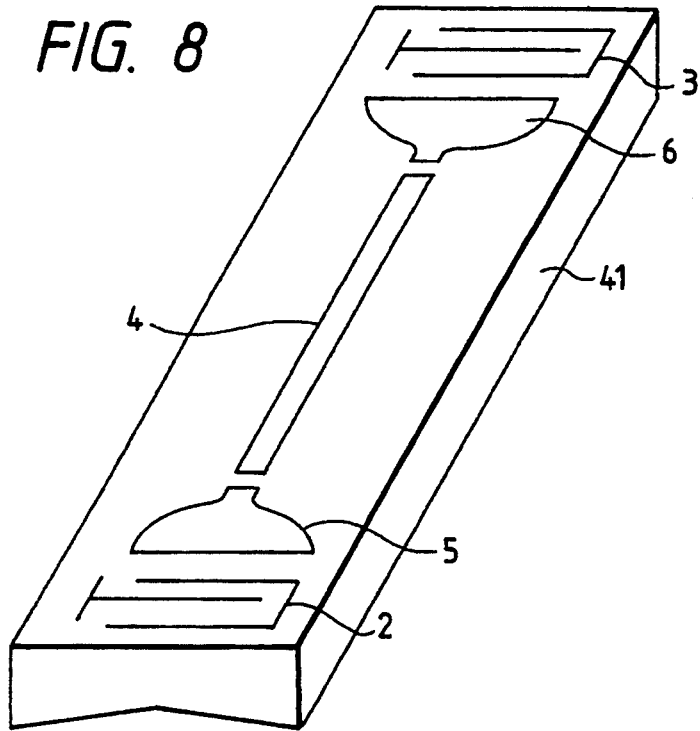
FIG. 8 is a schematic perspective view showing a surface acoustic wave element according to the fourth embodiment of the present invention.

FIG. 8 is a schematic perspective view showing a surface acoustic wave element according to the fourth embodiment of the present invention. The same reference numerals as in FIGS. 6 and 7 denote the same parts in FIG. 8, and a detailed description thereof will be omitted.

In the fourth embodiment, horn type waveguides 5 and 6 for compressing beam widths of surface acoustic waves excited by input electrodes 2 and 3 and guiding the compressed beam widths to an output electrode 4 are additionally arranged between the input electrodes 2 and 3 and the output electrode 4 in the arrangement of the third embodiment.

With the above arrangement, as compared with the element of the first embodiment, the width of the output electrode 4 can be reduced. In the second embodiment, the horn type waveguides 5 and 6 can reduce the width of the output electrode 4 to ⅓ as compared with the element of the first embodiment. In this manner, when the width of the output electrode is reduced, the influence of the bulk wave on the output signal can be suppressed even if the inclination angle of the lower surface of a substrate 41 is small. Therefore, the thickness of the substrate 41 can be further reduced.

In this embodiment, the horn type waveguides are used as beam width compressors. However, a multistrip coupler or an arcuated comb electrode as an input electrode may be used to obtain the same effect as described above.

Figure 9:
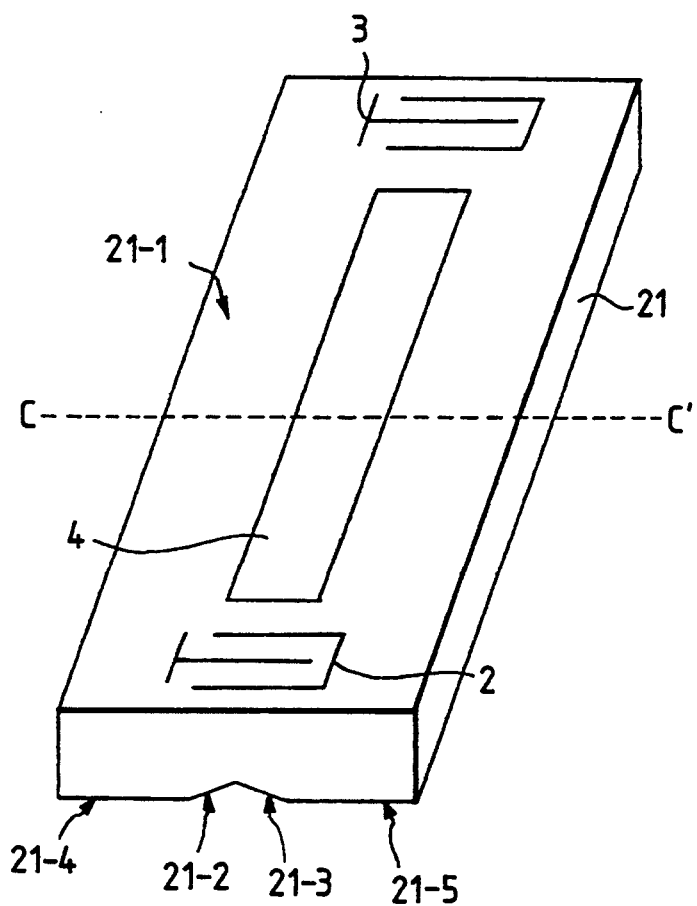
FIG. 9 is a schematic perspective view showing a surface acoustic wave element according to the fifth embodiment of the present invention.
Figure 10:
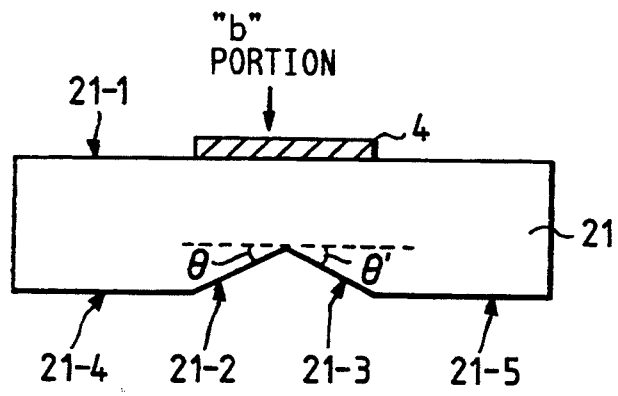
FIG. 10 is a schematic sectional view of the element shown in FIG. 9 along the line C-C' thereof.

FIG. 9 is a schematic perspective view showing a surface acoustic wave according to the fifth embodiment of the present invention. FIG. 10 is a schematic sectional view of the element shown in FIG. 9 along the line C–C' thereof. The same reference numerals as in FIGS. 3 and 4 denote the same parts in FIGS. 9 and 10, and a detailed description thereof will be omitted.

The fifth embodiment is different from the first embodiment in that the lower surface of a substrate 21, i.e., the second surface of the substrate 21 which opposes a first surface 21-1 on which input electrodes and the like are formed, is constituted by two inclined surfaces 21-2 and 21-3 having opposite inclinations along a direction perpendicular to the propagation direction of the surface acoustic wave and surfaces 21-4 and 21-5 parallel to the first surface 21-1. These two inclined surfaces constitute an inverted tapered structure so that the thickness of the substrate is increased away from almost the central portion (b portion) of the substrate 21 as a boundary in a direction perpendicular to the propagation direction of the surface acoustic wave. When the inclination angles of the inclined surfaces 21-2 and 21-3 with respect to the first surface 21-1 are defined as $\theta$ and $\theta'$, respectively, condition $\theta = \theta'$ is generally satisfied. However, the angles $\theta$ and $\theta'$ may be different from each other. The boundary (b portion) of the two inclination angles may be shifted from the central portion to either side. The inclined surfaces 21-2 and 21-3 are located at positions opposite to the region where the output electrode is formed on the first surface 21-1. The lower surface of the substrate which opposes a region except for the above region is made parallel to the first surface 21-1.

With the above arrangement, the thickness of the substrate can be further reduced while the fifth embodiment can maintain the same effect as that of the third embodiment.

Figure 11:
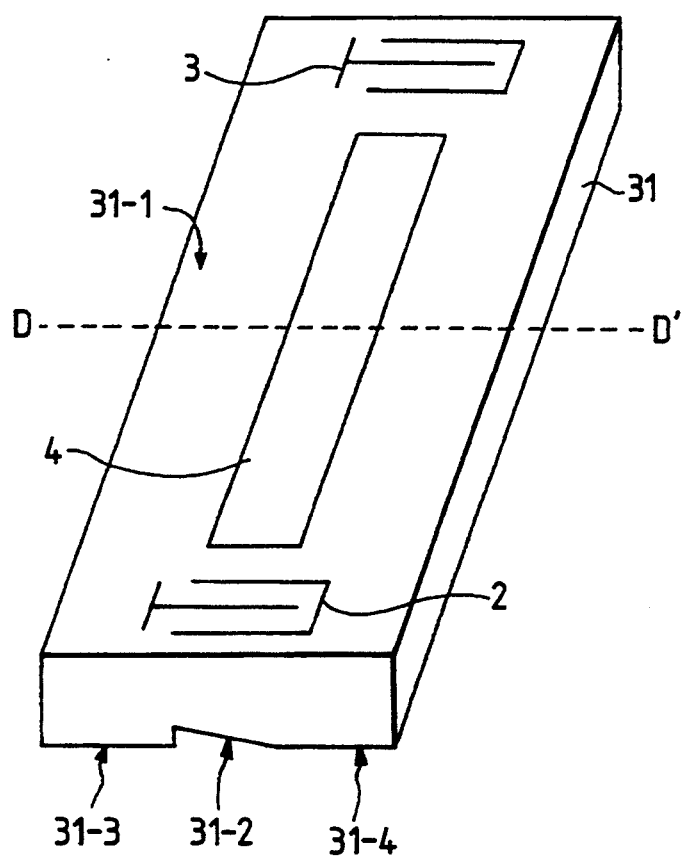
FIG. 11 is a schematic perspective view showing a surface acoustic wave element according to the sixth embodiment of the present invention.
Figure 12:
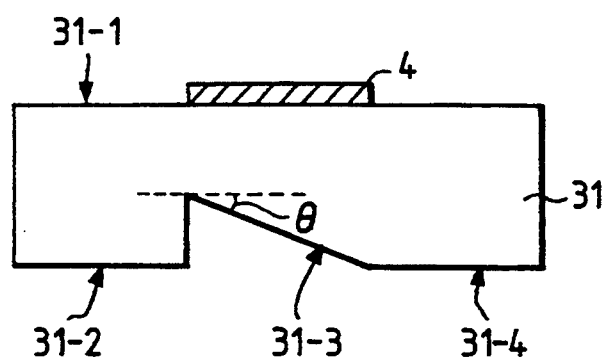
FIG. 12 is a schematic sectional view of the element shown in FIG. 11 along the line D-D' thereof.

FIG. 11 is a schematic perspective view showing a surface acoustic wave element according to the sixth embodiment of the present invention, and FIG. 12 is a schematic sectional view of the element shown in FIG. 11 along the line D–D' thereof. The same reference numerals as in FIGS. 3 and 4 denote the same parts in FIGS. 11 and 12, and a detailed description thereof will be omitted.

The sixth embodiment is different from the first embodiment in that the lower surface of a substrate 31, i.e., the second surface opposing a first surface 31-1 of the substrate 31 on which input electrodes and the like are formed, is constituted by a surface 31-2 inclined along a direction perpendicular to the propagation direction of the surface acoustic wave and surfaces 31-3 and 31-4 parallel to the first surface 31-1. The inclined surface 31-2 is inclined at an angle $\theta$ with respect to the first surface 31-1. The inclined surface 31-2 is located at the position opposing the region of the first surface 31-1 where an output electrode 4 is formed. A region of the lower surface of the substrate except for the above region is parallel to the first surface 31-1.

With the above arrangement, the thickness of the substrate can be further reduced while the sixth embodiment can maintain the same effect as that of the first embodiment.

In the fifth and sixth embodiments, since the upper and lower surfaces are parallel to each other at the side portions of the substrate, the following effects can also be obtained in addition to the effects of the first to fourth embodiments.

1) A substrate can be easily fixed on a stem.

2) When a substrate is fixed on a stem, the upper surface of the substrate is set parallel to the fixing surface of the stem, so that the wire-bonding yield can be increased.

3) Input and output electrodes can be formed on the upper surface of the substrate in accordance with an exposure step of the conventional photolithographic techniques.

Each of the above embodiments exemplifies an arrangement in which the lower surface of the substrate is inclined in a direction perpendicular to the propagation direction of the surface acoustic wave. When the lower surface of the substrate is constituted by two or more surfaces inclined in opposite directions, the thickness of the substrate need not be increased even if the lower surface of the substrate is inclined in a direction parallel to the propagation direction of the surface acoustic wave. Such embodiments will be described below.

Figure 13:
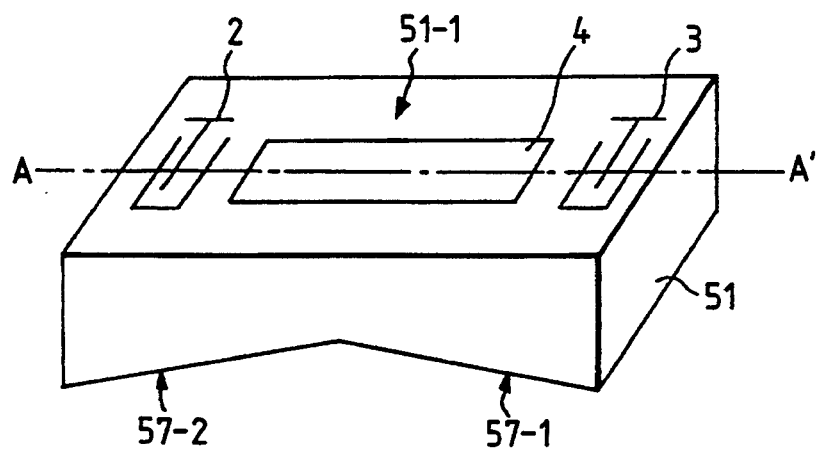
FIG. 13 is a schematic perspective view showing a surface acoustic wave element according to the seventh embodiment of the present invention.
Figure 14:
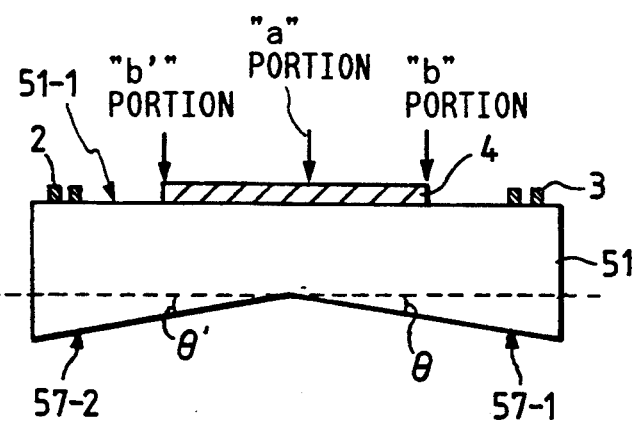
FIG. 14 is a schematic sectional view of the element shown in FIG. 13 along the line A-A' thereof.

FIG. 13 is a schematic perspective view showing a surface acoustic wave element according to the seventh embodiment of the present invention, and FIG. 14 is a schematic sectional view of the element shown in FIG. 13 along the line A–A' thereof.

Referring to FIGS. 13 and 14, a piezoelectric substrate 1 is made of Y-cut (Z propagation) lithium niobate. Comb input electrodes (input interdigital transducers) 2 and 3 are formed on the substrate 1. An output electrode 4 is formed between the input electrodes 2 and 3 on the substrate 1. The input electrodes (transducers) 2 and 3, and the output electrode 4 are generally formed by photolithographic patterning using a conductive material such as aluminum.

In the seventh embodiment, the lower surface of a substrate 51, i.e., the second surface of the substrate 51 which opposes a first surface 51-1 on which input electrodes and the like are formed, is constituted by two inclined surfaces 57-1 and 57-2 having opposite inclinations along the propagation direction of the surface acoustic wave. These two inclined surfaces constitute an inverted tapered structure so that the thickness of the substrate is increased away from almost the central portion (a portion) of the substrate 51 as a boundary in the propagation direction of the surface acoustic wave. When the inclination angles of the inclined surfaces 57-1 and 57-2 with respect to the first surface 51-1 are defined as $\theta$ and $\theta'$, respectively, condition $\theta = \theta'$ is generally satisfied. However, the angles $\theta$ and $\theta'$ may be different from each other.

In the surface acoustic wave element having the above arrangement, when the first signal having a carrier angular frequency $\omega$ is input to the first input electrode 2, the first surface acoustic wave corresponding to the first input signal is generated by the electrode 2. Meanwhile, when the second signal having a carrier angular frequency $\omega$ is input to the second input electrode (transducer) 3, the second surface acoustic wave corresponding to the second input signal is generated by the electrode 3. The first and second surface acoustic waves propagate in opposite directions and interact with each other in a region where the output electrode 4 is formed. An electrical signal having a carrier angular frequency $2\omega$ and corresponding to a convolution signal of the first and second input signals is extracted from the output electrode 4 in accordance with the physical nonlinear effect of the substrate.

While the signal is being extracted from the electrode 4, as described above, bulk waves having the carrier angular frequency 2ω are generated in the interaction region of the surface acoustic waves and propagate in a direction perpendicular to the first surface 51-1. Of these bulk waves, a wave generated between the a portion and the b portion is incident on the inclined surface 57-1. Since the inclined surface 57-1 has an inclination angle θ with respect to the first surface, this bulk wave is reflected at an angle 2θ with respect to the normal to the first surface, so that the influence on the output signal to be extracted from the electrode 4 can be suppressed. Similarly, a bulk wave generated between the a portion and the b′ portion is reflected by the inclined surface 57-2 at an angle 2θ′ with respect to the normal to the first surface, thereby reducing the influence on the output signal to be extracted from the electrode 4.

In this manner, in the element of this embodiment, the influence of the bulk wave on the output signal can be suppressed. In addition, as compared to a case wherein the substrate is tapered in one direction, as shown in FIG. 2, the thickness of the substrate (i.e., the portion having the maximum thickness in the substrate) can be made almost half.

Figure 15:
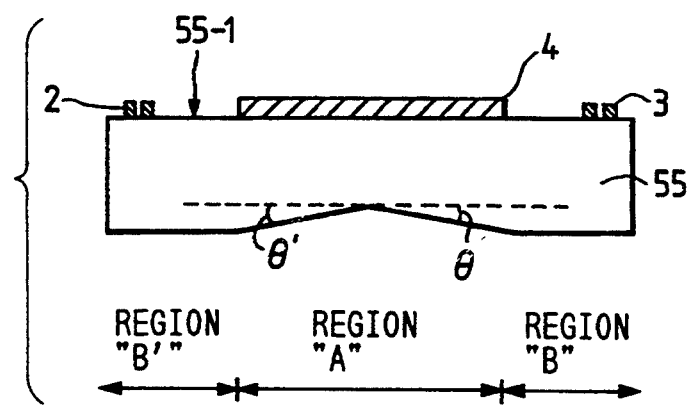
FIG. 15 is a schematic perspective view showing a surface acoustic wave element according to the eighth embodiment of the present invention.

FIG. 15 is a schematic sectional view showing a surface acoustic wave according to the eighth embodiment of the present invention. The same reference numerals as in FIGS. 13 and 14 denote the same parts in FIG. 15, and a detailed description thereof will be omitted.

In this embodiment, the lower surface of a piezoelectric substrate 55 is bent at the central portion corresponding to an output electrode 4 to form an inverted tapered structure with respect to the central portion along the propagation direction of surface acoustic waves excited by comb electrodes 2 and 3. However, the inverted tapered structure is constituted by only a region "A" below the output electrode 4. Two outer regions "B" and "B′" which do not correspond to the output electrode are parallel to a first surface 55-1 of the substrate 55.

With the above arrangement, the thickness of the substrate can be further reduced while the eighth embodiment can maintain the same effect as that of the seventh embodiment.

In the element of the eighth embodiment, the regions "B" and "B′" on the lower surface of the piezoelectric substrate 55 have the same thickness with respect to the upper surface of the substrate, and the upper surface is parallel to the regions "B" and "B′" The conventional photolithographic techniques can be used to form the input electrodes 2 and 3 and the output electrode 4.

Figure 16:
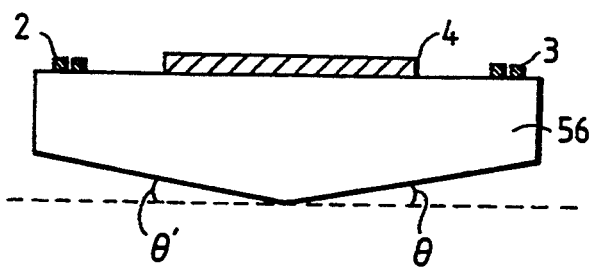
FIG. 16 is a schematic perspective view showing a surface acoustic wave element according to the ninth embodiment of the present invention.

FIG. 16 is a schematic sectional view showing a surface acoustic wave element according to the ninth embodiment of the present invention. The same reference numerals as in FIGS. 13 and 14 denote the same parts in FIG. 16, and a detailed description thereof will be omitted.

The ninth embodiment is different from the seventh embodiment only in that a tapered structure is obtained so that the thickness of a piezoelectric substrate 56 is decreased from the central portion thereof to the outer end sides. The same effect as in the seventh embodiment can be obtained in the ninth embodiment.

As described above, in a surface acoustic wave element according to the present invention, there can be provided a surface acoustic wave element almost free from the influence of a bulk wave on an output signal by appropriately defining the inclination angle or angles of the inclined surface or surfaces. A similar embodiment will be described below.

Figure 17:
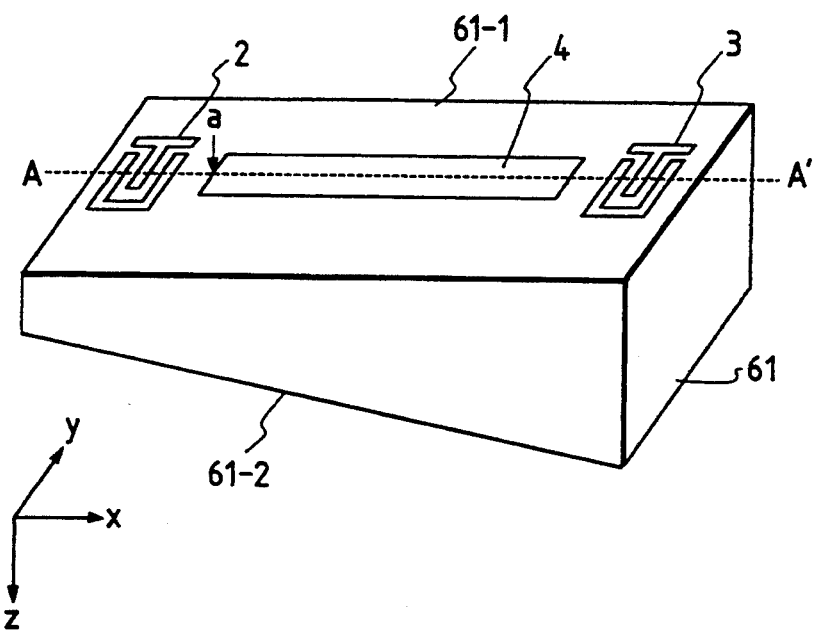
FIG. 17 is a schematic perspective view showing a surface acoustic wave element according to the tenth embodiment of the present invention.
Figure 18:
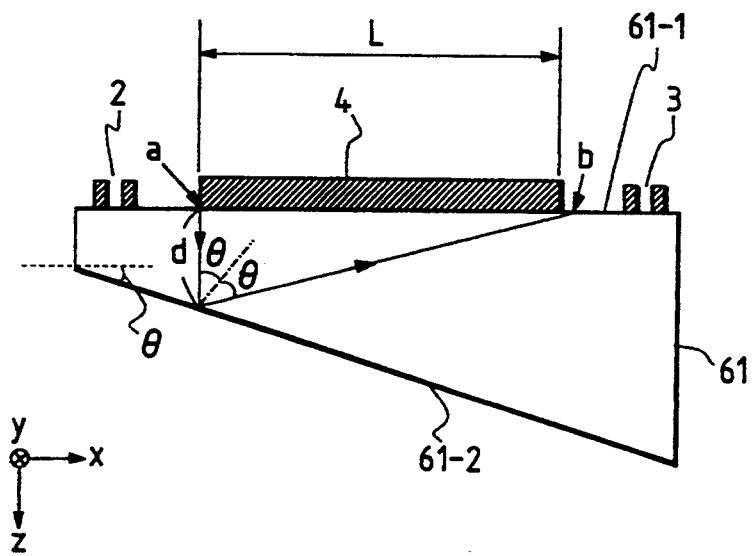
FIG. 18 is a schematic sectional view of the element shown in FIG. 17 along the line A-A' thereof.

FIG. 17 is a schematic perspective view of a surface acoustic wave according to the tenth embodiment of the present invention, and FIG. 18 is a schematic sectional view of the element shown in FIG. 17 along the line A-A′ thereof.

Referring to FIGS. 17 and 18, a piezoelectric substrate 61 is made of Y-cut (Z propagation) lithium niobate. Comb input electrodes (input interdigital transducers) 2 and 3 are formed on the substrate 61. An output electrode 4 is formed between the input electrodes 2 and 3 on the substrate 61. The input electrodes (transducers) 2 and 3, and the output electrode 4 are generally formed by photolithographic patterning using a conductive material such as aluminum.

In the element of the tenth embodiment, the lower surface of the substrate, i.e., a second surface 61-2 of the substrate 61 which opposes a first surface 61-1 on which input electrodes and the like are formed, is inclined with respect to the first surface 61-1 along the propagation direction (i.e., a direction parallel to an x-axis in FIGS. 17 and 18) of surface acoustic waves excited from the input electrodes. The element of the embodiment satisfies condition (3):

$$\tan 2\theta \geqq L/d \tag{3}$$

where θ is the inclination angle of the second surface 61-2, d is the thickness of the substrate 61 at a point (i.e., an a point) where the thickness of the substrate from the first surface to the second surface is smallest, and L is the length of the output electrode (the overall length of the output electrode in this embodiment) from the a point along the x-axis.

In the surface acoustic wave element having the above arrangement, when the first signal having a carrier angular frequency ω is input to the first input electrode 2, the first surface acoustic wave corresponding to the first input signal is generated by the electrode 2 and propagates in the positive direction of the x-axis. Meanwhile, when the second signal having a carrier angular frequency ω is input to the second input electrode (transducer) 3, the second surface acoustic wave corresponding to the second input signal is generated by the electrode 3 and propagates in the negative direction of the x-axis. The first and second surface acoustic waves propagate in opposite directions and interact with each other in a region where the output electrode 4 is formed. An electrical signal having a carrier angular frequency 2ω and corresponding to a convolution signal of the first and second input signals is extracted from the output electrode 4 in accordance with the physical nonlinear effect of the substrate 61.

While the signal is being extracted from the electrode 4, bulk waves having a carrier angular frequency 2ω are generated in the interaction region of the surface acoustic waves and propagate along a direction perpendicular to the first surface 61-1. These bulk waves are reflected by the second surface 61-2 of the substrate 61 and return to the first surface 61-1. At this time, since the second surface 61-2 has an inclination angle ω with respect to the first surface 61-1, the waves are reflected at an angle of 2θ with respect to the normal to the first surface. More specifically, the bulk wave generated at the a point is reflected by the second surface and reaches a point b on the first surface. If the distance between the a and b points is defined as I, the distance can be calculated as I=d tan 2θ from tan 2θ=I/d. Since a condition for inhibiting the bulk wave generated at the a point from being input to the output electrode 4 is I≧L, condition (3) is derived from condition dtan 2θ≧L. That is, in this embodiment, the bulk wave generated at the a point is not input to the output electrode. In addition, the bulk wave generated at portions except for the a point of the output electrode reach farther positions than the b point in the positive direction of the x-axis. Therefore, these bulk waves are not input to the output electrode, as a matter of course. In this manner, in the surface acoustic wave element of this embodiment, the bulk waves reflected by the lower surface of the substrate will not be input to the output electrode. Therefore, a convolution output signal can be extracted at a high S/N ratio.

Figure 19:
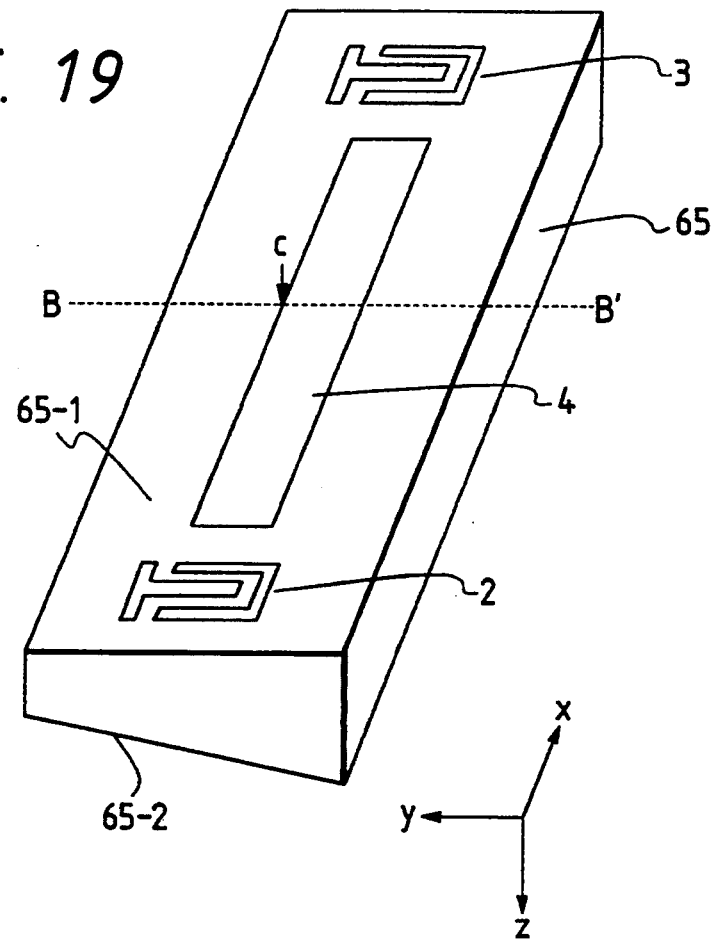
FIG. 19 is a schematic perspective view showing a surface acoustic wave element according to the eleventh embodiment of the present invention.
Figure 20:
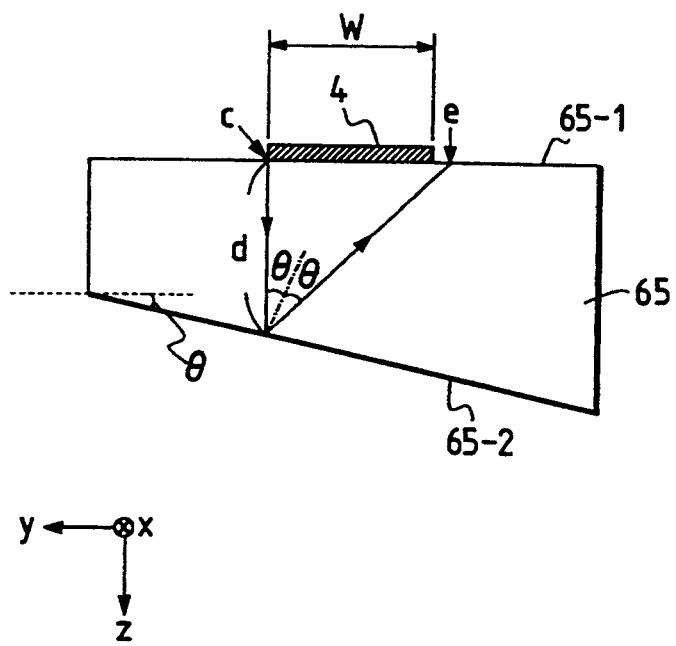
FIG. 20 is a schematic sectional view of the element shown in FIG. 19 along the line B-B' thereof.

FIG. 19 is a schematic perspective view showing a surface acoustic wave element according to the eleventh embodiment of the present invention. FIG. 20 is a schematic sectional view of the element shown in FIG. 19 along the line B–B' thereof. The same reference numerals as in FIGS. 17 and 18 denote the same parts in FIGS. 19 and 20, and a detailed description thereof will be omitted.

The eleventh embodiment is different from the tenth embodiment only in that a piezoelectric substrate 65 is inclined along a direction (i.e., a direction parallel to the y-axis) perpendicular to the propagation direction of surface acoustic waves excited from input electrodes.

In the element of the embodiment, the lower surface of the substrate, i.e., a second surface 65-2 of the substrate 65 which opposes a first surface 65-1 on which input electrodes are formed, is inclined at an angle θ along the y-axis with respect to the first surface 65-1. This element satisfies condition (4) below:

$$\tan 2\theta \geq W/d \qquad (4)$$

where $d$ is the thickness of the substrate 65 at a point (i.e., a c point) where the thickness of the substrate from the first surface to the second surface is smallest within the range of the output electrode 4, and W is the length of the output electrode (corresponding to the width of the output electrode in this embodiment) from the c point along the y-axis.

In the surface acoustic wave element having the above arrangement, when the first and second signals each having a carrier angular frequency ω are input to first and second electrodes 2 and 3, respectively, the first and second surface acoustic waves are excited from these input electrodes. These surface acoustic waves interact with each other in the region where the output electrode 4 is formed, and a convolution output signal is extracted from the electrode 4 as in the tenth embodiment.

While the signal is being extracted from the electrode 4, bulk waves having a carrier angular frequency 2ω are generated in the interaction region of the surface acoustic waves and propagate along a direction perpendicular to the first surface 65-1. These bulk waves are reflected by the second surface 65-2 of the substrate 61 at an angle 2θ and return to the first surface 65-1. More specifically, the bulk wave generated at the c point is reflected by the second surface and reaches a point e on the first surface. If the distance between the c and e points is defined as I, the distance can be calculated as I=dtan 2θ from tan 2θ=I/d. Since a condition for inhibiting the bulk wave generated at the c point from being input to the output electrode 4 is I≧W, condition (4) is derived from condition dtan 2θ≧W. That is, in this embodiment, the bulk wave generated at the c point is not input to the output electrode. In addition, the bulk wave generated at portions except for the c point of the output electrode reach farther positions than the e point in the negative direction of the y-axis. Therefore, these bulk waves are not input to the output electrode, as a matter of course. In this manner, in the surface acoustic wave element of this embodiment, the bulk waves reflected by the lower surface of the substrate will not be input to the output electrode. Therefore, a convolution output signal can be extracted at a high S/N ratio as in the tenth embodiment. In addition, since the width W of the output electrode is smaller than the length L in the surface acoustic wave element of this embodiment, the thickness of the substrate is not increased advantageously even if a large angle θ is assured to satisfy the above condition.

Figure 21:
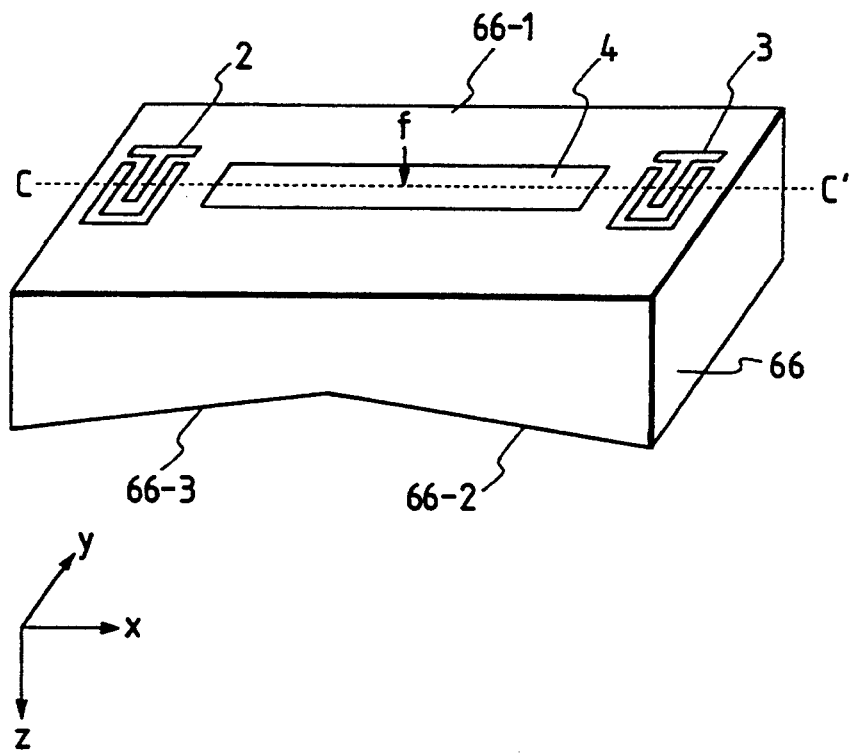
FIG. 21 is a schematic perspective view showing a surface acoustic wave element according to the twelfth embodiment of the present invention.
Figure 22:
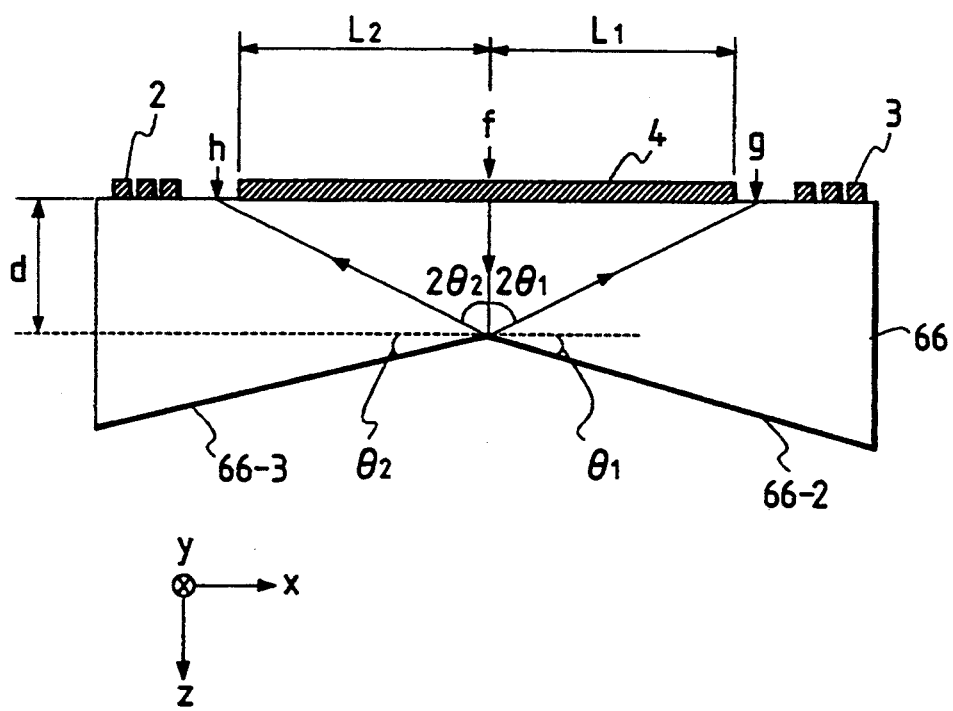
FIG. 22 is a schematic sectional view of the element shown in FIG. 21 along the line C-C' thereof.

FIG. 21 is a schematic perspective view showing a surface acoustic wave element according to the twelfth embodiment of the present invention. FIG. 22 is a schematic sectional view of the element shown in FIG. 21 along the line C–C' thereof. The same reference numerals as in FIGS. 17 and 18 denote the same parts in FIGS. 21 and 22, and a detailed description thereof will be omitted.

The twelfth embodiment is different from the tenth embodiment only in that an inverted tapered structure is formed such that the thickness of a substrate 66 is increased away from an f point as an almost central point along the propagation direction (i.e., a direction parallel to the x-axis) of the surface acoustic waves excited from input electrodes.

In the element of this embodiment, the lower surface of the substrate, i.e., the second surface of the substrate 66 which opposes a first surface 66-1 on which input electrodes and the like are formed, is constituted by surfaces 66-2 and 66-3 inclined in opposite directions. The inclined surfaces 66-2 and 66-3 have inclination angles $\theta_1$ and $\theta_2$ with respect to the first surface 66-1. The element of this embodiment satisfies conditions (5) and (6):

$$\tan 2\theta_1 \geq L_1/d \qquad (5)$$

$$\tan 2\theta_2 \geq L_2/d \qquad (6)$$

where $d$ is the thickness of the substrate 66 at a point (i.e., an f point) where the thickness of the substrate from the first surface to the second surface is smallest within the region of an output electrode 4, $L_1$ is the length of the output electrode from the f point in the positive direction of the x-axis, and $L_2$ is the length of the output electrode from the f point in the negative direction of the x-axis.

In the surface acoustic wave element having the above arrangement, when the first and second signals each having a carrier angular frequency ω are input to first and second electrodes 2 and 3, respectively, the first and second surface acoustic waves are excited from these input electrodes. These surface acoustic waves interact with each other in the region where the output electrode 4 is formed, and a convolution output signal is extracted from the electrode 4 as in the tenth embodiment.

While the signal is being extracted from the output electrode 4 as described above, bulk waves each having a carrier angular frequency 2ω are simultaneously generated in the interaction region of the surface acoustic waves and propagate in a direction perpendicular to the first surface 66-1. Of these bulk waves, the bulk wave generated on the positive side of the x-axis with respect to the f point is reflected by the inclined surface 66-2 at an angle $2\theta_1$ and returns to a g point on the first surface 66-1 again. If the distance from the f point to the g point is defined as $I_1$, this distance is calculated as $I_1 = d\tan 2\theta_1$ from condition $\tan 2\theta_1 = I_1/d$. The condition for inhibiting the bulk wave generated from the f point from being input to the output electrode 4 is $I_1 \geq L_1$, so that condition (5) can be derived from condition $d\tan 2\theta_1 \geq L_1$. Similarly, the bulk wave generated on the negative side of the x-axis with respect to the f point is reflected by the inclined surface 66-3 at an angle $2\theta_2$ and returns to an h point on the first surface 66-1 again. If the distance from the f point to the h point is defined as $I_2$, this distance is calculated as $I_2 = d\tan 2\theta_2$ from condition $\tan 2\theta_2 = I_2/d$. The condition for inhibiting the bulk wave generated from the f point from being input to the output electrode 4 is $I_2 \geq L_2$, so that condition (6) can be derived from condition $d\tan 2\theta_2 \geq L_2$. In this embodiment, all the bulk waves generated at all the portions of the output electrode are reflected by the lower surface of the substrate but do not return to the output electrode. A convolution output signal having a high S/N ratio can be extracted as in the tenth embodiment. In addition, in this embodiment, even if the length of the output electrode is kept unchanged, the inclination angle which satisfies conditions (5) and (6) can be reduced to ½, thereby reducing the thickness of the substrate accordingly.

In the twelfth embodiment described above, the bent portion is formed at almost the central position (f point) of the output electrode. However, if conditions (5) and (6) are satisfied, the bent portion may be shifted from the center. The angles $\theta_1$ and $\theta_2$ of the two surfaces inclined with respect to the first surface may be the same or different.

Figure 23:
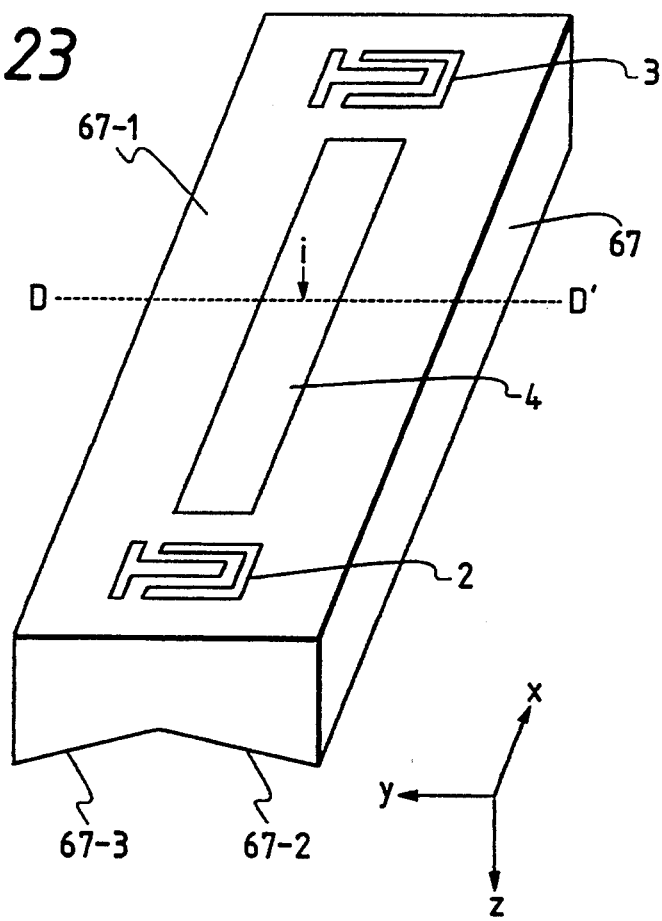
FIG. 23 is a schematic perspective view showing a surface acoustic wave element according to the thirteenth embodiment of the present invention.
Figure 24:
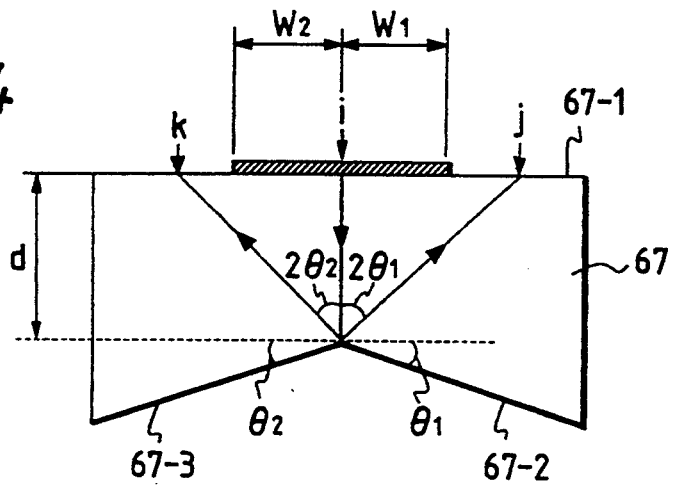
FIG. 24 is a schematic sectional view of the element shown in FIG. 23 along the line D-D' thereof.

FIG. 23 is a schematic perspective view showing a surface acoustic wave element according to the thirteenth embodiment of the present invention. FIG. 24 is a schematic sectional view of the element shown in FIG. 23 along the line D-D' thereof. The same reference numerals as in FIGS. 17 and 18 denote the same parts in FIGS. 23 and 24, and a detailed description thereof will be omitted.

The thirteenth embodiment is different from the tenth embodiment only in that an inverted tapered structure is formed such that the thickness of a substrate 67 is increased away from an i point as an almost central point along a direction (i.e., a direction parallel to the y-axis) perpendicular to the propagation direction of the surface acoustic waves excited from input electrodes.

In the element of this embodiment, the lower surface of the substrate, i.e., the second surface of the substrate 67 which opposes a first surface 67-1 on which input electrodes and the like are formed, is constituted by surfaces 67-2 and 67-3 inclined in opposite directions. The inclined surfaces 67-2 and 67-3 have inclination angles $\theta_1$ and $\theta_2$ with respect to the first surface 67-1. The element of this embodiment satisfies conditions (7) and (8):

$$\tan 2\theta_1 \geq W_1/d \tag{7}$$

$$\tan 2\theta_2 \geq W_2/d \tag{8}$$

where d is the thickness of the substrate 67 at a point (i.e., an i point) where the thickness of the substrate from the first surface to the second surface is smallest within the region of an output electrode 4, $W_1$ is the length of the output electrode from the i point in the negative direction of the y-axis (i.e., this length corresponds to ½ of the width W of the output electrode in this embodiment), and $W_2$ is the length of the output electrode from the i point in the positive direction of the y-axis.

In the surface acoustic wave element having the above arrangement, when the first and second signals each having a carrier angular frequency $\omega$ are input to first and second electrodes 2 and 3, respectively, the first and second surface acoustic waves are excited from these input electrodes. These surface acoustic waves interact with each other in the region where the output electrode 4 is formed, and a convolution output signal is extracted from the electrode 4 as in the tenth embodiment.

While the signal is being extracted from the output electrode 4 as described above, bulk waves each having a carrier angular frequency $2\omega$ are simultaneously generated in the interaction region of the surface acoustic waves and propagate in a direction perpendicular to the first surface 67-1. Of these bulk waves, the bulk wave generated on the negative side of the y-axis with respect to the i point is reflected by the inclined surface 67-2 at an angle $2\theta_1$ and returns to a j point on the first surface 67-1 again. If the distance from the i point to the j point is defined as $I_1$, this distance is calculated as $I_1 = d\tan 2\theta_1$ from condition $\tan 2\theta_1 = I_1/d$. The condition for inhibiting the bulk wave generated from the i point from being input to the output electrode 4 is $I_1 \geq W_1$, so that condition (7) can be derived from condition $d\tan 2\theta_1 \geq W_1$. Similarly, the bulk wave generated on the positive side of the y-axis with respect to the i point is reflected by the inclined surface 67-3 at an angle $2\theta_2$ and returns to a k point on the first surface 67-1 again. If the distance from the i point to the k point is defined as $I_2$, this distance is calculated as $I_2 = d\tan 2\theta_2$ from condition $\tan 2\theta_2 = I_2/d$. The condition for inhibiting the bulk wave generated from the i point from being input to the output electrode 4 is $I_2 \geq W_2$, so that condition (8) can be derived from condition $d\tan 2\theta_2 \geq W_2$. In this embodiment, all the bulk waves generated at all the portions of the output electrode are reflected by the lower surface of the substrate but do not return to the output electrode. A convolution output signal having a high S/N ratio can be extracted as in the tenth embodiment. In addition, in this embodiment, even if the length of the output electrode is kept unchanged, the inclination angle which satisfies conditions (7) and (8) can be reduced to ½, thereby reducing the thickness of the substrate accordingly.

In the thirteenth embodiment described above, the bent portion is formed at almost the central position (i point) of the output electrode. However, if conditions (7) and (8) are satisfied, the bent portion may be shifted from the center. The angles $\theta_1$ and $\theta_2$ of the two surfaces inclined with respect to the first surface may be the same or different.

In each of the tenth to thirteenth embodiments described above, the output electrode is arranged between the input electrodes. However, a surface acoustic wave element having a plurality of waveguides between the electrodes to further improve output efficiency of the convolution signal is proposed by Nakagawa et al., Journal of the Institute of Electronic and Communication Engineers of Japan, '86/2, Vol. j69-C, No. 2, pp.

190–198″, and the like. The present invention is also applicable to such a so-called divided waveguide type element. Embodiments exemplifying divided waveguide type elements will be exemplified below.

Figure 25:
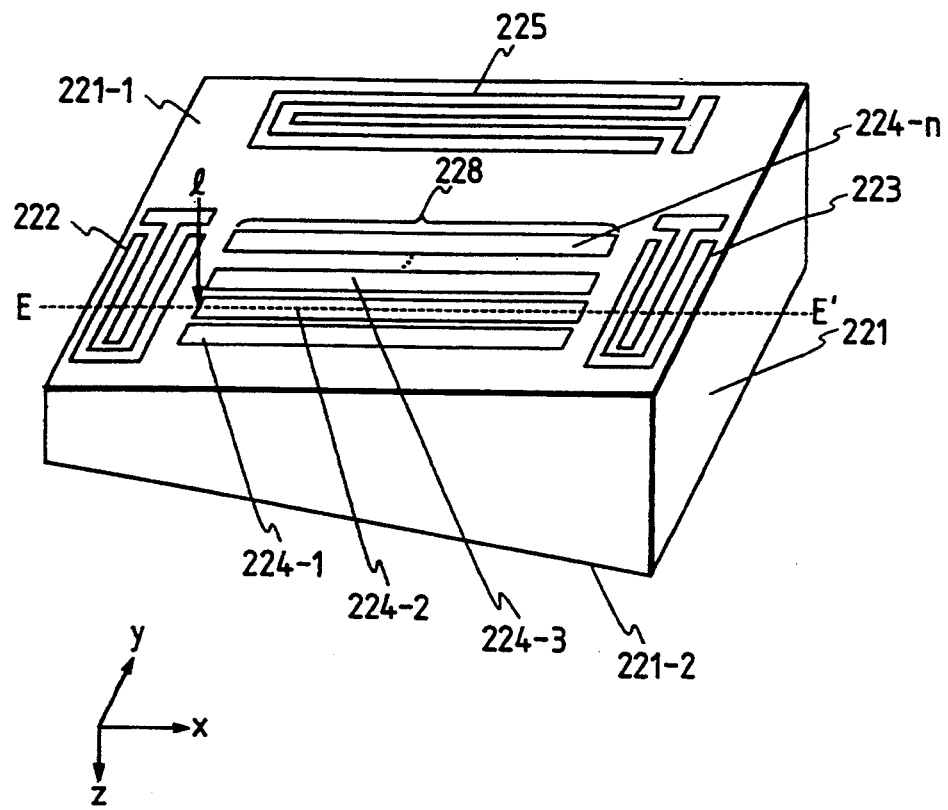
FIG. 25 is a schematic perspective view showing a surface acoustic wave element according to the fourteenth embodiment of the present invention.
Figure 26:
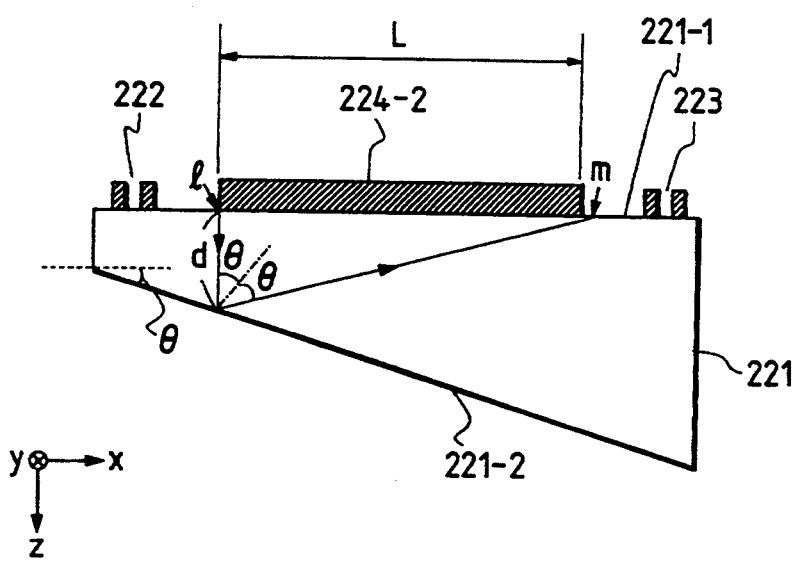
FIG. 26 is a schematic sectional view of the element shown in FIG. 25 along the line E-E' thereof.

FIG. 25 is a schematic perspective view showing a surface acoustic wave element according to the fourteenth embodiment of the present invention. FIG. 26 is a schematic sectional view of the element shown in FIG. 25 along the line E-E' thereof.

Referring to FIGS. 25 and 26, a piezoelectric substrate 221 is made of 128° rotation cut (X propagation) lithium niobate. First and second comb input electrodes (input interdigital transducers) 222 and 223 are formed on a first surface 221-1 of the substrate 221. A plurality of surface acoustic waveguides 224-1, 224-2, 224-3, . . . , 224-n arranged parallel to each other are formed on the first surface 221-1 between the input electrodes (transducers) 222 and 223. The longitudinal direction of each waveguide coincides with the propagation direction (i.e., a direction parallel to the x-axis) of surface acoustic waves excited from the input electrodes. The arrangement pitch (i.e., the distance between the centers of the adjacent waveguides in the widthwise direction) of the waveguides is determined to be equal to the wavelength of the surface acoustic wave generated by each waveguide. A comb output electrode (output interdigital transducer) 225 is formed at a position away from these waveguides by an appropriate distance in the y-axis.

The input electrodes (transducers) 222 and 223 and the output electrode (transducer) 225 are formed by photolithographic patterning using a conductive material such as aluminum, silver, or gold. The waveguides 224-1, 224-2, 224-3, . . . , 224-n are described in detail in Mikio Shibayama, "Elastic Acoustic Wave Technology", ed., the Institute of Electronic and Communication Engineers, PP. 82-102. Thin film waveguides and topographic waveguides are exemplified. According to the present invention, $\Delta v/v$ waveguides obtained by covering the surface of the substrate with aluminum, silver, gold, or the like are preferably used.

In the element of this embodiment, the lower surface of the substrate, i.e., the second surface 221-2 of the substrate 221 which opposes the first surface 221-1 on which input electrodes are formed, is inclined in the propagation direction (i.e., a direction parallel to the x-axis in FIGS. 25 and 26) of the surface acoustic waves excited from the input electrodes with respect to the first surface 221-1. The element of this embodiment satisfies condition (9) below:

$$\tan 2\theta \geq L/d \quad (9)$$

where $\theta$ is the inclination angle of the second surface 221-2, $d$ is the thickness of the substrate 221 at a point (an l point) where the thickness of the substrate from the first surface to the second surface is smallest within a region 228 of the waveguides 224-1 to 224-n, and L is the length (i.e., this length coincides with the length of the waveguides in its longitudinal direction in this embodiment) of the region 228 of the waveguides from the l point along the x-axis.

In the surface acoustic wave element having the above arrangement, when the first signal having a carrier angular frequency $\omega$ is input to the first input electrode 222, the first surface acoustic wave corresponding to the first input signal is generated from the electrode 222 and propagates through the waveguides 224-1 to 224-n in the positive direction of the x-axis. Meanwhile, when the second signal having the carrier angular frequency $\omega$ is input to the second input electrode 223, the second surface acoustic wave corresponding to the second input signal is generated from the electrode 223 and propagates through the waveguides 224-1 to 224-n in the negative direction of the x-axis. The first and second surface acoustic waves propagating in the opposite directions cause excitation of a third surface acoustic wave having a carrier angular frequency $2\omega$ and propagating in the $\underline{y}$ direction in accordance with a parametric mixing phenomenon caused by the physical nonlinear effect of the substrate 221. This third surface acoustic wave is converted into an electrical signal by the output electrode 225 and is output as a convolution signal of the first and second input signals from the output electrode.

While the signal is being extracted from the output electrode 225 as described above, a bulk wave having a carrier angular frequency $2\omega$ is generated in the region of the waveguides and propagates in a direction perpendicular to the first surface 221-1. This bulk wave is reflected by the second surface 221-2 of the substrate 221 and returns to the first surface 221-1 again. At this time, since the second surface 221-2 has an angle $\theta$ with respect to the first surface 221-1, the bulk wave is reflected at an angle $2\theta$ with respect to the normal to the first surface. More specifically, a bulk wave generated at the l point is reflected by the second surface and reaches an $\underline{m}$ point on the first surface. If the distance between the l point to the $\underline{m}$ point is defined as I, the distance is calculated as $I = \overline{d} \tan 2\theta$ from condition $\tan 2\theta = I/d$. A condition for inhibiting the bulk wave generated at the l point from being input to the waveguides 224-1 to 224-n is $I \geq L$, so that condition (9) is derived from condition $d \tan 2\theta \geq L$. That is, according to this embodiment, the bulk wave generated from the l point is not input to the waveguides. In addition, the bulk waves generated at points except for the l point of the waveguides reach positions away from the $\underline{m}$ point in the positive direction of the x-axis and are not naturally input to the waveguides. In this manner, in the surface acoustic wave element of this embodiment, since the bulk waves reflected by the lower surface of the substrate are not input to the waveguides, the bulk waves do not adversely affect the third surface acoustic wave, and a convolution output can be extracted at a high S/N ratio.

Figure 27:
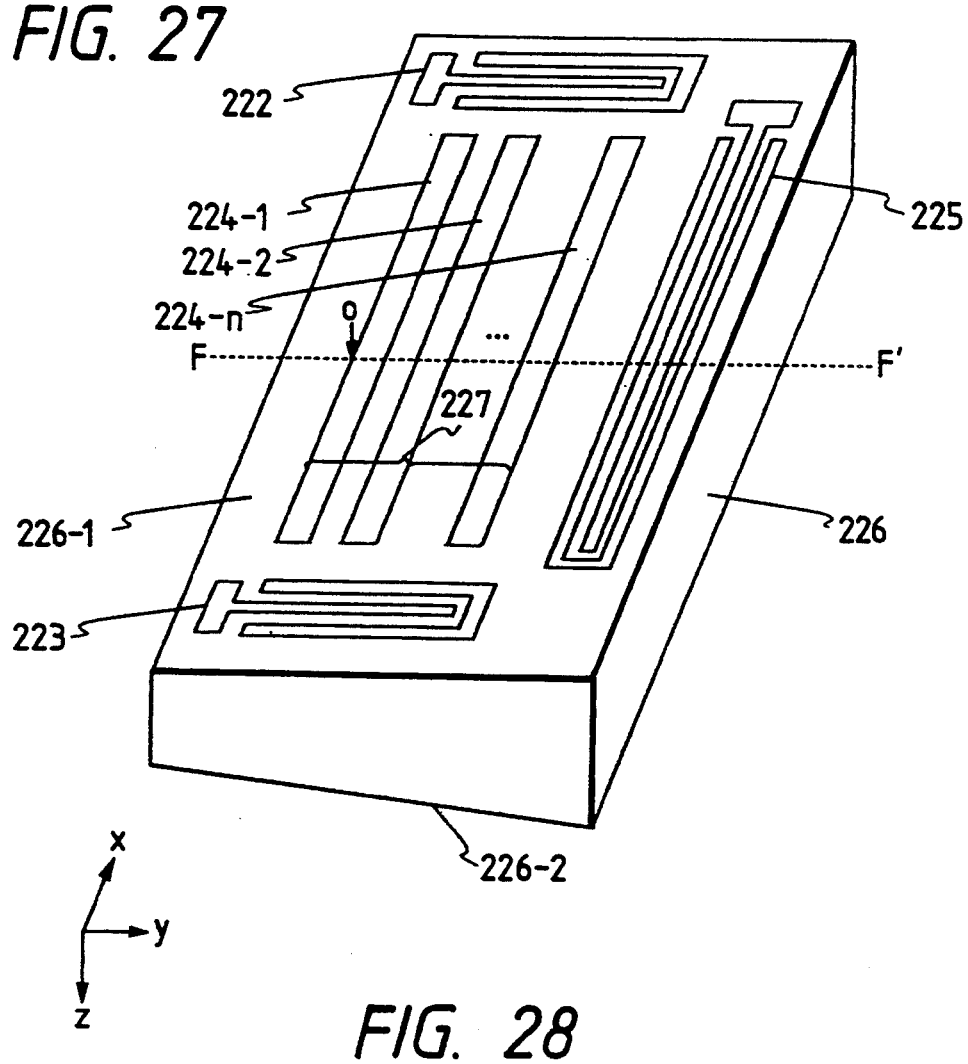
FIG. 27 is a schematic perspective view showing a surface acoustic wave element according to the fifteenth embodiment of the present invention.
Figure 28:
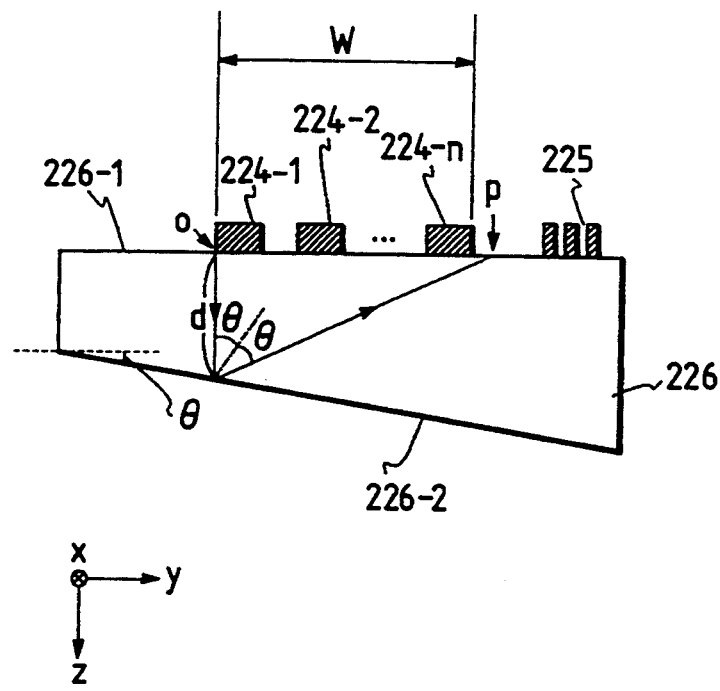
FIG. 28 is a schematic sectional view of the element shown in FIG. 27 along the line F-F' thereof.

FIG. 27 is a schematic perspective view showing a surface acoustic wave element according to the fifteenth embodiment of the present invention. FIG. 28 is a schematic sectional view of the element shown in FIG. 27 along the line F-F' thereof. The same reference numerals as in FIGS. 25 and 26 denote the same parts in FIGS. 27 and 28, and a detailed description thereof will be omitted.

The fifteenth embodiment is different from the fourteenth embodiment only in that a piezoelectric substrate 226 is inclined along a direction (i.e., a direction parallel to the y-axis) perpendicular to the propagation direction of surface acoustic waves excited from input electrodes.

In the element of the embodiment, the lower surface of the substrate, i.e., a second surface 226-2 of the substrate 226 which opposes a first surface 226-1 on which input electrodes are formed, is inclined at an angle $\theta$ along the y-axis with respect to the first surface 226-1. This element satisfies condition (10) below:

$$\tan 2\theta \geqq W/d \quad (10)$$

where d is the thickness of the substrate 226 at a point (i.e., an o point) where the thickness of the substrate from the first surface to the second surface is smallest within a region 227 of waveguides, and W is the length of the region 227 from the o point along the y-axis.

In the surface acoustic wave element having the above arrangement, when the first and second signals each having a carrier angular frequency ω are input to first and second electrodes 222 and 223, respectively, the first and second surface acoustic waves are excited from these input electrodes. These surface acoustic waves interact with each other in the region where the waveguides 224-1 to 224-n are formed, so that a third surface acoustic wave is generated. This third surface acoustic wave is received by an output electrode 225 to extract a convolution output signal as in the fourteenth embodiment.

While the signal is being extracted from the electrode 225, bulk waves having a carrier angular frequency 2ω are generated in the interaction region of the surface acoustic waves and propagate along a direction perpendicular to the first surface 226-1. These bulk waves are reflected by the second surface 226-2 of the substrate 226 at an angle 2θ and return to the first surface 226-1. More specifically, the bulk wave generated at the o point is reflected by the second surface and reaches a point p on the first surface. If the distance between the o and p points is defined as I, the distance can be calculated as I=dtan 2θ from tan 2θ=I/d. Since a condition for inhibiting the bulk wave generated at the o point from being input to the waveguides is I≧W, condition (10) is derived from condition dtan 2θ≧W. That is, in this embodiment, the bulk wave generated at the o point is not input to the waveguides. In addition, the bulk waves generated at portions except for the o point of the waveguides reach farther positions than the p point in the positive direction of the y-axis. These bulk waves are not input to the waveguides, as a matter of course. In this manner, in the surface acoustic wave element of this embodiment, the bulk waves reflected by the lower surface of the substrate will not be input to the waveguides. Therefore, a convolution output signal can be extracted at a high S/N ratio as in the fourteenth embodiment. In addition, since the width W of the waveguides is smaller than their length L in the surface acoustic wave element of this embodiment, the thickness of the substrate is not advantageously increased even if a large angle θ is assured to satisfy the above condition.

Figure 29:
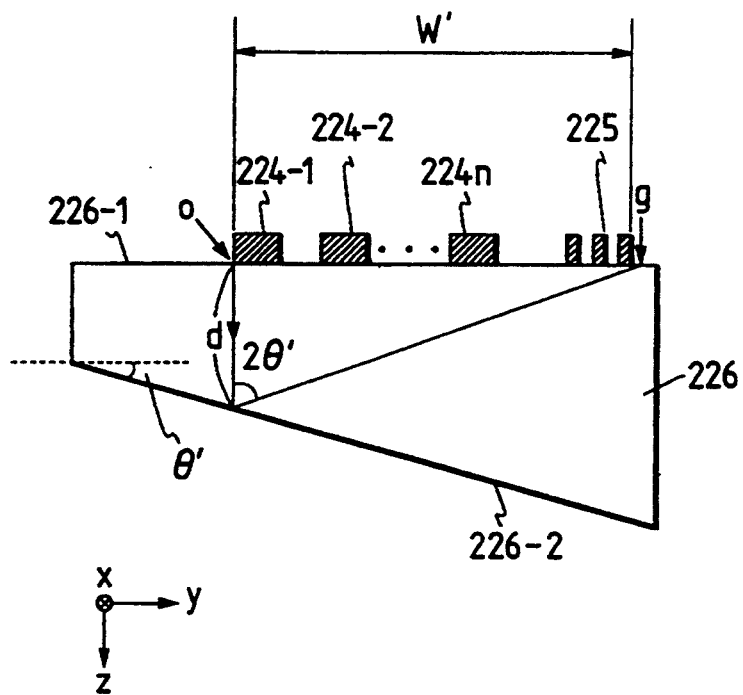
FIG. 29 is a schematic perspective view showing a surface acoustic wave element according to the sixteenth embodiment of the present invention.

FIG. 29 is a schematic sectional view showing the sixteenth embodiment as a modification of the fifteenth embodiment. The same reference numerals as in FIG. 28 denote the same parts in FIG. 29, and a detailed description thereof will be omitted.

The sixteenth embodiment is substantially the same as the fifteenth embodiment except that a second surface 226-2 of a substrate 226 has an inclination angle θ' with respect to a first surface 226-1. The inclination angle θ' satisfies condition (11) below:

$$\tan 2\theta' \geqq W'/d \quad (11)$$

where W' is the y-axis length from a point (an o point) where the thickness of the substrate is smallest within the region of the first surface 226-1 where waveguides 224-1 to 224-n and an output electrode 225 are formed.

In this case, the length W' is defined as W'=W+w+w' where W is the width of a region 227 in which the waveguides are formed, w is the distance from the region 227 to the output electrode in the y-axis, and w' is the width of the output electrode in the y-axis.

Since this embodiment satisfies condition (11), bulk waves generated by the waveguides reach positions outside the output electrode 225 (i.e., positions outside a g point) on the first surface 226-1 in the positive direction of the y-axis. For this reason, in addition to the same effect as the fifteenth embodiment in which an influence of bulk waves returning to the waveguides can be eliminated, the following two additional effects can also be obtained.

1) A bulk wave reflected by the lower surface of the substrate is not directly incident on the output electrode 225, thereby preventing adverse influences of the bulk waves on the output signal.

2) A bulk wave reflected by the substrate's lower surface is converted into a surface acoustic wave by its surface between the waveguide and the output electrode 225, and this surface acoustic wave is received by the output electrode, thereby preventing generation of noise.

Figure 30:
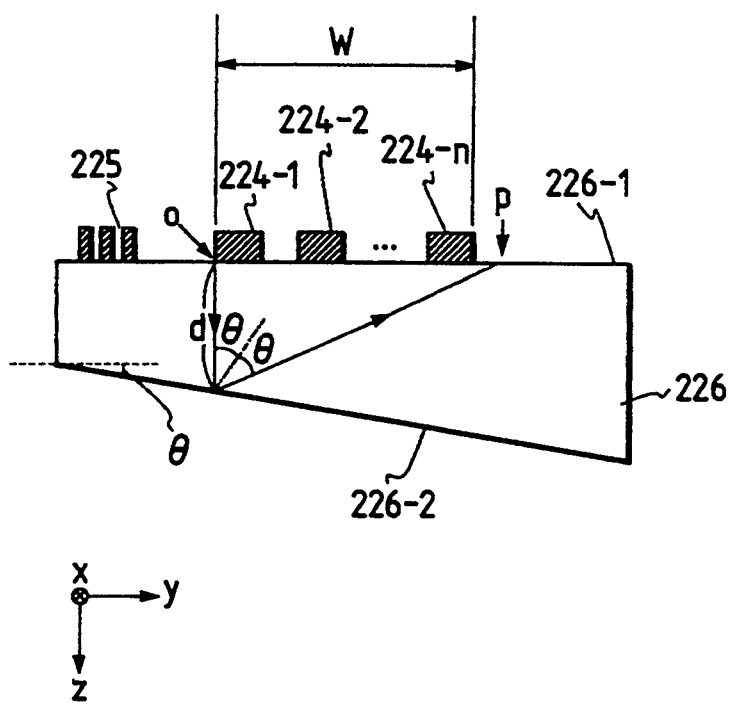
FIG. 30 is a schematic perspective view showing a surface acoustic wave element according to the seventeenth embodiment of the present invention.

FIG. 30 is a schematic sectional view showing the seventeenth embodiment as a modification of the fifteenth embodiment. The same reference numerals as in FIG. 28 denote the same parts in FIG. 30, and a detailed description thereof will be omitted.

The seventeenth embodiment is substantially the same as the fifteenth embodiment except that an output electrode is formed on the opposite side (i.e., the positive direction of the y-axis) to a direction in which bulk waves are reflected with respect to the waveguides. Since the third surface acoustic wave excited by the waveguides propagates on both sides (i.e., the positive and negative directions of the y-axis) of the waveguides, a convolution signal can be extracted from an output electrode 225 as in the fifteenth embodiment. In addition, since the angle θ of the second surface of the substrate is formed to satisfy condition (10), the bulk waves do not return to the waveguides, and a convolution signal can be detected at a high S/N ratio. Furthermore, bulk waves are not directly input to the output electrode and bulk waves converted into the surface acoustic waves by the first surface of the substrate are not input to the output electrode, either. Therefore, the same effect as the sixteenth embodiment can also be obtained in the seventeenth embodiment.

Figure 31:
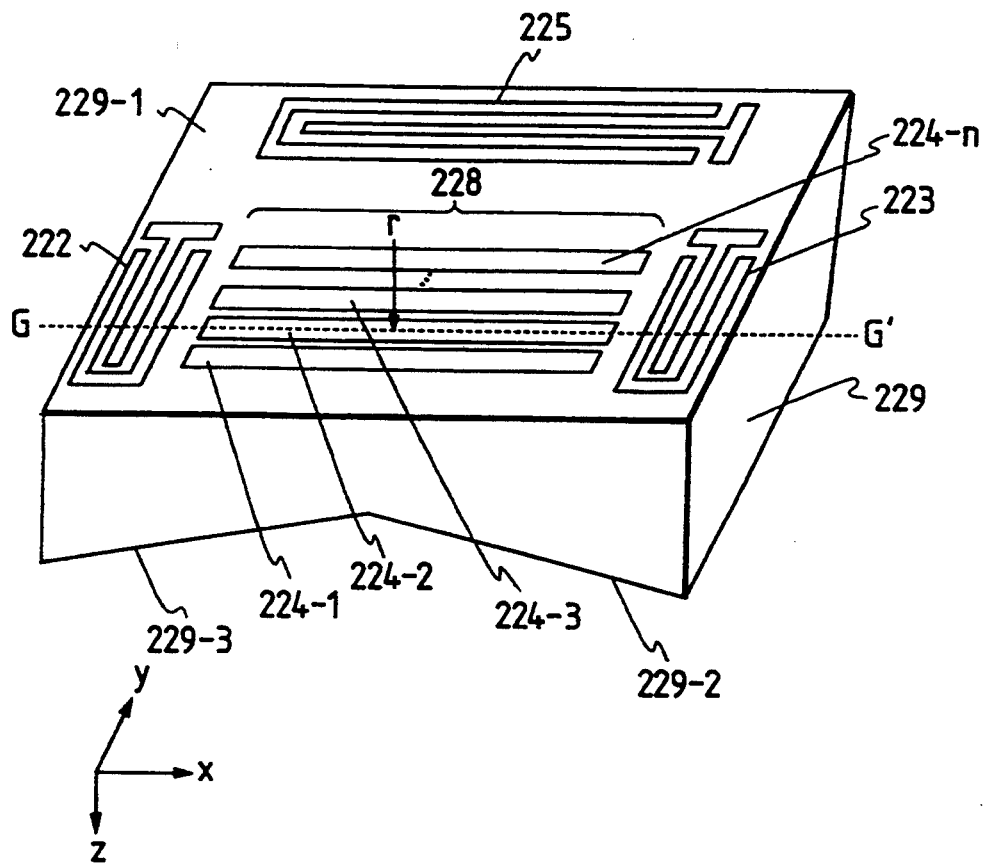
FIG. 31 is a schematic perspective view showing a surface acoustic wave element according to the eighteenth embodiment of the present invention.
Figure 32:
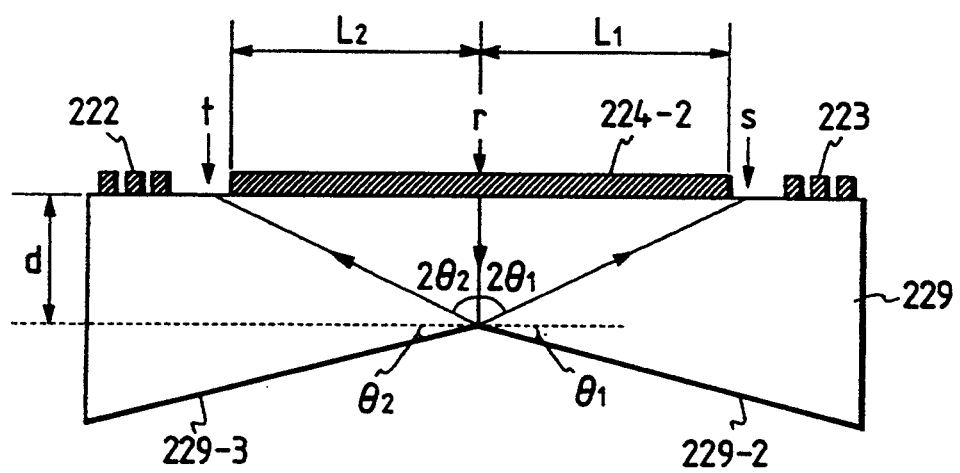
FIG. 32 is a schematic sectional view of the element shown in FIG. 31 along the line G-G' thereof.

FIG. 31 is a schematic perspective view showing a surface acoustic wave element according to the eighteenth embodiment of the present invention. FIG. 32 is a schematic sectional view of the element shown in FIG. 31 along the line G-G' thereof. The same reference numerals as in FIGS. 25 and 26 denote the same parts in FIGS. 31 and 32, and a detailed description thereof will be omitted.

The eighteenth embodiment is different from the fourteenth embodiment only in that an inverted tapered structure is formed such that the thickness of a substrate 229 is increased away from an r point as an almost central point along the propagation direction (i.e., a direction parallel to the x-axis) of the surface acoustic waves excited from input electrodes.

In the element of this embodiment, the lower surface of the substrate, i.e., the second surface of the substrate 229 which opposes a first surface 229-1 on which input electrodes and the like are formed, is constituted by surfaces 229-2 and 229-3 inclined in opposite directions. The inclined surfaces 229-2 and 229-3 have inclination angles $\theta_1$ and $\theta_2$ with respect to the first surface 229-1. The element of this embodiment satisfies conditions (12) and (13):

$$\tan 2\theta_1 \geq L_1/d \qquad (12)$$

$$\tan 2\theta_2 \geq L_2/d \qquad (13)$$

where $\underline{d}$ is the thickness of the substrate 229 at a point (i.e., an $\underline{r}$ point) where the thickness of the substrate from the first surface to the second surface is smallest within a region 228 of waveguides, $L_1$ is the length of the region 228 (the length of the waveguides) from the $\underline{r}$ point in the positive direction of the x-axis, and $L_2$ is the length of the region 228 from the $\underline{r}$ point in the negative direction of the x-axis.

In the surface acoustic wave element having the above arrangement, when the first and second signals each having a carrier angular frequency $\omega$ are input to first and second electrodes 222 and 223, respectively, the first and second surface acoustic waves are excited from these input electrodes and propagate through waveguides 224-1 to 224-n in opposite directions, thereby generating the third surface acoustic wave. The third surface acoustic wave is received by an output electrode 225 to extract a convolution output signal as in the fourteenth embodiment.

While the signal is being extracted from the output electrode 225 as described above, bulk waves each having a carrier angular frequency $2\omega$ are simultaneously generated in the region 228 in which the waveguides are forme, and these waves propagate in a direction perpendicular to the first surface 229-1. Of these bulk waves, the bulk wave generated on the positive side of the x-axis with respect to the $\underline{r}$ point is reflected by the inclined surface 229-2 at an angle $2\theta_1$ and returns to an $\underline{s}$ point on the first surface 229-1 again. If the distance from the $\underline{r}$ point to the $\underline{s}$ point is defined as $I_1$, this distance is calculated as $I_1 = d\tan 2\theta_1$ from condition $\tan 2\theta_1 = I_1/d$. The condition for inhibiting the bulk wave generated from the $\underline{r}$ point from being input to the waveguides is $I_1 \geq L_1$, so that condition (12) can be derived from condition $d\tan 2\theta_1 \geq L_1$. Similarly, the bulk wave generated on the negative side of the x-axis with respect to the $\underline{r}$ point is reflected by the inclined surface 229-3 at an angle $2\theta_2$ and returns to a $\underline{t}$ point on the first surface 229-1 again. If the distance from the $\underline{r}$ point to the t point is defined as $I_2$, this distance is calculated as $I_2 = d\tan 2\theta_2$ from condition $\tan 2\theta_2 = I_2/d$. The condition for inhibiting the bulk wave generated from the $\underline{r}$ point from being input to the waveguides is $I_2 \geq L_2$, so that condition (13) can be derived from condition $d\tan 2\theta_2 \geq L_2$. In this embodiment, all the bulk waves generated at all the portions of the output electrode are reflected by the lower surface of the substrate but do not return to the output electrode. A convolution output signal having a high S/N ratio can be extracted as in the fourteenth embodiment. In addition, in this embodiment, even if the length of the output electrode is kept unchanged, the inclination angle which satisfies conditions (12) and (13) can be reduced to ½, thereby reducing the thickness of the substrate accordingly.

In the eighteenth embodiment described above, the bent portion is formed at almost the central position ($\underline{r}$ point) of the output electrode. However, if conditions (12) and (13) are satisfied, the bent portion may be shifted from the center. The angles $\theta_1$ and $\theta_2$ of the two surfaces inclined with respect to the first surface may be the same or different.

Figure 33:
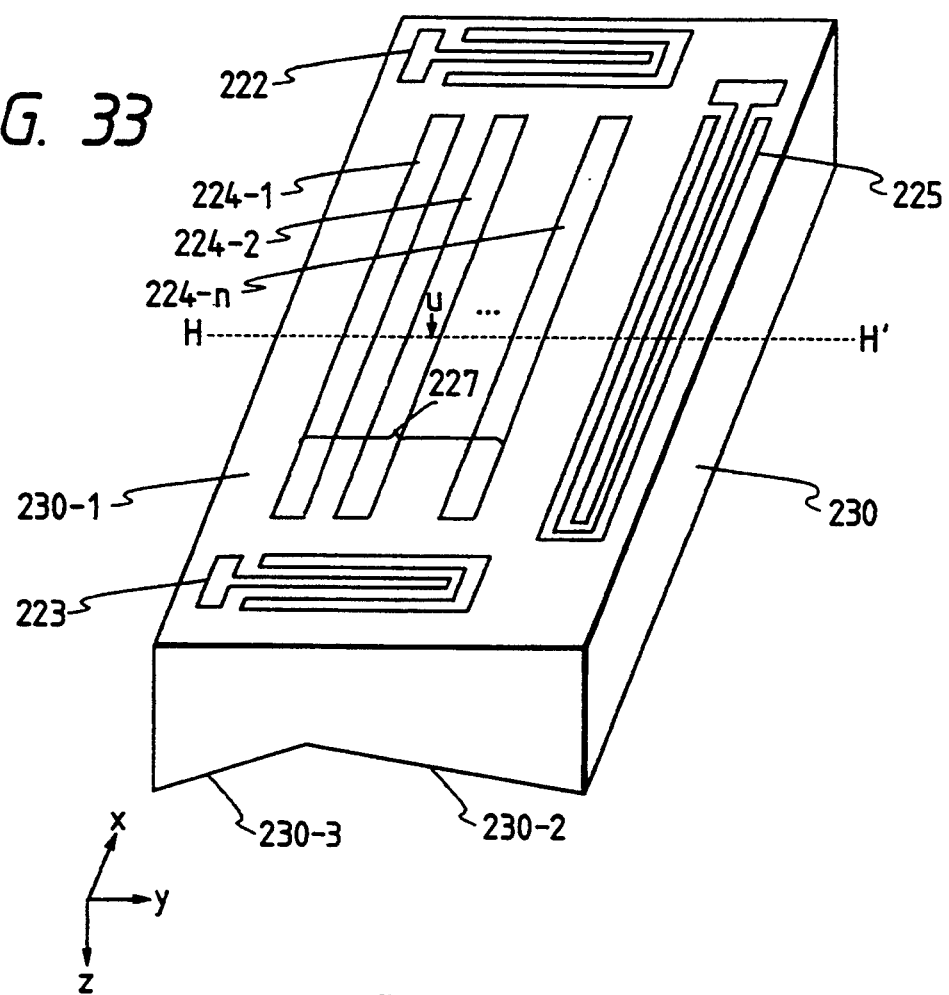
FIG. 33 is a schematic perspective view showing a surface acoustic wave element according to the nineteenth embodiment of the present invention.
Figure 34:
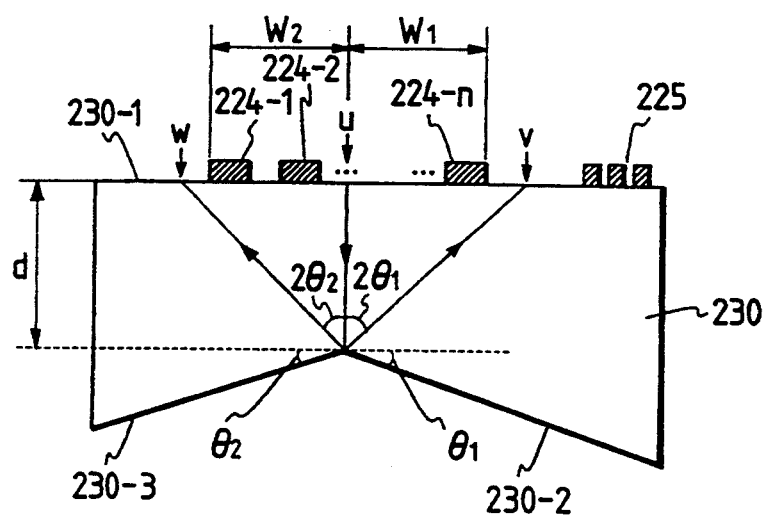
FIG. 34 is a schematic sectional view of the element shown in FIG. 33 along the line H-H' thereof.

FIG. 33 is a schematic perspective view showing a surface acoustic wave element according to the nineteenth embodiment of the present invention. FIG. 34 is a schematic sectional view of the element shown in FIG. 33 along the line H-H' thereof. The same reference numerals as in FIGS. 25 and 26 denote the same parts in FIGS. 33 and 34, and a detailed description thereof will be omitted.

The nineteenth embodiment is different from the fourteenth embodiment only in that an inverted tapered structure is formed such that the thickness of a substrate 230 is increased away from a $\underline{u}$ point of a region 227 of waveguides as an almost central point along a direction (i.e., a direction parallel to the y-axis) perpendicular to the propagation direction of the surface acoustic waves excited from input electrodes.

In the element of this embodiment, the lower surface of the substrate, i.e., the second surface of the substrate 230 which opposes a first surface 230-1 on which input electrodes and the like are formed, is constituted by surfaces 230-2 and 230-3 inclined in opposite directions. The inclined surfaces 230-2 and 230-3 have inclination angles $\theta_1$ and $\theta_2$ with respect to the first surface 230-1. The element of this embodiment satisfies conditions (14) and (15):

$$\tan 2\theta_1 \geq W_1/d \qquad (14)$$

$$\tan 2\theta_2 \geq W_2/d \qquad (15)$$

where $\underline{d}$ is the thickness of the substrate 230 at a point (i.e., a $\underline{u}$ point) where the thickness of the substrate from the first surface to the second surface is smallest within the region 227, $W_1$ is the length of the region 227 from the $\underline{u}$ point in the negative direction of the y-axis, and $W_2$ is the length of the region 227 from the $\underline{u}$ point in the positive direction of the y-axis.

In the surface acoustic wave element having the above arrangement, when the first and second signals each having a carrier angular frequency $\omega$ are input to first and second electrodes 222 and 223, respectively, the first and second surface acoustic waves are excited from these input electrodes. These surface acoustic waves propagate through waveguides 224-1 to 224-n in opposite directions, thereby generating the third surface acoustic wave. The third surface acoustic wave is received by an output electrode 225 to extract a convolution output signal as in the fourteenth embodiment.

While the signal is being extracted from the output electrode 225 as described above, bulk waves each having a carrier angular frequency $2\omega$ are simultaneously generated in the region 227 where the waveguides are formed, and the bulk waves propagate in a direction perpendicular to the first surface 230-1. Of these bulk waves, the bulk wave generated on the positive side of the y-axis with respect to the $\underline{u}$ point is reflected by the inclined surface 230-2 at an angle $2\theta_1$ and returns to a $\underline{v}$ point on the first surface 230-1 again. If the distance from the $\underline{u}$ point to the $\underline{v}$ point is defined as $I_1$, this distance is calculated as $I_1 = d\tan 2\theta_1$ from condition $\tan 2\theta_1 = I_1/d$. The condition for inhibiting the bulk wave generated from the $\underline{u}$ point from being input to the waveguides is $I_1 \geq W_1$, so that condition (14) can be derived from condition $d\tan 2\theta_1 \geq W_1$. Similarly, the bulk wave generated on the negative side of the y-axis with respect to the u point is reflected by the inclined surface 230-3 at an angle $2\theta_2$ and returns to a w point on the first surface 230-1 again. If the distance from the u point to the w point is defined as $I_2$, this distance is calculated as $\overline{I_2} = d\tan 2\theta_2$ from condition $\tan 2\theta_2 = I_2/d$. The condition for inhibiting the bulk wave generated from the u point from being input to the waveguides is $I_2 \geq W_2$, so that condition (15) can be derived from condition $d\tan 2\theta_2 \geq W_2$. In this embodiment, all the bulk waves generated at all the portions of the output electrode are reflected by the lower surface of the substrate but do not return to the output electrode. A convolution output signal having a high S/N ratio can be extracted as in the fourteenth embodiment. In addition, in this embodiment, even if the length of the output electrode is kept unchanged, the inclination angle which satisfies conditions (14) and (15) can be reduced to ½ that of the fifteenth embodiment, thereby reducing the thickness of the substrate accordingly.

In the nineteenth embodiment described above, the bent portion is formed at almost the central position (u point) of the region 227 in which the waveguides are formed. However, if conditions (14) and (15) are satisfied, the bent portion may be shifted from the center. The angles $\theta_1$ and $\theta_2$ of the two surfaces inclined with respect to the first surface may be the same or different.

In each of the tenth to nineteenth embodiments described above, the second surface of the substrate is entirely inclined with respect to the first surface. However, the portion of the second surface which opposes the region of the first surface in which the output electrode or the waveguides are formed may be constituted by an inclined surface, and the remaining portion of the second surface may be formed parallel to the first surface. With this structure, the thickness of the substrate can be further reduced, as compared with the tenth to nineteenth embodiments. In addition, since the substrate can be easily held, the substrate can be easily handled to form electrodes thereon, and an element is mounted in a communication system.

The coordinate axes in FIGS. 17 to 34 are determined for the illustrative convenience, and do not indicate the crystalline axes and the like of the substrate.

In the above embodiments, the angles of the inclined surfaces are determined so that bulk waves reflected by the lower surface of the substrate are not incident on the output electrode or the waveguides. However, if the length of the output electrode or waveguide, the wavelength of the bulk wave, and the inclination angle of the inclined surface are set to satisfy a specific relationship, even if bulk waves are incident on the output electrode or waveguides, adverse influences of the bulk waves on the output signal can be almost eliminated. Such an embodiment will be described below.

Figure 35:
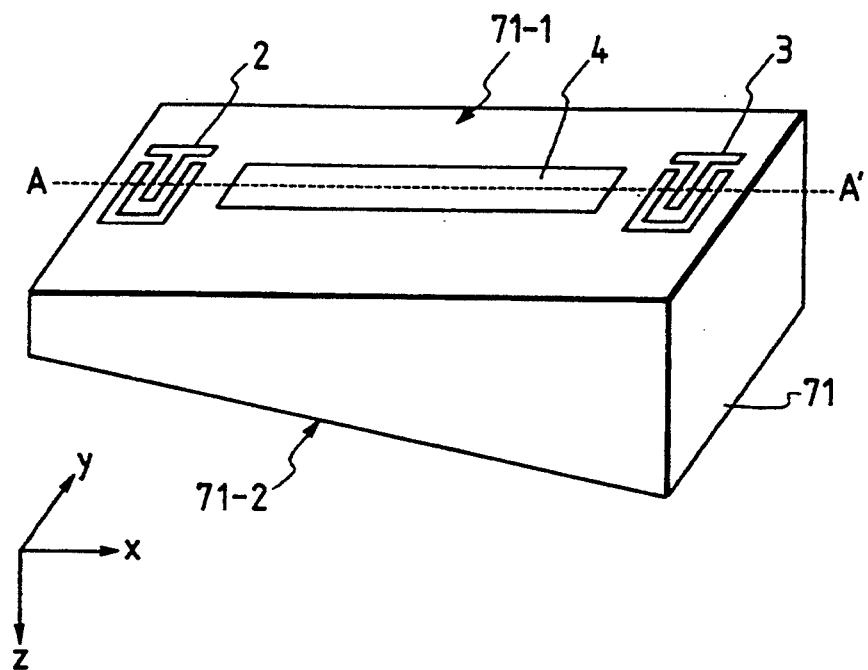
FIG. 35 is a schematic perspective view showing a surface acoustic wave element according to the twentieth embodiment of the present invention.
Figure 36:
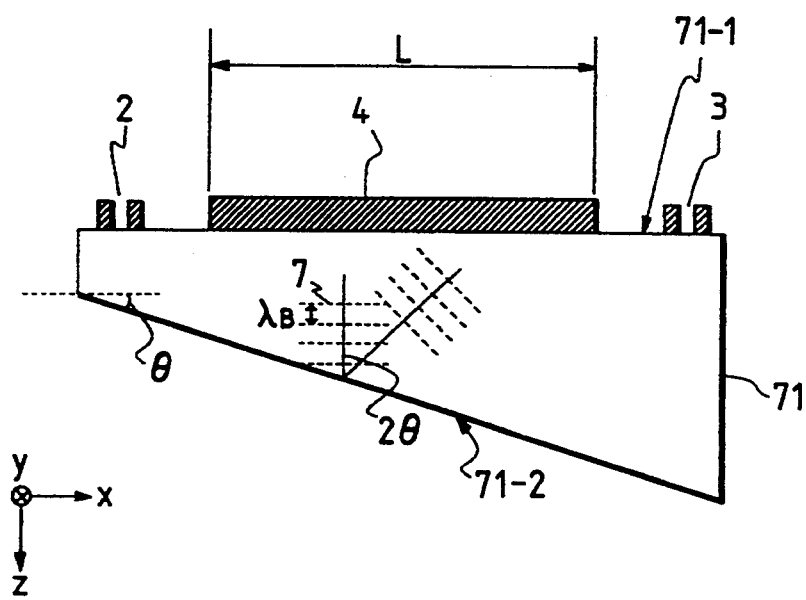
FIG. 36 is a schematic sectional view of the element shown in FIG. 35 along the line A-A' thereof.

FIG. 35 is a schematic perspective view showing a surface acoustic wave element according to the twentieth embodiment of the present invention. FIG. 36 is a schematic sectional view of the element shown in FIG. 35 along the line A-A' thereof.

Referring to FIGS. 35 and 36, a piezoelectric substrate 71 is made of Y-cut (Z propagation) lithium niobate. Comb input electrodes (input interdigital transducers) 2 and 3 are formed on a first surface 71-1 of the substrate 71. An output electrode 4 is formed on the first surface 71-1 between the input electrodes (transducers) 2 and 3 on the substrate 71. The input electrodes (transducers) 2 and 3, and the output electrode 4 are generally formed by photolithographic patterning using a conductive material such as aluminum.

In the twentieth embodiment, the lower surface of the substrate 71, i.e., a second surface 71-2 of the substrate 71 which opposes the first surface 71-1 on which input electrodes and the like are formed, is inclined along the propagation direction (i.e., a direction parallel to the x-axis in FIGS. 35 and 36) of surface acoustic waves exited from the input electrodes on the first surface 71-1. The element of this embodiment satisfies condition (16):

$$L \geq 3\lambda_B/\sin 2\theta \qquad (16)$$

where $\theta$ is the inclination angle of the second surface 71-2, L is the length of the output electrode in the x-axis, and $\lambda_B$ is the wavelength of a bulk wave generated by the interaction between the first and second surface acoustic waves.

More specifically, for example, the length L of the output electrode is given as L=60 mm, the wavelength $\lambda_B$ of the bulk wave is given as $\lambda_B=20$ μm, and the inclination angle $\theta$ of the second surface 71-2 of the substrate is given as $\theta=0.028°$.

In the surface acoustic wave element having the above arrangement, when the first signal having a carrier angular frequency $\omega$ is input to the first input electrode 2, the first surface acoustic wave corresponding to the first input signal is generated by the electrode 2 and propagates in the positive direction of the x-axis. Meanwhile, the second signal having a carrier angular frequency $\omega$ is input to the second input electrode 3, the second surface acoustic wave corresponding to the second input signal is generated by the electrode 3 and propagates in the negative direction of the x-axis. The first and second surface acoustic waves propagate in opposite directions and interact with each other in a region where the output electrode 4 is formed. An electrical signal having a carrier angular frequency $2\omega$ and corresponding to a convolution signal of the first and second input signals is extracted from the output electrode 4 in accordance with the physical nonlinear effect of the substrate.

While the signal is being extracted from the electrode 4, as described above, bulk waves having the carrier angular frequency $2\omega$ are generated in the interaction region of the surface acoustic waves and propagate in a direction perpendicular to the first surface 71-1. A broken line in FIG. 36 indicates a wave surface of in-phase bulk waves, and their wavelength is given as $\lambda_B$. This bulk wave 7 is reflected by the second surface 71-2 of the substrate 71 and is then incident on the output electrode. Since the second surface 71-2 has an inclination angle $\theta$ with respect to the first surface 71-1, this bulk wave is reflected at an angle $2\theta$ with respect to the normal to the first surface.

Figure 37:
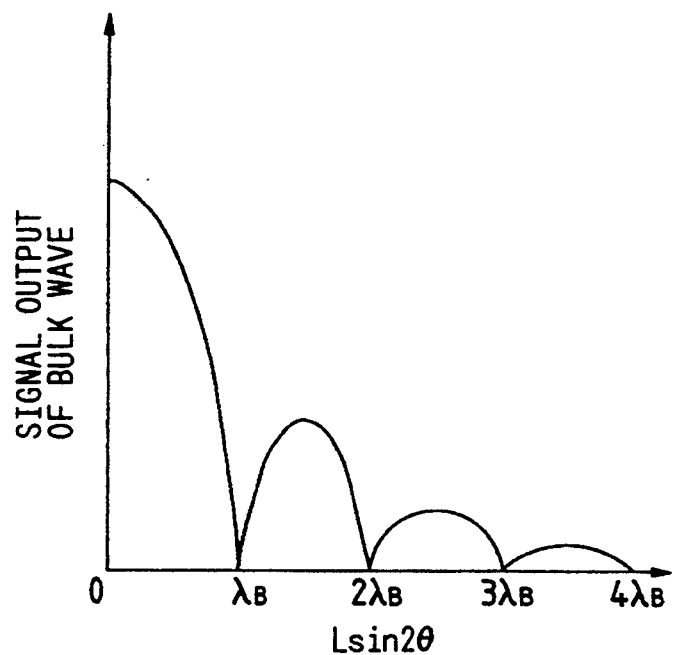
FIG. 37 is a view showing a relationship between the length of an output electrode and the signal output by a bulk wave.

A signal output derived from the reflected bulk wave 7 has a relationship (FIG. 37) with a length L of the output electrode. Referring to FIG. 37, $L\sin 2\theta$ is plotted along the abscissa, and the signal output of the bulk wave mixed in a convolution signal from the output electrode is plotted along the ordinate. As is apparent from FIG. 37, the signal derived from the bulk wave becomes zero when $L\sin 2\theta$ is equal to an integer multiple of the wavelength $\lambda_B$. The signal output is gradually decreased when the length of the output electrode is increased. If condition $L\sin 2\theta \geq 3 \lambda_B$ is satisfied, i.e., if the length L of the output electrode satisfies condition (16), signals derived from the bulk waves are almost not output. In the surface acoustic wave element according to the present invention, since the angle of the lower surface of the substrate and the length of the output electrode satisfy a predetermined relationship, the influences of the bulk waves can be eliminated, and a convolution signal can be extracted at a high S/N ratio.

Figure 38:
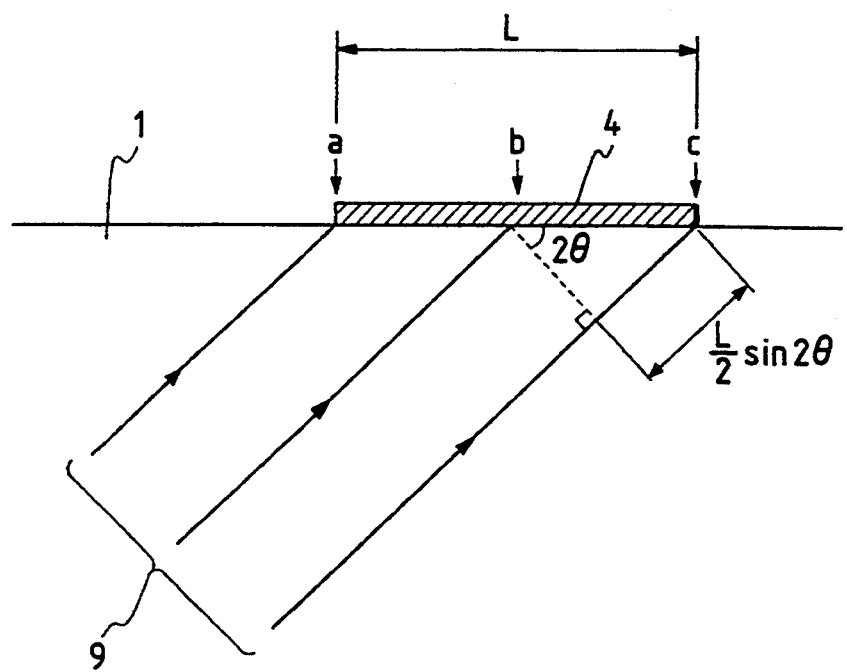
FIG. 38 is a schematic sectional view for explaining differences in lengths of propagation paths of bulk waves incident on the respective parts of the output electrode.

The relationship between the length of the output electrode and the signal derived from the bulk wave will be described below. That is, in the element shown in FIG. 38 according to the present invention, a bulk wave 9 reflected by the lower surface of the substrate 71 is incident on the output electrode 4 so that the angle between the wave surface and the upper surface of the substrate is set to $2\theta$. At this time, the difference between a bulk wave incident on a b point as the central point of the electrode 4 and a bulk wave incident on a c point is $(L/2)\sin 2\theta$. $L\sin 2\theta$ is equal to the wavelength $\lambda_B$ of the bulk wave. For this reason, a signal output from the electrode upon incidence of the bulk wave on the b point has a ½ phase difference from the signal derived upon incidence of the bulk wave at the c point, so that these signals cancel each other. Similarly, a signal derived from a bulk wave incident between the b point and the c point is canceled by a signal derived from a bulk wave incident between an a point and the b point. Therefore, a total signal output derived from the bulk waves at the electrode 4 becomes zero. An output derived from bulk waves under the condition that $L\sin 2\theta$ is an integer multiple of $\lambda_B$ also becomes zero. According to the present invention, the bulk waves incident on the output electrode or waveguides (to be described later) almost cancel each other, and a convolution signal is not adversely affected.

Figure 39:
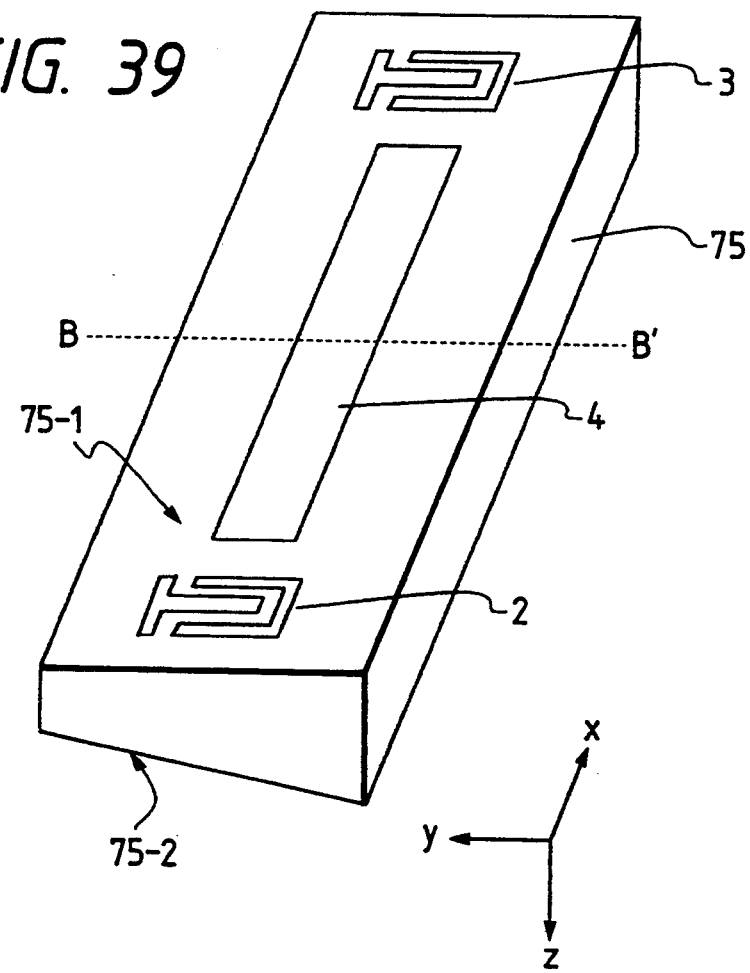
FIG. 39 is a schematic perspective view showing a surface acoustic wave element according to the twenty-first embodiment of the present invention.
Figure 40:
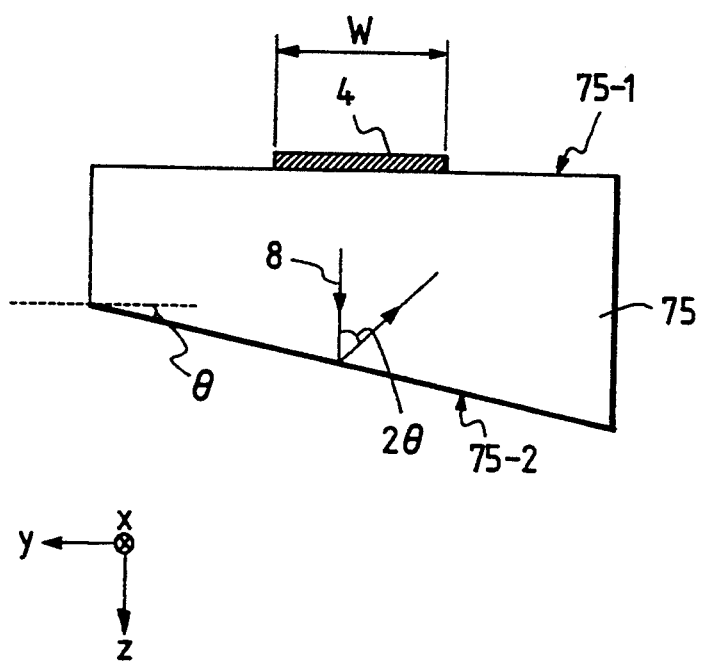
FIG. 40 is a schematic sectional view of the element shown in FIG. 39 along the line B-B' thereof.

FIG. 39 is a schematic perspective view showing a surface acoustic wave element according to the twenty-first embodiment of the present invention. FIG. 40 is a schematic sectional view of the element shown in FIG. 39 along the line B–B' thereof. The same reference numerals as in FIGS. 35 and 36 denote the same parts in FIGS. 39 and 40, and a detailed description thereof will be omitted.

The twenty-first embodiment is substantially the same as the twentieth embodiment except that a piezoelectric substrate 75 is inclined in a direction (i.e., a direction parallel to the y-axis) perpendicular to the propagation direction of surface acoustic waves excited from input electrodes.

In the element of this embodiment, the lower surface of the substrate, i.e., a second surface 75-2 of the substrate 75 which opposes a first surface 75-1 on which input electrodes and the like are formed, is inclined at an angle $\theta$ with respect to the first surface 75-1 along the y-axis. The element of this embodiment satisfies condition (17):

$$W \gtrsim 3\lambda_B/\sin 2\theta \quad (17)$$

where W is the length (corresponding to the width of the output electrode in this embodiment) of an output electrode 4 along the y-axis within a region in which the output electrode 4 is formed.

In the surface acoustic wave element having the above arrangement, when the first and second signals each having a carrier angular frequency $\omega$ are input to first and second input electrodes 2 and 3, respectively, the first and second surface acoustic waves are excited from these input electrodes, respectively. These surface acoustic waves interact with each other in the region in which the output electrode 4 is formed, so that a convolution output signal is extracted from the electrode 4 as in the twentieth embodiment.

While the signal is being extracted from the electrode 4, as described above, a bulk wave 8 having a carrier angular frequency $2\omega$ is simultaneously generated in the interaction region of the surface acoustic waves and propagates in a direction perpendicular to the first surface 75-1. This bulk wave 8 is reflected by the second surface 75-2 at an angle $2\theta$ and returns to the output electrode 4. Bulk waves incident on the output electrode 4 almost cancel each other in accordance with condition (17) as in the twentieth embodiment, and the convolution signal is almost not adversely affected. In addition, since the width W of the output electrode is generally smaller than the length L in the surface acoustic wave element, if an angle $\theta$ which satisfies the above condition is set, the thickness of the substrate is not much increased as compared with the twentieth embodiment.

Figure 41:
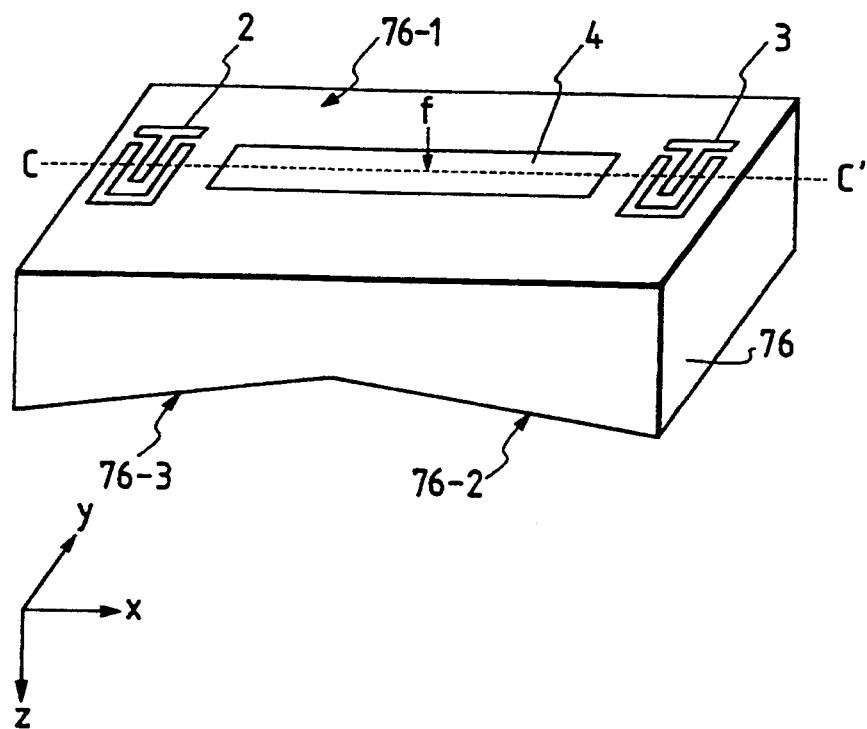
FIG. 41 is a schematic perspective view showing a surface acoustic wave element according to the twenty-second embodiment of the present invention.
Figure 42:
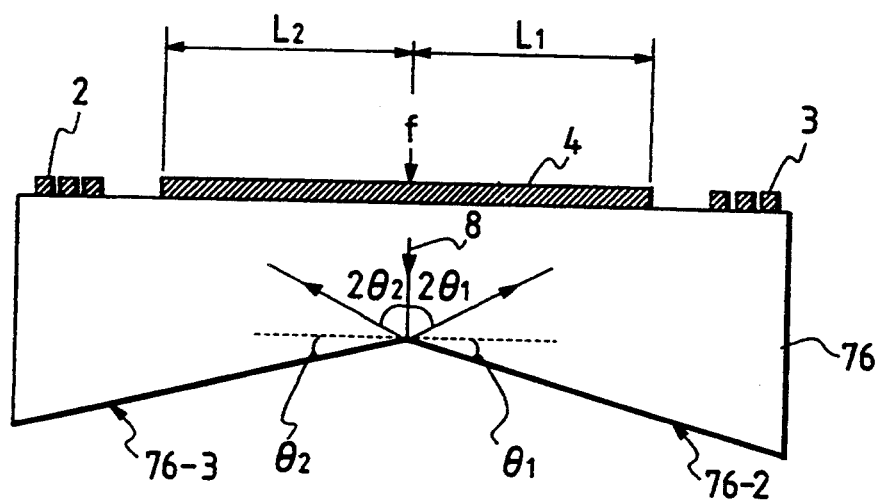
FIG. 42 is a schematic sectional view of the element shown in FIG. 41 along the line C-C' thereof.

FIG. 41 is a schematic perspective view showing a surface acoustic wave element according to the twenty-second embodiment of the present invention. FIG. 42 is a schematic sectional view of the element shown in FIG. 41 along the line C–C' thereof. The same reference numerals as in FIGS. 35 and 36 denote the same parts in FIGS. 41 and 42, and a detailed description thereof will be omitted.

The twenty-second embodiment is different from the twentieth embodiment only in that an inverted tapered structure is formed such that the thickness of a substrate 76 is increased away from an f point as an almost central point along the propagation direction (i.e., a direction parallel to the x-axis) of the surface acoustic waves excited from input electrodes.

In the element of this embodiment, the lower surface of the substrate, i.e., the second surface of the substrate 76 which opposes a first surface 76-1 on which input electrodes and the like are formed, is constituted by surfaces 76-2 and 76-3 inclined in opposite directions. The inclined surfaces 76-2 and 76-3 have inclination angles $\theta_1$ and $\theta_2$ with respect to the first surface 76-1. The element of this embodiment satisfy conditions (18) and (19):

$$L_1 \gtrsim 3\lambda_B/\sin 2\theta_1 \quad (18)$$

$$L_2 \gtrsim 3\lambda_B/\sin 2\theta_2 \quad (19)$$

where $L_1$ is the length of the output electrode from the f point in the positive direction of the x-axis, and $L_2$ is the length of the output electrode from the f point in the negative direction of the x-axis.

In the surface acoustic wave element having the above arrangement, when the first and second signals each having a carrier angular frequency $\omega$ are input to first and second input electrodes 2 and 3, respectively, the first and second surface acoustic waves are excited from these input electrodes, respectively. These surface acoustic waves interact with each other in the region in which an output electrode 4 is formed, so that a convolution output signal is extracted from the electrode 4 as in the twentieth embodiment.

While the signal is being extracted from the electrode 4, as described above, a bulk wave 8 having a carrier angular frequency $2\omega$ is simultaneously generated in the interaction region of the surface acoustic waves and propagates in a direction perpendicular to the first surface 76-1. Of these bulk waves, the bulk wave generated from the f point on the positive side of the x-axis is reflected by the second surface 76-2 at an angle $2\theta_1$ and returns to the output electrode 4. Bulk waves incident on the output electrode 4 almost cancel each other in accordance with condition (18). Similarly, a bulk wave generated from the f point on the negative side of the x-axis is reflected at an angle $2\theta_2$ by the inclined surface 76-3 and returns to the output electrode 4. These bulk waves almost cancel each other from condition (19). Therefore, a convolution output signal can be extracted at a high S/N ratio as in the twentieth embodiment. In this embodiment, even if the length of the output electrode is kept unchanged, the inclination angle which satisfies conditions (18) and (19) can be made into ½, the thickness of the substrate can be further reduced.

In the twenty-second embodiment described above, the bent portion is formed at almost the central position (f point) of the output electrode. However, if conditions (18) and (19) are satisfied, the bent portion may be shifted from the center. The angles $\theta_1$ and $\theta_2$ of the two surfaces inclined with respect to the first surface may be the same or different.

In each of the twentieth to twenty-second embodiments, the output electrode is formed between the input electrodes. However, a surface acoustic wave element having a plurality of waveguides between the electrodes to further improve output efficiency of the convolution signal is proposed by Nakagawa et al., Journal of the Institute of Electronic and Communication Engineers of Japan, '86/2, Vol. j69-C, No. 2, pp. 190–198", and the like. The present invention is also applicable to a so-called divided waveguide type element. Embodiments exemplifying divided waveguide type elements will be exemplified below.

Figure 43:
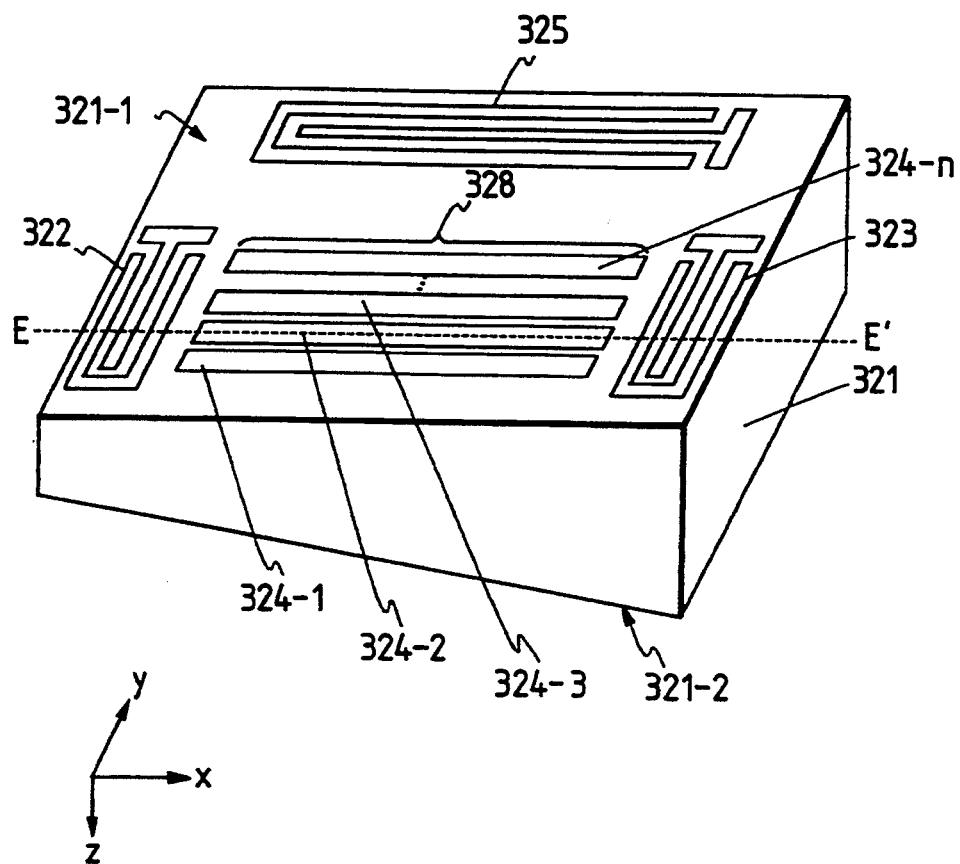
FIG. 43 is a schematic perspective view showing a surface acoustic wave element according to the twenty-third embodiment of the present invention.
Figure 44:
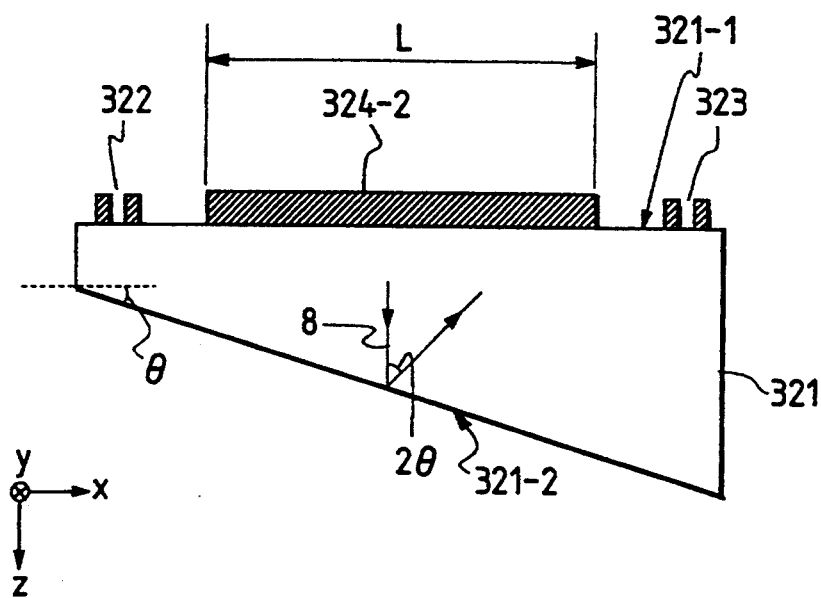
FIG. 44 is a schematic sectional view of the element shown in FIG. 43 along the line D-D' thereof.

FIG. 43 is a schematic perspective view showing a surface acoustic wave element according to the twenty-third embodiment of the present invention. FIG. 44 is a schematic sectional view of the element shown in FIG. 43 along the line E–E' thereof.

Referring to FIGS. 43 and 44, a piezoelectric substrate 321 is made of 128° rotation cut (X propagation) lithium niobate. First and second comb input electrodes (input interdigital transducers) 322 and 323 are formed on a first surface 321-1 of the substrate 321. A plurality of surface acoustic waveguides 324-1, 324-2, 324-3, . . . , 324-n arranged parallel to each other are formed on the first surface 321-1 between the input electrodes (transducers) 322 and 323. The longitudinal direction of each waveguide coincides with the propagation direction (i.e., a direction parallel to the x-axis) of surface acoustic waves excited from the input electrodes. The arrangement pitch (i.e., the distance between the centers of the adjacent waveguides in the widthwise direction) of the waveguides is determined to be equal to the wavelength of the surface acoustic wave generated by each waveguide. A comb output electrode (output interdigital transducer) 325 is formed at a position away from these waveguides by an appropriate distance in the y-axis.

The input electrodes (transducers) 322 and 323 and the output electrode (transducer) 325 are formed by photolithographic patterning using a conductive material such as aluminum, silver, or gold. The waveguides 324-1, 324-2, 324-3, . . . , 324-n are described in detail in Mikio Shibayama, "Elastic Acoustic Wave Technology", ed., the Institute of Electronic and Communication Engineers, PP. 82–102. Thin film waveguides and topographic waveguides are exemplified. According to the present invention, $\Delta v/v$ waveguides obtained by covering the surface of the substrate with aluminum, silver, gold, or the like are preferably used.

In the element of this embodiment, the lower surface of the substrate, i.e., a second surface 321-2 of the substrate 321 which opposes the first surface 321-1 on which input electrodes are formed, is inclined in the propagation direction (i.e., a direction parallel to the x-axis in FIGS. 43 and 44) of the surface acoustic waves excited from the input electrodes with respect to the first surface 321-1. The element of this embodiment satisfies condition (20) below:

$$L \geq 3\lambda_B/\sin 2\theta \qquad (20)$$

where $\theta$ is the inclination angle of the second surface 321-2, and L is the length (i.e., this length coincides with the length of the waveguides in its longitudinal direction in this embodiment) of a region 328 of the waveguides 324-1 to 224-n along the x-axis.

More specifically, for example, the length L of the output electrode is given as L=60 mm, the wavelength $\lambda_B$ of the bulk wave is given as $\lambda_B$=20 μm, and the inclination angle $\theta$ of the second surface 321-2 of the substrate is given as $\theta$=0.028°.

In the surface acoustic wave element having the above arrangement, when the first signal having a carrier angular frequency $\omega$ is input to the first input electrode 322, the first surface acoustic wave corresponding to the first input signal is generated from the electrode 322 and propagates through the waveguides 324-1 to 324-n in the positive direction of the x-axis. Meanwhile, when the second signal having the carrier angular frequency $\omega$ is input to the second input electrode 323, the second surface acoustic wave corresponding to the second input signal is generated from the electrode 323 and propagates through the waveguides 324-1 to 324-n in the negative direction of the x-axis. The first and second surface acoustic waves propagating in the opposite directions cause excitation of a third surface acoustic wave having a carrier angular frequency $2\omega$ and propagating in the y direction in accordance with a parametric mixing phenomenon caused by the physical nonlinear effect of the substrate 321. This third surface acoustic wave is converted into an electrical signal by the output electrode 325 and is output as a convolution signal of the first and second input signals from the output electrode.

While the signal is being extracted from the output electrode 325 as described above, a bulk wave 8 having a carrier angular frequency $2\omega$ is generated in the region of the waveguides and propagates in a direction perpendicular to the first surface 321-1. This bulk wave 8 is reflected by the second surface 321-2 of the substrate 321 and returns to the region 328 in which the waveguides are formed again. The bulk waves incident on the region 328 of the waveguides cancel each other in accordance with condition (20), and a convolution signal is almost not adversely affected. Therefore, a convolution signal can be extracted at a high S/N ratio as in the twentieth embodiment.

Figure 45:
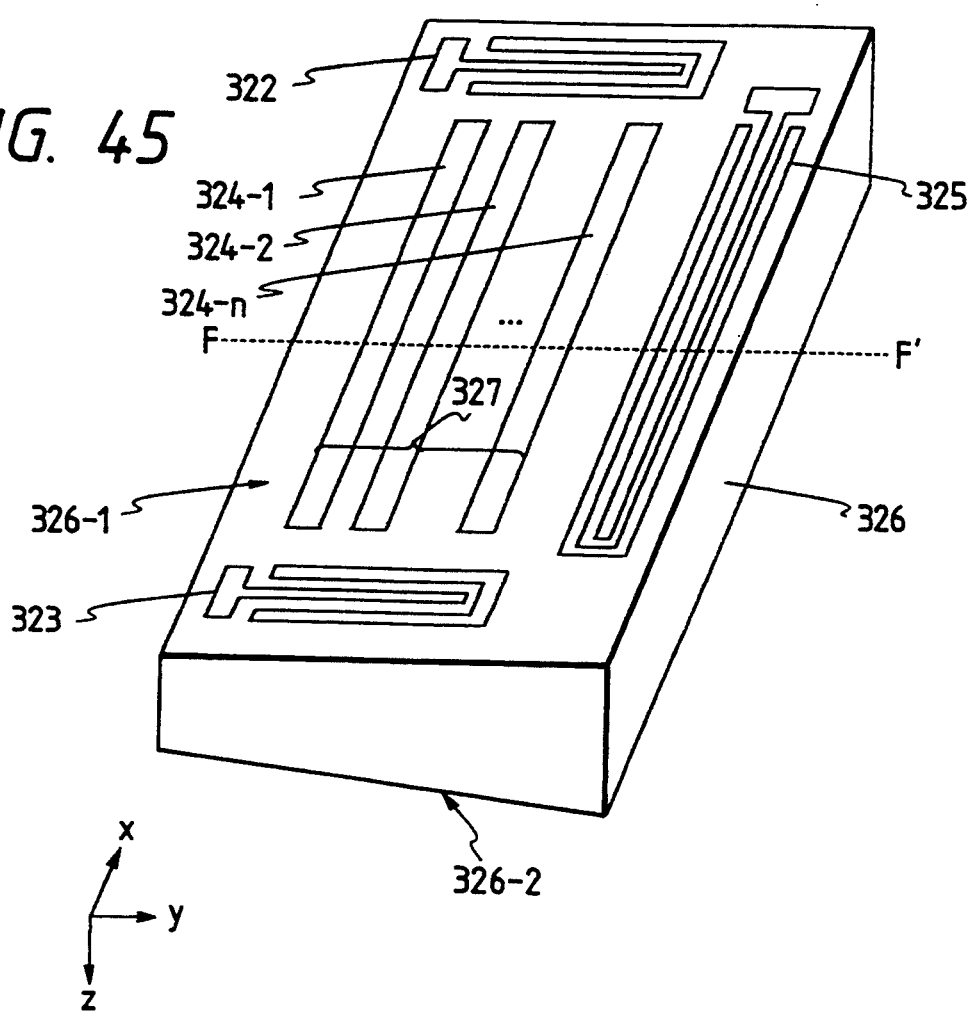
FIG. 45 is a schematic perspective view showing a surface acoustic wave element according to the twenty-fourth embodiment of the present invention.
Figure 46:
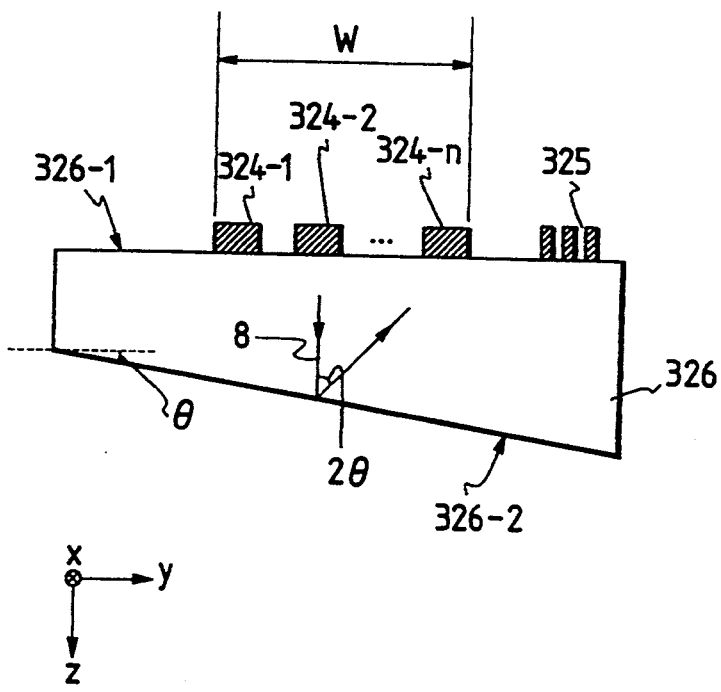
FIG. 46 is a schematic sectional view of the element shown in FIG. 45 along the line E-E' thereof.

FIG. 45 is a schematic perspective view showing a surface acoustic wave element according to the twenty-fourth embodiment of the present invention. FIG. 46 is a schematic sectional view of the element shown in FIG. 45 along the line F–F' thereof. The same reference numerals as in FIGS. 43 and 44 denote the same parts in FIGS. 45 and 46, and a detailed description thereof will be omitted.

The twenty-fourth embodiment is different from the twenty-third embodiment only in that a piezoelectric substrate 326 is inclined along a direction (i.e., a direction parallel to the y-axis) perpendicular to the propagation direction of surface acoustic waves excited from input electrodes.

In the element of the embodiment, the lower surface of the substrate, i.e., a second surface 326-2 of the substrate 326 which opposes a first surface 326-1 on which input electrodes are formed, is inclined at an angle $\theta$ along the y-axis with respect to the first surface 326-1. This element satisfies condition (21) below:

$$W \geq 3\lambda_B/\sin 2\theta \tag{21}$$

where W is the length of a region 227 of the waveguides along the y-axis.

In the surface acoustic wave element having the above arrangement, when the first and second signals each having a carrier angular frequency $\omega$ are input to first and second electrodes 322 and 323, respectively, the first and second surface acoustic waves are excited from these input electrodes. These surface acoustic waves interact with each other in the region where the waveguides 324-1 to 324-n are formed, so that a third surface acoustic wave is generated. This third surface acoustic wave is received by an output electrode 325 to extract a convolution output signal as in the twenty-third embodiment.

While the signal is being extracted from the electrode 325, bulk waves 8 having a carrier angular frequency $2\omega$ are generated in the interaction region of the surface acoustic waves and propagate along a direction perpendicular to the first surface 326-1. These bulk waves 8 are reflected by the second surface 326-2 of the substrate 326 at an angle $2\theta$ and return to the region 327 in which the waveguides are formed. The bulk waves incident on the region 327 of the waveguides cancel each other in accordance with condition (21), and a convolution signal is almost not adversely affected as in the twenty-third embodiment. Therefore, a convolution signal can be extracted at a high S/N ratio as in the twenty-third embodiment. In addition, since the width W of the output electrode is generally smaller than the length L in the surface acoustic wave element, if an angle $\theta$ which satisfies the above condition is set, the thickness of the substrate is not much increased as compared with the twenty-third embodiment.

Figure 47:
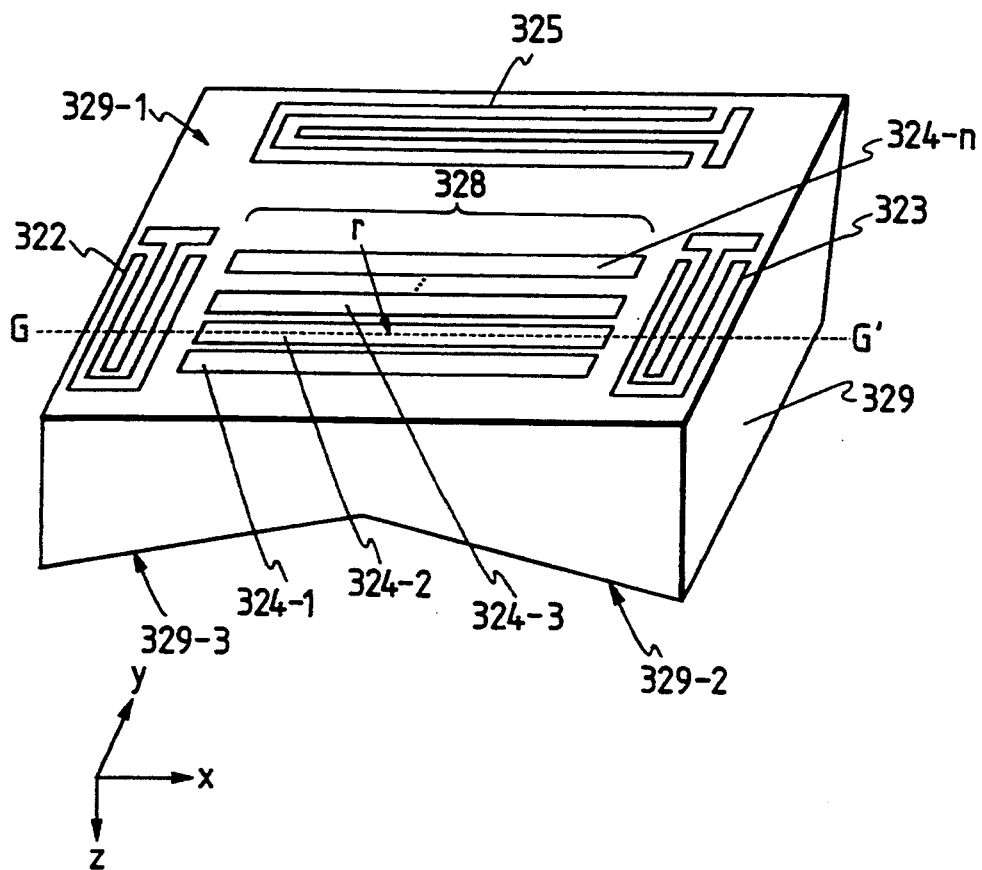
FIG. 47 is a schematic perspective view showing a surface acoustic wave element according to the twenty-fifth embodiment of the present invention.
Figure 48:
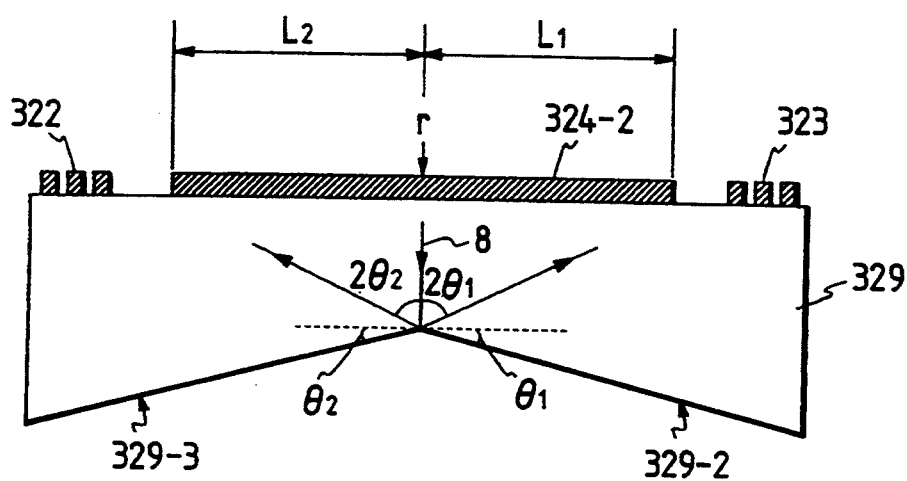
FIG. 48 is a schematic sectional view of the element shown in FIG. 47 along the line F-F' thereof.

FIG. 47 is a schematic perspective view showing a surface acoustic wave element according to the twenty-fifth embodiment of the present invention. FIG. 48 is a schematic sectional view of the element shown in FIG. 47 along the line G–G' thereof. The same reference numerals as in FIGS. 43 and 44 denote the same parts in FIGS. 47 and 48, and a detailed description thereof will be omitted.

The twenty-fifth embodiment is different from the twenty-fourth embodiment only in that an inverted tapered structure is formed such that the thickness of a substrate 329 is increased away from an r point as an almost central point along the propagation direction (i.e., a direction parallel to the x-axis) of the surface acoustic waves excited from input electrodes.

In the element of this embodiment, the lower surface of the substrate, i.e., the second surface of the substrate 329 which opposes a first surface 329-1 on which input electrodes and the like are formed, is constituted by surfaces 329-2 and 329-3 inclined in opposite directions. The inclined surfaces 329-2 and 329-3 have inclination angles $\theta_1$ and $\theta_2$ with respect to the first surface 329-1. The element of this embodiment satisfies conditions (22) and (23):

$$L_1 \geq 3\lambda_B/\sin 2\theta_1 \tag{22}$$

$$L_2 \geq 3\lambda_B/\sin 2\theta_2 \tag{23}$$

where $L_1$ is the length of the region 328 (the length of the waveguides) from the r point in the positive direction of the x-axis and $L_2$ is the length of the region 328 from the r point in the negative direction of the x-axis.

In the surface acoustic wave element having the above arrangement, when the first and second signals each having a carrier angular frequency $\omega$ are input to first and second electrodes 322 and 323, respectively, the first and second surface acoustic waves are excited from these input electrodes and propagate through waveguides 324-1 to 324-n in opposite directions, thereby generating the third surface acoustic wave. The third surface acoustic wave is received by an output electrode 325 to extract a convolution output signal as in the twenty-third embodiment.

While the convolution signal is being output, as described above, a bulk wave 8 having a carrier angular frequency $2\omega$ is simultaneously generated in a region 328 in which the waveguides are formed and the bulk wave 8 propagates in a direction perpendicular to the first surface 329-1. Of these bulk waves, the bulk wave generated from the r point on the positive side of the x-axis is reflected by the second surface 329-2 at an angle $2\theta_1$ and returns to the region 328 again. Bulk waves incident on the region 328 almost cancel each other in accordance with condition (22). Similarly, a bulk wave generated from the r point on the negative side of the x-axis is reflected at an angle $2\theta_2$ by the inclined surface 329-3 and returns to the region 328. These bulk waves almost cancel each other from condition (23). Therefore, a convolution output signal can be extracted at a high S/N ratio as in the twenty-third embodiment. In this embodiment, even if the length of the output electrode is kept unchanged, the inclination angle which satisfies conditions (22) and (23) can be made into ½, the thickness of the substrate can be further reduced.

In the twenty-fifth embodiment described above, the bent portion is formed at almost the central position (r point) of the output electrode. However, if conditions (22) and (23) are satisfied, the bent portion may be shifted from the center. The angles $\theta_1$ and $\theta_2$ of the two surfaces inclined with respect to the first surface may be the same or different.

In each of the twentieth to twenty-fifth embodiments described above, the second surface of the substrate is entirely inclined with respect to the first surface. However, the portion of the second surface which opposes the region of the first surface in which the output electrode or the waveguides are formed may be constituted by an inclined surface, and the remaining portion of the second surface may be formed parallel to the first surface. With this structure, the thickness of the substrate can be further reduced, as compared with the twentieth to twenty-fifth embodiments. In addition, since the substrate can be easily held, the substrate can be easily handled to form electrodes thereon, and an element is mounted in a communication system.

The coordinate axes in FIGS. 35 to 47 are determined for the illustrative convenience, and do not indicate crystalline axes and the like of the substrate.

Figure 49:
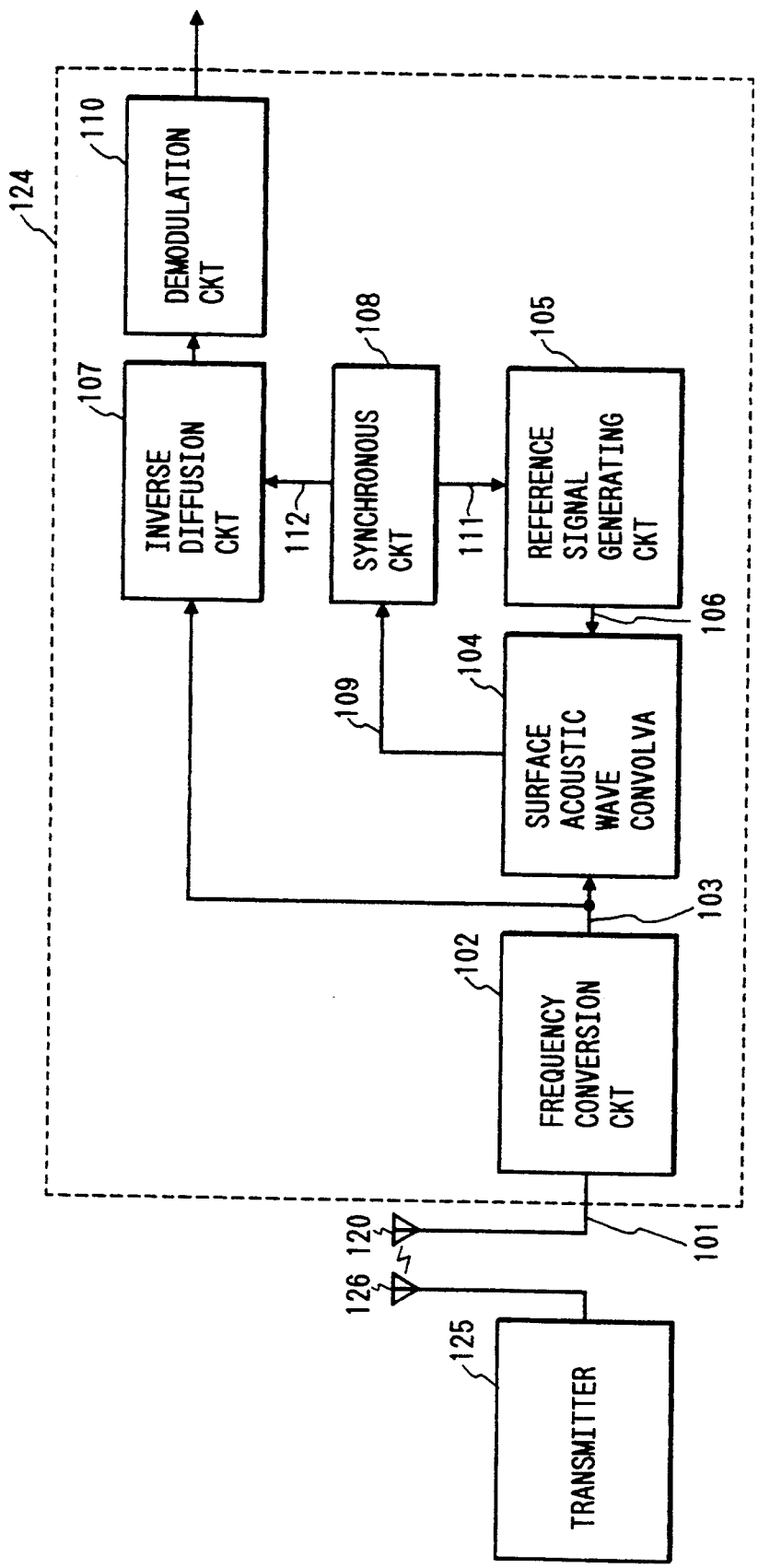
FIG. 49 is a block diagram showing an arrangement of a communication system using a surface acoustic wave element of the present invention.

FIG. 49 is a block diagram showing an arrangement of a communication system using the surface acoustic wave element as a convolver. Referring to FIG. 49, an transmitter 125 performs spectrum diffusion of a signal to be transmitted and transmits the resultant signal from an antenna 126. The transmitted signal is received by an antenna 120 of a receiver 124, and a received signal 101 is input to a frequency conversion circuit 102. An IF signal 103 obtained such that the frequency of the received signal 101 is converted into a frequency matching with the input frequency of the surface acoustic wave convolver as shown in FIGS. 3 to 48 is input to a convolver 104. The IF signal 103 is input to one input excitation electrode, e.g., the electrode 2 in FIG. 3, of the convolver.

A reference signal 106 output from a reference signal generating circuit 105 is input to the other input excitation electrode, e.g., the electrode 3 in FIG. 3 of the surface acoustic wave convolver 104. The convolver 104 performs a convolution calculation (correlation calculation) between the IF signal 103 and the reference signal 106. An output signal (convolution signal) 109 is output from an output transducer, e.g., the output electrode 4 in FIG. 3.

This output signal is input to a synchronous circuit 108. The synchronous circuit 108 generates synchronous signals 111 and 112 from the output signal 109 from the surface acoustic wave convolver 104. These synchronous signals are input to an inverse diffusion circuit 107. The reference signal generating circuit 105 adjusts the timing of the reference signal 106 using the synchronous signal 111 and outputs the adjusted reference signal 106. By using the synchronous signal 112, the inverse diffusion circuit 107 restores the IF signal 103 as a signal prior to spectrum diffusion. This signal is converted into an information signal by a demodulation circuit 110. FIG. 50 shows an arrangement of the inverse diffusion circuit 107. This circuit includes a code generator 121 and a multiplier 123. The code generator 121 receives the synchronous signal 112 from the synchronous circuit 108. A timing-adjusted code 122 is output in synchronism with the synchronous signal 112. The multiplier 123 receives the IF signal 103 and the code 122 and outputs the product of the IF signal 103 and the code 122. At this time, if the timing of the IF signal 103 is matched with that of the code 122, the IF signal 103 is converted into a signal prior to the spectrum diffusion.

When the frequency of the received signal 101 is matched with the input frequency of the surface acoustic wave convolver 104, the frequency conversion circuit 102 can be omitted. The received signal 101 can be input to the surface acoustic wave convolver 104 through an amplifier and a filter. For the descriptive convenience, in FIG. 49, the amplifier and the filter are not illustrated. An amplifier and a filter may be connected to the input or output of each block, as needed. In this embodiment, the received signal is received by the antenna 120. However, the transmitter may be directly connected to the receiver through a wire system such as a cable without going through the antenna 120.

FIG. 51 is a block diagram showing the first modification of the receiver 124 in the communication system in FIG. 49. The same reference numerals as in FIG. 51 denote the same parts in FIG. 49, and a detailed description thereof will be omitted.

In this modification, a synchronous following circuit 113 is added in the communication system shown in FIG. 49. The IF signal 103 is also input to a synchronous following circuit 113. The synchronous signal 112 output from the synchronous circuit 108 is input to the synchronous following circuit 113. A synchronous signal 114 output from the synchronous following circuit 113 is input to the inverse diffusion circuit 107. This modification is different from the arrangement of FIG. 49 in the above respects. A tau-dither loop circuit or a delay lock loop circuit can be used as the synchronous following circuit. In this case, either circuit may be used as the synchronous following circuit.

The same effect and function as in FIG. 49 can be obtained in this modification. In the modification, synchronous following is performed after high-precision synchronization is further performed by the synchronous following circuit 113. Therefore, no synchronization shift tends to occur, and the error rate can be reduced.

Figure 52:
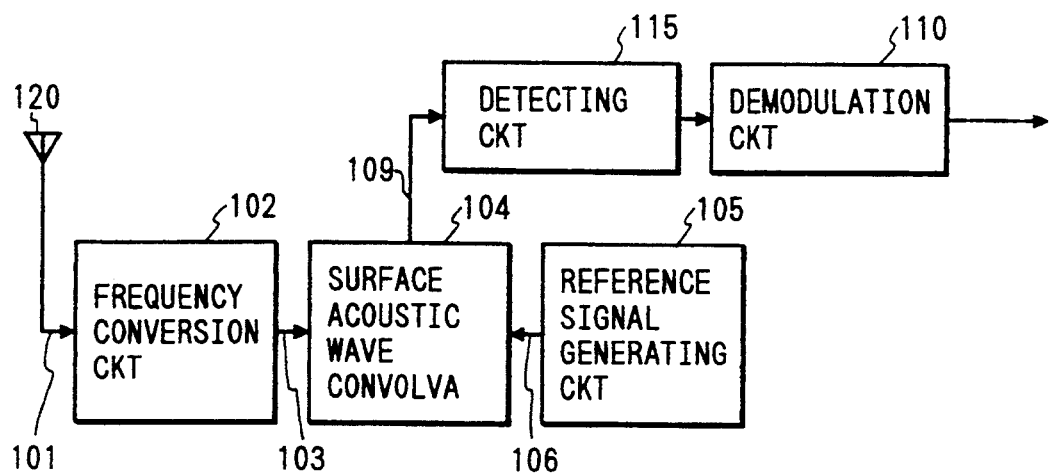
FIG. 52 is a block diagram showing another modification of the receiver shown in FIG. 49.

FIG. 52 is a block diagram showing the second modification of the receiver 124 in the communication system in FIG. 49. The same reference numerals as in FIG. 52 denote the same parts in FIG. 49, and a detailed description thereof will be omitted.

In this modification, an output from the surface acoustic wave convolver 104 is input to a detecting circuit 115, and demodulation is performed in accordance with an output from the detecting circuit 115. A synchronous detecting circuit, a delay detecting circuit, or an envelope detecting circuit can be used as the detecting circuit 115 and can be selectively used in accordance with a signal modulation scheme or the like adopted.

Assume that the received signal is a signal modulated by phase modulation, frequency modulation, or amplitude modulation. An output 109 from the surface acoustic wave convolver 104 reflects such modulation information. In particular, if a length $\underline{d}$ of the waveguide of the surface acoustic wave convolver 104 satisfies condition d=vT where T is the time per bit of the received signal 101 and $\underline{v}$ is the velocity of the surface acoustic wave, modulated information directly appears as the output 109. For example, a phase-modulated signal f(t) exp (jθ) is transmitted and is received as the received signal 101.

At this time, when a reference signal g(t) 106 is input to the surface acoustic wave element 104, its output 109 is given as follows:

$$f(t)\exp(j\theta)g(\tau-t)dt = \exp(j\theta)f(t)g(\tau-t)dt \qquad (24)$$

Thus, the phase modulation information appears. When the output 109 from the surface acoustic wave element 104 is input to the appropriate detecting circuit 115, the modulated signal can be demodulated.

Figure 53:
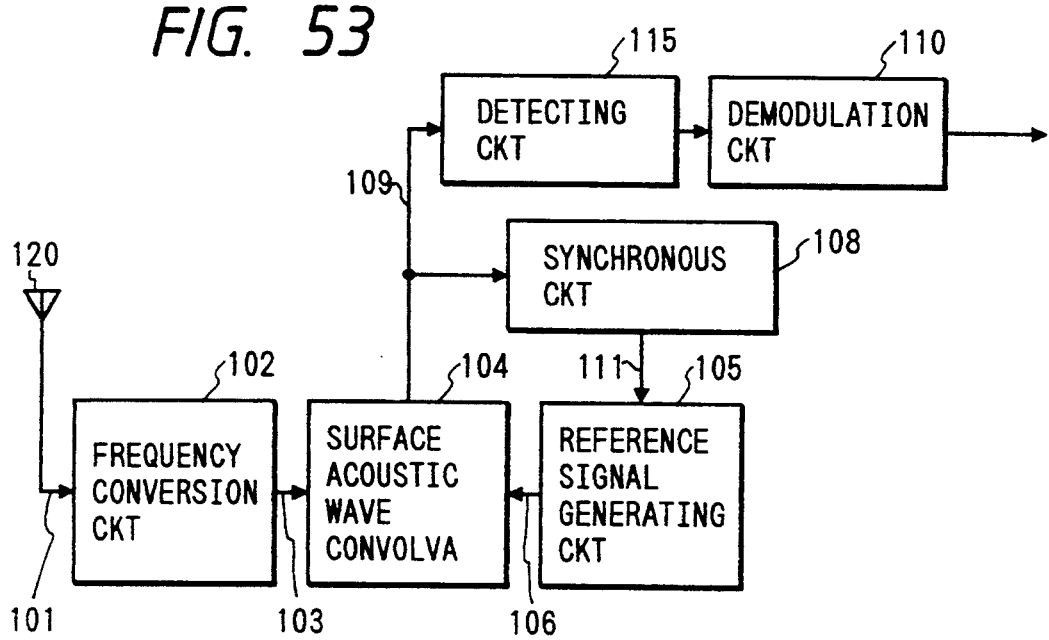
FIG. 53 is a block diagram showing still another modification of the receiver shown in FIG. 49.

FIG. 53 is a block diagram showing the third modification of the receiver 124 in the communication system shown in FIG. 49. The same reference numerals as in FIG. 52 denote the same parts in FIG. 53, and a detailed description thereof will be omitted.

In this modification, a synchronous circuit 108 is arranged, and the output 109 from the surface acoustic wave convolver 104 is also input to the synchronous circuit 108. A synchronous signal 111 is output from the synchronous circuit 108 and is input to the reference signal generating circuit 105. This modification is different from that of FIG. 52 in these respects.

The same effect and function as in the modification of FIG. 52 can be obtained in this modification. In the third modification, the synchronous circuit 108 is arranged, and the reference signal generating circuit 105 is controlled in accordance with the synchronous signal 111 output from the synchronous circuit 108, thereby facilitating phase locking.

The present invention is not limited to the particular embodiments described above. Various changes and modifications may be made within the spirit and scope of the invention.

For example, each comb input electrode (i.e., the input interdigital transducer) in each of the first to twenty-fifth embodiments is constituted by a double electrode (split electrode), so that reflection of the surface acoustic waves on such input electrodes (transducer) can be suppressed. Therefore, the characteristics of the elements can be further improved.

A substrate used in the present invention is not limited to a monocrystalline piezoelectric substrate as of lithium niobate. For example, a structure obtained by bonding a piezoelectric film on a semiconductor or glass substrate, or a material and structure which can have a parametric mixing effect may be used as the substrate of the present invention.

In each of the seventh to thirteenth embodiments and the twentieth to twenty-second embodiments, surface acoustic waves excited by the input electrodes are directly guided to the output electrode. However, a beam width compressor such as a horn type waveguide or a multistrip coupler may be arranged between the input electrodes and the output electrode.

In each of the fourteenth to nineteenth embodiments and the twenty-third to twenty-fifth embodiments, the output electrode is formed on one side of the surface acoustic waveguide. However, output electrodes may be formed on both sides of the waveguide. In this case, a convolution output twice the convolution output obtained from one output electrode can be obtained by synthesizing outputs from these two output electrodes.

What is claimed is:

1. A surface acoustic wave element comprising:
   a piezoelectric substrate having a first surface and a second surface opposing said first surface;
   a first input transducer, formed on said first surface of said substrate, for generating a first surface acoustic wave which propagates in a predetermined direction;
   a second input transducer, formed on said first surface of said substrate, for generating a second surface acoustic wave which propagates in a direction opposite to the predetermined direction; and
   output means, formed on said first surface of said substrate, for extracting a signal produced by an interaction of said first and second surface acoustic waves,
   wherein at least part of said second surface is inclined with respect to the first surface so that the thickness of the piezoelectric substrate is varied in a direction perpendicular to the predetermined direction, and
   wherein said at least part of said second surface comprises two surfaces having opposite inclinations along the direction perpendicular to the predetermined direction.

2. An element according to claim 1, wherein said output means comprises an output electrode formed on said first surface of said substrate.

3. A surface acoustic wave element comprising:
   a piezoelectric substrate having a first surface and a second surface opposing said first surface;
   a first input transducer, formed on said first surface to said substrate, for generating a first surface acoustic wave which propagates in a predetermined direction;
   a second input transducer, formed on said first surface of said substrate, for generating a second surface acoustic wave which propagates in a direction opposite to the predetermined direction; and
   output means, formed on said first surface of said substrate, for extracting a signal produced by an interaction of said first and second surface acoustic waves including an output electrode formed on said first surface of said substrate,
   wherein at least a part of said second surface is inclined with respect to the first surface so that the thickness of the piezoelectric substrate is varied in a direction perpendicular to the predetermined direction and
   wherein said inclined surface part is formed in a region of said second surface which opposes a region of said first surface on which said output electrode is formed, and a portion except for the inclined surface of said second surface is parallel to said first surface.

4. A surface acoustic wave element comprising:
   a piezoelectric substrate having a first surface and a second surface opposing said first surface;
   a first input transducer, formed on said first surface of said substrate, for generating a first surface acoustic wave which propagates in a predetermined direction;
   a second input transducer, formed on said first surface of said substrate, for generating a second surface acoustic wave which propagates in a direction opposite to the predetermined direction; and
   output means, formed on said first surface of said substrate, for extracting a signal produced by an interaction of said first and second surface acoustic waves including an output electrode formed on said first surface of said substrate,
   wherein at least part of said second surface is inclined with respect to the first surface so that the thickness of the piezoelectric substrate is varied in a direction perpendicular to the predetermined direction and
   wherein said part of said second surface which opposes a region of said first surface in which said output electrode is formed comprises two surfaces having opposite inclinations along the direction perpendicular to said predetermined direction, and a portion except for the two inclined surfaces of said second surface is parallel to said first surface.

5. An element according to claim 2, further comprising a horn waveguide, arranged between said first and second transducers and said output electrode, for reducing widths of the first and second surface acoustic waves.

6. A surface acoustic wave element comprising:
   a piezoelectric substrate having a first surface and a second surface opposing said first surface;
   a first input transducer, formed on said first surface of said substrate, for generating a first surface acoustic wave which propagates in a predetermined direction;

a second input transducer, formed on said first surface of said substrate, for generating a second surface acoustic wave which propagates in a direction opposite to the predetermined direction; and output means, formed on said first surface of said substrate, for extracting a signal produced by an interaction of said first and second surface acoustic waves, wherein at least part of said second surface of said substrate comprises two surfaces inclined in opposite directions along the predetermined direction with respect to said first surface.

7. An element according to claim 6, wherein said two inclined surfaces are formed so that a distance between said first and second surfaces is increased away from a central portion between said first and second input transducers as a boundary.

8. An element according to claim 6, wherein said two inclined surfaces are formed so that a distance between said first and second surfaces becomes small away from a central portion between said first and second transducers as a boundary.

9. An element according to claim 6, wherein said output means comprises an output electrode formed on said first surface of said substrate.

10. An element according to claim 9, wherein said two inclined surfaces are formed in part of said second surface which opposes a region of said first surface on which said output electrode is formed, and a portion except for said two inclined surfaces of said second surface is parallel to said first surface.

11. A surface acoustic wave element comprising:

a piezoelectric substrate having a first surface and a second surface opposing said first surface;

a first input transducer, formed on said first surface of said substrate, for generating a first surface acoustic wave;

a second input transducer, formed on said first surface of said substrate, for generating a second surface acoustic wave; and an output electrode, formed on said first surface of said substrate, for extracting a signal produced by an interaction of said first and second surface acoustic waves, wherein at least part of said second surface of said substrate comprises a surface inclined along the predetermined direction with respect to said first surface, and the following condition is satisfied:

$$\tan 2\theta \geq L/d$$

where $\theta$ is an inclination angle of said inclined surface, $d$ is a thickness of said substrate at a given position where the thickness of said substrate from said first surface to said second surface is smallest, and L is a length of said output electrode from the given position along the predetermined direction.

12. An element according to claim 11, wherein said at least part of said second surface of said substrate is inclined in a direction parallel to a propagation direction of the first and second surface acoustic waves.

13. An element according to claim 11, wherein said at least part of said second surface of said substrate is inclined in a direction perpendicular to a propagation direction of the first and second surface acoustic waves.

14. An element according to claim 11, wherein said at least part of said second surface of said substrate comprises two surfaces having opposite inclinations.

15. A surface acoustic wave element comprising:

a piezoelectric substrate having a first surface and a second surface opposing said first surface;

a first input transducer, formed on said first surface of said substrate, for generating a first surface acoustic wave;

a second input transducer, formed on said first surface of said substrate, for generating a second surface acoustic wave; and a plurality of waveguides, formed on said first surface of said substrate, for generating a third surface acoustic wave by an interaction of said first and second surface acoustic waves, wherein at least part of said second surface of said substrate comprises a surface inclined along the predetermined direction with respect to said first surface, and the following condition is satisfied:

$$\tan 2\theta \geq L/d$$

where $\theta$ is an inclination angle of said inclined surface, $d$ is a thickness of said substrate at a given position where the thickness of said substrate from said first surface to said second surface is smallest, and L is a length of a region of said waveguides on said first surface from the given position along the predetermined direction.

16. An element according to claim 15, wherein said at least part of said second surface of said substrate is inclined in a direction parallel to a propagation direction of the first and second surface acoustic waves.

17. An element according to claim 15, wherein said at least part of said second surface of said substrate is inclined in a direction perpendicular to a propagation direction of the first and second surface acoustic waves.

18. An element according to claim 15, wherein said at least part of said second surface of said substrate comprises two surfaces having opposite inclinations.

19. A surface acoustic wave element comprising:

a piezoelectric substrate having a first surface and a second surface opposing said first surface;

a first input transducer, formed on said first surface of said substrate, for generating a first surface acoustic wave;

a second input transducer, formed on said first surface of said substrate, for generating a second surface acoustic wave;

a plurality of waveguides, formed on said first surface of said substrate, for generating a third surface acoustic wave by an interaction of said first and second surface acoustic waves; and an output transducer, formed on said first surface of said substrate, for converting said third surface acoustic wave into an electrical signal and extracting the electrical signal, wherein at least part of said second surface of said substrate comprises a surface inclined along the predetermined direction with respect to said first surface, and the following condition is satisfied:

$$\tan 2\theta \geq L/d$$

where $\theta$ is an inclination angle of said inclined surface, $d$ is a thickness of said substrate at a given position where the thickness of said substrate from said first surface to said second surface is smallest, and L is a length of a region of said waveguides and said output transducer on said first surface from the given position along the predetermined direction.

20. An element according to claim 19, wherein said at least part of said second surface of said substrate is inclined in a propagation direction of the third surface acoustic wave with respect to said first surface.

21. A surface acoustic wave element comprising:
a piezoelectric substrate having a first surface and a second surface opposing said first surface;
a first input transducer, formed on said first surface of said substrate, for generating a first surface acoustic wave;
a second input transducer, formed on said first surface of said substrate, for generating a second surface acoustic wave; and
an output electrode, formed on said first surface of said substrate, for generating a third surface acoustic wave by an interaction of said first and second surface acoustic waves,
wherein at least part of said second surface of said substrate comprises a surface inclined along the predetermined direction with respect to said first surface, and the following condition is satisfied:

$$L \geq 3\lambda_B/\sin 2\theta$$

where $\theta$ is an inclination angle of said inclined surface, L is a length of a region of said output electrode along the predetermined direction, and $\lambda_B$ is a wavelength of a bulk wave generated by an interaction of said first and second surface acoustic waves.

22. An element according to claim 21, wherein said at least part of said second surface of said substrate is inclined in a direction parallel to a propagation direction of the first and second surface acoustic waves.

23. An element according to claim 21, wherein said at least part of said second surface of said substrate is inclined in a direction perpendicular to a propagation direction of the first and second surface acoustic waves.

24. An element according to claim 21, wherein said at least part of said second surface of said substrate comprises two surfaces having opposite inclinations.

25. A surface acoustic wave element comprising:
a piezoelectric substrate having a first surface and a second surface opposing said first surface;
a first input transducer, formed on said first surface of said substrate, for generating a first surface acoustic wave;
a second input transducer, formed on said first surface of said substrate, for generating a second surface acoustic wave; and
a plurality of waveguides, formed on said first surface of said substrate, for generating a third surface acoustic wave by an interaction of said first and second surface acoustic waves,
wherein at least part of said second surface of said substrate comprises a surface inclined along the predetermined direction with respect to said first surface, and the following condition is satisfied:

$$L \geq 3\lambda_B/\sin 2\theta$$

where $\theta$ is an inclination angle of said inclined surface, L is a length of a region of said waveguides on said first surface along the predetermined direction, and $\lambda_B$ is a wavelength of a bulk wave generated by an interaction of said first and second surface acoustic waves.

26. An element according to claim 25, wherein said at least part of said second surface of said substrate is inclined in a direction parallel to a propagation direction of the first and second surface acoustic waves.

27. An element according to claim 25, wherein said at least part of said second surface of said substrate is inclined in a direction perpendicular to a propagation direction of the first and second surface acoustic waves.

28. An element according to claim 25, wherein said at least part of said second surface of said substrate comprises two surfaces having opposite inclinations.

29. An element according to claim 25, further comprising an output transducer, formed on said first surface of said substrate, for converting the third surface acoustic wave into an electrical signal and extracting the electrical signal.

30. A signal receiver comprising:
(a) a circuit for receiving a signal transmitted from a transmitter;
(b) a surface acoustic wave element for outputting a convolution signal of the received signal and a reference signal;
(c) a circuit for generating the reference signal; and
(d) a circuit for demodulating the received signal by using the convolution signal,
said surface acoustic wave element comprising:
a piezoelectric substrate having a first surface and a second surface opposing said first surface;
a first input transducer, formed on said first surface of said substrate, for generating a first surface acoustic wave which corresponds to a signal received by said receiving circuit and propagates in a predetermined direction;
a second input transducer, formed on said first surface of said substrate, for generating a second surface acoustic wave which corresponds to the reference signal and propagates in a direction opposite to the predetermined direction; and
output means, formed on said first surface of said substrate, for extracting a convolution signal generated by an interaction between the first and second surface acoustic waves,
wherein at least part of said second surface is inclined with respect to the first surface so that the thickness of the piezoelectric substrate is varied along a direction perpendicular to the predetermined direction and
wherein said at least part of said second surface comprises two surfaces having opposite inclinations along the direction perpendicular to the predetermined direction.

31. A receiver according to claim 30, wherein said output means comprises an output electrode formed on said first surface of said substrate.

32. A signal receiver comprising:
(a) a circuit for receiving a signal transmitted from a transmitter;
(b) a surface acoustic wave element for outputting a convolution signal of the received signal and a reference signal;
(c) a circuit for generating the reference signal; and
(d) a circuit for demodulating the received signal by using the convolution signal,
said surface acoustic wave element comprising:
a piezoelectric substrate having a first surface and a second surface opposing said first surface;

a first input transducer, formed on said first surface of said substrate, for generating a first surface acoustic wave which corresponds to a signal received by said receiving circuit and propagates in a predetermined direction;

a second input transducer, formed on said first surface of said substrate, for generating a second surface acoustic wave which corresponds to the reference signal and propagates in a direction opposite to the predetermined direction; and output means, formed on said first surface of said substrate, for extracting a convolution signal generated by an interaction between the first and second surface acoustic waves including an output electrode formed on said first surface of said substrate, wherein at least part of said second surface is inclined with respect to the first surface so that the thickness of the piezoelectric substrate is varied along a direction perpendicular to the predetermined direction, and wherein said inclined surface part is formed on a region of said second surface which opposes a region of said first surface on which said output electrode is formed, and a portion except for said inclined surface part of said second surface is parallel to said first surface.

33. A signal receiver comprising:
(a) a circuit for receiving a signal transmitted from a transmitter;
(b) a surface acoustic wave element for outputting a convolution signal of the received signal and a reference signal;
(c) a circuit for generating the reference signal; and
(d) a circuit for demodulating the received signal by using the convolution signal, said surface acoustic wave element comprising:
a piezoelectric substrate having a first surface and a second surface opposing said first surface;
a first input transducer, formed on said first surface of said substrate, for generating a first surface acoustic wave which corresponds to a signal received by said receiving circuit and propagates in a predetermined direction;

a second input transducer, formed on said first surface of said substrate, for generating a second surface acoustic wave which corresponds to the reference signal and propagates in a direction opposite to the predetermined direction; and output means, formed on said first surface of said substrate, for extracting a convolution signal generated by an interaction between the first and second surface acoustic waves including an output electrode formed on said first surface of said substrate, wherein at least part of said second surface is inclined with respect to the first surface so that the thickness of the piezoelectric substrate is varied along a direction perpendicular to the predetermined direction, and wherein said part of said second surface which opposes a region of said first surface on which said output electrode is formed comprises two surfaces having opposite inclinations along the direction perpendicular to the predetermined direction, and a portion except for said two inclined surfaces of said second surface is parallel to said first surface.

34. A signal receiver comprising:
(a) a circuit for receiving a signal transmitted from a transmitter;
(b) a surface acoustic wave element for outputting a convolution signal of the received signal and a reference signal;
(c) a circuit for generating the reference signal; and
(d) a circuit for demodulating the received signal by using the convolution signal, said surface acoustic wave element comprising:
a piezoelectric substrate having a first surface and a second surface opposing said first surface;
a first input transducer, formed on said first surface of said substrate, for generating a first surface acoustic wave which corresponds to a signal received by said receiving circuit and propagates in a predetermined direction;

a second input transducer, formed on said first surface of said substrate, for generating a second surface acoustic wave which corresponds to the reference signal and propagates in a direction opposite to the predetermined direction; and output means, formed on said first surface of said substrate, for extracting a convolution signal generated by an interaction between the first and second surface acoustic waves including an output electrode formed on said first surface of said substrate, wherein at least part of said second surface is inclined with respect to the first surface so that the thickness of the piezoelectric substrate is varied along a direction perpendicular to the predetermined direction, and said receiver further comprises a horn waveguide, arranged between said first and second transducers and said output electrode, for reducing widths of the first and second surface acoustic wave.

35. A receiver according to claim 30, further comprising a detecting circuit for receiving the convolution signal extracted from said output means and outputting a detected signal to a demodulation circuit.

36. A receiver according to claim 35, further comprising a synchronous circuit for outputting a synchronous signal generated from the convolution signal to a reference signal generating circuit.

37. A receiver according to claim 30, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

38. A signal receiver comprising:
(a) a circuit for receiving a signal transmitted from a transmitter;
(b) a surface acoustic wave element for outputting a convolution signal of the received signal and a reference signal;
(c) a circuit for generating the reference signal; and
(d) a circuit for demodulating the received signal by using the convolution signal, said surface acoustic wave element comprising:
a piezoelectric substrate having a first surface and a second surface opposing said first surface;
a first input transducer, formed on said first surface of said substrate, for generating a first surface acoustic wave which correspondes to a signal received by said receiving circuit and propagates a predetermined direction;

a second input transducer, formed on said first surface of said substrate, for generating a second surface acoustic wave which corresponds to the reference signal and propagates in a direction opposite to the predetermined direction; and output means, formed on said first surface of said substrate, for extracting a convolution signal generated by an interaction between the first and second surface acoustic waves, wherein at least part of said second surface of said substrate comprises two surfaces having opposite inclinations along the predetermined direction with respect to said first surface.

39. A receiver according to claim 38, wherein said two inclined surfaces are formed so that a distance between said first and second surfaces is increased away from a central portion between said first and second input transducers as a boundary.

40. A receiver according to claim 38, wherein said two inclined surfaces are formed so that a distance between said first and second surfaces becomes small away from a central portion between said first and second transducers as a boundary.

41. A receiver according to claim 38, wherein said output means comprises an output electrode formed on said first surface of said substrate.

42. A receiver according to claim 41, wherein said two inclined surfaces are formed in part of said second surface which opposes a region of said first surface on which said output electrode is formed, and a portion except for said two inclined surfaces of said second surface is parallel to said first surface.

43. A receiver according to claim 38, further comprising a detecting circuit for receiving the convolution signal extracted from said output means and outputting a detected signal to a demodulation circuit.

44. A receiver according to claim 43, further comprising a synchronous circuit for outputting a synchronous signal generated from the convolution signal to a reference signal generating circuit.

45. A receiver according to claim 38, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

46. A signal receiver comprising:
(a) a circuit for receiving a signal transmitted from a transmitter;
(b) a surface acoustic wave element for outputting a convolution signal of the received signal and a reference signal;
(c) a circuit for generating the reference signal; and
(d) a circuit for demodulating the received signal by using the convolution signal,
said surface acoustic wave element comprising:
a piezoelectric substrate having a first surface and a second surface opposing said first surface;
a first input transducer, formed on said first surface of said substrate, for generating a first surface acoustic wave which corresponds to a signal received by said receiving circuit and propagates a predetermined direction;
a second input transducer, formed on said first surface of said substrate, for generating a second surface acoustic wave which corresponds to the reference signal and propagates in a direction opposite to the predetermined direction; and an output electrode, formed on said first surface of said substrate, for extracting a convolution signal generated by an interaction between the first and second surface acoustic waves, wherein at least part of said second surface of said substrate comprises a surface inclined along the predetermined direction with respect to said first surface, and the following condition is satisfied:

$$\tan 2\theta \geq L/d$$

where $\theta$ is an inclination angle of said inclined surface, $\underline{d}$ is a thickness of said substrate at a given position where the thickness of said substrate from said first surface to said second surface is smallest, and L is a length of said output electrode from the given position along the predetermined direction.

47. A receiver according to claim 46, wherein said at least part of said second surface of said substrate is inclined in a direction parallel to a propagation direction of the first and second surface acoustic waves.

48. A receiver according to claim 46, wherein said at least part of said second surface of said substrate is inclined in a direction perpendicular to a propagation direction of the first and second surface acoustic waves.

49. A receiver according to claim 46, wherein said at least part of said second surface of said substrate comprises two surfaces having opposite inclinations.

50. A receiver according to claim 46, further comprising a detecting circuit for receiving the convolution signal extracted from said output means and outputting a detected signal to a demodulation circuit.

51. A receiver according to claim 50, further comprising a synchronous circuit for outputting a synchronous signal generated from the convolution signal to a reference signal generating circuit.

52. A receiver according to claim 46, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

53. A signal receiver comprising:
(a) a circuit for receiving a signal transmitted from a transmitter;
(b) a surface acoustic wave element for outputting a convolution signal of the received signal and a reference signal;
(c) a circuit for generating the reference signal; and
(d) a circuit for demodulating the received signal by using the convolution signal,
said surface acoustic wave element comprising:
a piezoelectric substrate having a first surface and a second surface opposing said first surface;
a first input transducer, formed on said first surface of said substrate, for generating a first surface acoustic wave which corresponds to a signal received by said receiving circuit and propagates a predetermined direction;
a second input transducer, formed on said first surface of said substrate, for generating a second surface acoustic wave which corresponds to the reference signal and propagates in a direction opposite to the predetermined direction;

a plurality of waveguides, formed on said first surface of said substrate, for generating a third surface acoustic wave corresponding to the convolution signal in accordance with an interaction between the first and second surface acoustic waves; and an output transducer, formed on said first surface of said substrate, for converting the third surface acoustic wave into an electrical signal and extracting the electrical signal, wherein at least part of said second surface of said substrate comprises a surface inclined along the predetermined direction with respect to said first surface, and the following condition is satisfied:

$$\tan 2\theta \geq L/d$$

where $\theta$ is an inclination angle of said inclined surface, $d$ is a thickness of said substrate at a given position where the thickness of said substrate from said first surface to said second surface is smallest, and L is a length of a region of said waveguides and output transducer on said first surface from the position along the predetermined direction.

54. A receiver according to claim 53, wherein said at least part of said second surface of said substrate is inclined in a propagation direction of the third surface acoustic wave with respect to said first surface.

55. A receiver according to claim 53, further comprising a detecting circuit for receiving the convolution signal extracted from said output means and outputting a detected signal to a demodulation circuit.

56. A receiver according to claim 54, further comprising a synchronous circuit for outputting a synchronous signal generated from the convolution signal to a reference signal generating circuit.

57. A receiver according to claim 53, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

58. A signal receiver comprising:
(a) a circuit for receiving a signal transmitted from a transmitter;
(b) a surface acoustic wave element for outputting a convolution signal of the received signal and a reference signal;
(c) a circuit for generating the reference signal; and
(d) a circuit for demodulating the received signal by using the convolution signal, said surface acoustic wave element comprising:
a piezoelectric substrate having a first surface and a second surface opposing said first surface;
a first input transducer, formed on said first surface of said substrate, for generating a first surface acoustic wave which corresponds to a signal received by said receiving circuit and propagates a predetermined direction;
a second input transducer, formed on said first surface of said substrate, for generating a second surface acoustic wave which corresponds to the reference signal and propagates in a direction opposite to the predetermined direction; and an output electrode, formed on said first surface of said substrate, for extracting a convolution signal generated by an interaction between the first and second surface acoustic waves, wherein at least part of said second surface of said substrate comprises a surface inclined along the predetermined direction with respect to said first surface, and the following condition is satisfied:

$$L \geq 3\lambda_B/\sin 2\theta$$

where $\theta$ is an inclination angle of said inclined surface, L is a length of a region of said output electrode along the predetermined direction, and $\lambda_B$ is a wavelength of a bulk wave generated by an interaction of said first and second surface acoustic waves.

59. A receiver according to claim 58, wherein said at least part of said second surface of said substrate is inclined in a direction parallel to a propagation direction of the first and second surface acoustic waves.

60. A receiver according to claim 58, wherein said at least part of said second surface of said substrate is inclined in a direction perpendicular to a propagation direction of the first and second surface acoustic waves.

61. A receiver according to claim 58, wherein said at least part of said second surface of said substrate comprises two surfaces having opposite inclinations.

62. A receiver according to claim 58, further comprising a detecting circuit for receiving the convolution signal extracted from said output means and outputting a detected signal to a demodulation circuit.

63. A receiver according to claim 61, further comprising a synchronous circuit for outputting a synchronous signal generated from the convolution signal to a reference signal generating circuit.

64. A receiver according to claim 58, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

65. A signal receiver comprising:
(a) a circuit for receiving a signal transmitted from a transmitter;
(b) a surface acoustic wave element for outputting a convolution signal of the received signal and a reference signal;
(c) a circuit for generating the reference signal; and
(d) a circuit for demodulating the received signal by using the convolution signal, said surface acoustic wave element comprising:
a piezoelectric substrate having a first surface and a second surface opposing said first surface;
a first input transducer, formed on said first surface of said substrate, for generating a first surface acoustic wave which corresponds to a signal received by said receiving circuit and propagates a predetermined direction;
a second input transducer, formed on said first surface of said substrate, for generating a second surface acoustic wave which corresponds to the reference signal and propagates in a direction opposite to the predetermined direction;
a plurality of waveguides, formed on said first surface of said substrate, for generating a third surface acoustic wave corresponding to the convolution signal in accordance with an interaction between the first and second surface acoustic waves; and an output transducer, formed on said first surface of said substrate, for converting the third surface acoustic wave into an electrical signal and extracting the electrical signal, wherein at least part of said second surface of said substrate comprises a surface inclined along the predetermined direction with respect to said first surface, and the following condition is satisfied:

$$L \geq 3\lambda_B/\sin 2\theta$$

where $\theta$ is an inclination angle of said inclined surface, L is a length of a region of said waveguides on said first surface along the predetermined direction, and $\lambda_B$ is a wavelength of a bulk wave generated by an interaction of said first and second surface acoustic waves.

66. A receiver according to claim 65, wherein said at least part of said second surface of said substrate is inclined in a direction parallel to a propagation direction of the first and second surface acoustic waves.

67. A receiver according to claim 65, wherein said at least part of said second surface of said substrate is inclined in a direction perpendicular to a propagation direction of the first and second surface acoustic waves.

68. A receiver according to claim 65, wherein said at least part of said second surface of said substrate comprises two surfaces having opposite inclinations.

69. A receiver according to claim 65, further comprising a detecting circuit for receiving the convolution signal extracted from said output means and outputting a detected signal to a demodulation circuit.

70. A receiver according to claim 69, further comprising a synchronous circuit for outputting a synchronous signal generated from the convolution signal to a reference signal generating circuit.

71. A receiver according to claim 65, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

72. A communication system comprising:
(a) a transmitter for transmitting a signal modulated with information;
(b) a circuit for receiving a signal transmitted from said transmitter;
(c) a surface acoustic wave element for outputting a convolution signal of the received signal and a reference signal;
(d) a circuit for generating the reference signal; and
(e) a circuit for demodulating the received signal by using the convolution signal,
said surface acoustic wave element comprising:
a piezoelectric substrate having a first surface and a second surface opposing said first surface;
a first input transducer, formed on said first surface of said substrate, for generating a first surface acoustic wave which corresponds to a signal received by said receiving circuit and propagates in a predetermined direction;
a second input transducer, formed on said first surface of said substrate, for generating a second surface acoustic wave which corresponds to the reference signal and propagates in a direction opposite to the predetermined direction; and output means, formed on said first surface of said substrate, for extracting a convolution signal generated by an interaction between the first and second surface acoustic waves;

wherein at least part of said second surface is inclined with respect to the first surface so that the thickness of the piezoelectric substrate is varied along a direction perpendicular to the predetermined direction, and wherein said at least part of said second surface comprises two surfaces having opposite inclinations along the direction perpendicular to the predetermined direction.

73. A system according to claim 72, wherein said output means comprises an output electrode formed on said first surface of said substrate.

74. A communication system comprising:
(a) a transmitter for transmitting a signal modulated with information;
(b) a circuit for receiving a signal transmitted from said transmitter;
(c) a surface acoustic wave element for outputting a convolution signal of the received signal and a reference signal;
(d) a circuit for generating the reference signal; and
(e) a circuit for demodulating the received signal by using the convolution signal,
said surface acoustic wave element comprising:
a piezoelectric substrate having a first surface and a second surface opposing said first surface;
a first input transducer, formed on said first surface of said substrate, for generating a first surface acoustic wave which corresponds to a signal received by said receiving circuit and propagates in a predetermined direction;
a second input transducer, formed on said first surface of said substrate, for generating a second surface acoustic wave which corresponds to the reference signal and propagates in a direction opposite to the predetermined direction; and output means, formed on said first surface of said substrate, for extracting a convolution signal generated by an interaction between the first and second surface acoustic waves including an output electrode formed on said first surface of said substrate, wherein at least part of said second surface is inclined with respect to the first surface so that the thickness of the piezoelectric substrate is varied along a direction perpendicular to the predetermined direction, and wherein said inclined surface part is formed on a region of said second surface which opposes a region of said first surface on which said output electrode is formed, and a portion except for said inclined surface part of said second surface is parallel to said first surface.

75. A communication system comprising:
(a) a transmitter for transmitting a signal modulated with information;
(b) a circuit for receiving a signal transmitted from said transmitter;
(c) a surface acoustic wave element for outputting a convolution signal of the received signal and a reference signal;
(d) a circuit for generating the reference signal; and (e) a circuit for demodulating the received signal by using the convolution signal, said surface acoustic wave element comprising:

a piezoelectric substrate having a first surface and a second surface opposing said first surface;

a first input transducer, formed on said first surface of said substrate, for generating a first surface acoustic wave which corresponds to a signal received by said receiving circuit and propagates in a predetermined direction;

a second input transducer, formed on said first surface of said substrate, for generating a second surface acoustic wave which corresponds to the reference signal and propagates in a direction opposite to the predetermined direction; and output means, formed on said first surface of said substrate, for extracting a convolution signal generated by an interaction between the first and second surface acoustic waves including an output electrode formed on said first surface of said substrate, wherein at least part of said second surface is inclined with respect to the first surface so that the thickness of the piezoelectric substrate is varied along a direction perpendicular to the predetermined direction, and wherein said part of said second surface which opposes a region of said first surface on which said output electrode is formed comprises two surfaces having opposite inclination along the direction perpendicular to the predetermined direction, and a portion except for said two inclined surfaces of said second surface is parallel to said first surface.

76. A system according to claim 73, further comprising a horn waveguide, arranged between said first and second transducers and said output electrode, for reducing widths of the first and second surface acoustic waves.

77. A system according to claim 72, further comprising a detecting circuit for receiving the convolution signal extracted from said output means and outputting a detected signal to a demodulation circuit.

78. A system according to claim 77, further comprising a synchronous circuit for outputting a synchronous signal generated from the convolution signal to a reference signal generating circuit.

79. A system according to claim 72, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

80. A communication system comprising:
(a) a transmitter for transmitting a signal modulated with information;
(b) a circuit for receiving a signal transmitted from said transmitter;
(c) a surface acoustic wave element for outputting a convolution signal of the received signal and a reference signal;
(d) a circuit for generating the reference signal; and
(e) a circuit for demodulating the received signal by using the convolution signal, said surface acoustic wave element comprising:

a piezoelectric substrate having a first surface and a second surface opposing said first surface;

a first input transducer, formed on said first surface of said substrate, for generating a first surface acoustic wave which corresponds to a signal received by said receiving circuit and propagates a predetermined direction;

a second input transducer, formed on said first surface of said substrate, for generating a second surface acoustic wave which corresponds to the reference signal and propagates in a direction opposite to the predetermined direction; and output means, formed on said first surface of said substrate, for extracting a convolution signal generated by an interaction between the first and second surface acoustic waves, wherein at least part of said second surface of said substrate comprises two surfaces having opposite inclinations along the predetermined direction with respect to said first surface.

81. A system according to claim 80, wherein said two inclined surfaces are formed so that a distance between said first and second surfaces is increased away from a central portion between said first and second input transducers as a boundary.

82. A system according to claim 80, wherein said two inclined surfaces are formed so that a distance between said first and second surfaces becomes small away from a central portion between said first and second transducers as a boundary.

83. A system according to claim 80, wherein said output means comprises an output electrode formed on said first surface of said substrate.

84. A system according to claim 83, wherein said two inclined surfaces are formed in part of said second surface which opposes a region of said first surface on which said output electrode is formed, and a portion except for said two inclined surfaces of said second surface is parallel to said first surface.

85. A system according to claim 80, further comprising a detecting circuit for receiving the convolution signal extracted from said output means and outputting a detected signal to a demodulation circuit.

86. A system according to claim 85, further comprising a synchronous circuit for outputting a synchronous signal generated from the convolution signal to a reference signal generating circuit.

87. A system according to claim 80, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

88. A communication system comprising:
(a) a transmitter for transmitting a signal modulated with information;
(b) a circuit for receiving a signal transmitted from said transmitter;
(c) a surface acoustic wave element for outputting a convolution signal of the received signal and a reference signal;
(d) a circuit for generating the reference signal; and
(e) a circuit for demodulating the received signal by using the convolution signal, said surface acoustic wave element comprising:

a piezoelectric substrate having a first surface and a second surface opposing said first surface;

a first input transducer, formed on said first surface of said substrate, for generating a first surface acoustic wave which corresponds to a signal received by said receiving circuit and propagates a predetermined direction;

a second input transducer, formed on said first surface of said substrate, for generating a second surface acoustic wave which corresponds to the reference signal and propagates in a direction opposite to the predetermined direction; and an output electrode, formed on said first surface of said substrate, for extracting the convolution signal generated by an interaction between the first and second surface acoustic waves, wherein at least part of said second surface of said substrate comprises a surface inclined along the predetermined direction with respect to said first surface, and the following condition is satisfied:

$$\tan 2\theta \geq L/d$$

where $\theta$ is an inclination angle of said inclined surface, $d$ is a thickness of said substrate at a given position where the thickness of said substrate from said first surface to said second surface is smallest, and $L$ is a length of said output electrode from the given position along the predetermined direction.

89. A system according to claim 88, wherein said at least part of said second surface of said substrate is inclined in a direction parallel to a propagation direction of the first and second surface acoustic waves.

90. A system according to claim 88, wherein said at least part of said second surface of said substrate is inclined in a direction perpendicular to a propagation direction of the first and second surface acoustic waves.

91. A system according to claim 88, wherein said at least part of said second surface of said substrate comprises two surfaces having opposite inclinations.

92. A system according to claim 88, further comprising a detecting circuit for receiving the convolution signal extracted from said output means and outputting a detected signal to a demodulation circuit.

93. A system according to claim 92, further comprising a synchronous circuit for outputting a synchronous signal generated from the convolution signal to a reference signal generating circuit.

94. A system according to claim 88, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

95. A communication system comprising:
(a) a transmitter for transmitting a signal modulated with information;
(b) a circuit for receiving a signal transmitted from said transmitter;
(c) a surface acoustic wave element for outputting a convolution signal of the received signal and a reference signal;
(d) a circuit for generating the reference signal; and
(e) a circuit for demodulating the received signal by using the convolution signal,
said surface acoustic wave element comprising:

a piezoelectric substrate having a first surface and a second surface opposing said first surface;

a first input transducer, formed on said first surface of said substrate, for generating a first surface acoustic wave which corresponds to a signal received by said receiving circuit and propagates a predetermined direction;

a second input transducer, formed on said first surface of said substrate, for generating a second surface acoustic wave which corresponds to the reference signal and propagates in a direction opposite to the predetermined direction;

a plurality of waveguides, formed on said first surface of said substrate, for generating a third surface acoustic wave corresponding to the convolution signal in accordance with an interaction between the first and second surface acoustic waves; and an output transducer, formed on said first surface of said substrate, for converting the third surface acoustic wave into an electrical signal and extracting the electrical signal, wherein at least part of said second surface of said substrate comprises a surface inclined along the predetermined direction with respect to said first surface, and the following condition is satisfied:

$$\tan 2\theta \geq L/d$$

where $\theta$ is an inclination angle of said inclined surface, $d$ is a thickness of said substrate at a given position where the thickness of said substrate from said first surface to said second surface is smallest, and $L$ is a length of a region of said waveguides on said first surface from the given position along the predetermined direction.

96. A system according to claim 95, wherein said at least part of said second surface of said substrate is inclined in a propagation direction of the third surface acoustic wave with respect to said first surface.

97. A system according to claim 95, further comprising a detecting circuit for receiving the convolution signal extracted from said output means and outputting a detected signal to a demodulation circuit.

98. A system according to claim 97, further comprising a synchronous circuit for outputting a synchronous signal generated from the convolution signal to a reference signal generating circuit.

99. A system according to claim 95, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

100. A communication system comprising:
(a) a transmitter for transmitting a signal modulated with information;
(b) a circuit for receiving a signal transmitted from said transmitter;
(c) a surface acoustic wave element for outputting a convolution signal of the received signal and a reference signal;
(d) a circuit for generating the reference signal; and
(e) a circuit for demodulating the received signal by using the convolution signal,
said surface acoustic wave element comprising:

a piezoelectric substrate having a first surface and a second surface opposing said first surface;

a first input transducer, formed on said first surface of said substrate, for generating a first surface acoustic wave which corresponds to a signal received by said receiving circuit and propagates a predetermined direction;

a second input transducer, formed on said first surface of said substrate, for generating a second surface acoustic wave which corresponds to the reference signal and propagates in a direction opposite to the predetermined direction; and an output electrode, formed on said first surface of said substrate, for extracting a convolution signal generated by an interaction between the first and second surface acoustic waves, wherein at least part of said second surface of said substrate comprises a surface inclined along the predetermined direction with respect to said first surface, and the following condition is satisfied:

$L \geq 3\lambda_B/\sin 2\theta$ where $\theta$ is an inclination angle of said inclined surface, L is a length of a region of said output electrode along the predetermined direction, and $\lambda_B$ is a wavelength of a bulk wave generated by an interaction of said first and second surface acoustic waves.

101. A system according to claim 100, wherein said at least part of said second surface of said substrate is inclined in a direction parallel to a propagation direction of the first and second surface acoustic waves.

102. A system according to claim 100, wherein said at least part of said second surface of said substrate is inclined in a direction perpendicular to a propagation direction of the first and second surface acoustic waves.

103. A system according to claim 100, wherein said at least part of said second surface of said substrate comprises two surfaces having opposite inclinations.

104. A system according to claim 100, further comprising a detecting circuit for receiving the convolution signal extracted from said output means and outputting a detected signal to a demodulation circuit.

105. A system according to claim 104, further comprising a synchronous circuit for outputting a synchronous signal generated from the convolution signal to a reference signal generating circuit.

106. A system according to claim 100, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

107. A communication system comprising:
(a) a transmitter for transmitting a signal modulated with information;
(b) a circuit for receiving a signal transmitted from said transmitter;
(c) a surface acoustic wave element for outputting a convolution signal of the received signal and a reference signal;
(d) a circuit for generating the reference signal; and (e) a circuit for demodulating the received signal by using the convolution signal, said surface acoustic wave element comprising:

a piezoelectric substrate having a first surface and a second surface opposing said first surface;

a first input transducer, formed on said first surface of said substrate, for generating a first surface acoustic wave which corresponds to a signal received by said receiving circuit and propagates a predetermined direction;

a second input transducer, formed on said first surface of said substrate, for generating a second surface acoustic wave which corresponds to the reference signal and propagates in a direction opposite to the predetermined direction;

a plurality of waveguides, formed on said first surface of said substrate, for generating a third surface acoustic wave corresponding to the convolution signal in accordance with an interaction between the first and second surface acoustic waves; and an output transducer, formed on said first surface of said substrate, for converting the third surface acoustic wave into an electrical signal and extracting the electrical signal, wherein at least part of said second surface of said substrate comprises a surface inclined along the predetermined direction with respect to said first surface, and the following condition is satisfied:

$L \geq 3\lambda_B/\sin 2\theta$ where $\theta$ is an inclination angle of said inclined surface, L is a length of a region of said waveguides on said first surface along the predetermined direction, and $\lambda_B$ is a wavelength of a bulk wave generated by an interaction of said first and second surface acoustic waves.

108. A system according to claim 107, wherein said at least part of said second surface of said substrate is inclined in a direction parallel to a propagation direction of the first and second surface acoustic waves.

109. A system according to claim 107, wherein said at least part of said second surface of said substrate is inclined in a direction perpendicular to a propagation direction of the first and second surface acoustic waves.

110. A system according to claim 107, wherein said at least part of said second surface of said substrate comprises two surfaces having opposite inclinations.

111. A system according to claim 107, further comprising a detecting circuit for receiving the convolution signal extracted from said output means and outputting a detected signal to a demodulation circuit.

112. A system according to claim 111, further comprising a synchronous circuit for outputting a synchronous signal generated from the convolution signal to a reference signal generating circuit.

113. A system according to claim 107, wherein the signal transmitted from said transmitter is spectrum-diffused, and said receiver further includes a synchronous circuit for generating a synchronous signal from the convolution signal and an inverse diffusion circuit for reproducing a signal prior to spectrum diffusion in accordance with the signal received by said receiving circuit and the synchronous signal and for supplying a reproduced signal to a demodulation circuit.

* * * * *

UNITED STATES PATENT AND TRADEMARK OFFICE
CERTIFICATE OF CORRECTION

PATENT NO. : 5,367,216

DATED : November 22, 1994

INVENTOR : KOICHI EGARA, ET AL.

It is certified that errors appear in the above-identified patent and that said Letters Patent is hereby corrected as shown below:

COLUMN 1

Line 13, "great" should read --great deal--;

Line 30, "pattering" should read --patterning--; and

Line 60, "be" should read --is--.

COLUMN 2

Line 1, "conditions" should read --condition--.

COLUMN 7

Line 67, "A" should read --a--.

COLUMN 8

Line 28, "Are" should read --are--; and

Line 53, "Go" should read --to--.

COLUMN 9

Line 37, "cob" should read --comb--.

COLUMN 23

Line 33, "forme," should read --formed,--.

UNITED STATES PATENT AND TRADEMARK OFFICE
CERTIFICATE OF CORRECTION

PATENT NO. : 5,367,216

DATED : November 22, 1994

INVENTOR : KOICHI EGARA, ET AL.

It is certified that errors appear in the above-identified patent and that said Letters Patent is hereby corrected as shown below:

COLUMN 30

Line 22, "224-n" should read --324-n--.

COLUMN 33

Line 8, "an" should read --a--.

COLUMN 36

Line 7, "to" should read --of--.

COLUMN 42

Line 33, "wave." should read --waves.--; and

Line 66, "correspondes" should read --corresponds--.

IN THE DRAWING

Sheet 23, Fig. 49, "CONVOLVA" should read --CONVOLVER--;

Sheet 24, Fig. 51, "CONVOLVA" should read --CONVOLVER--;

UNITED STATES PATENT AND TRADEMARK OFFICE
CERTIFICATE OF CORRECTION

PATENT NO. : 5,367,216

DATED : November 22, 1994

INVENTOR : KOICHI EGARA, ET AL.

It is certified that errors appear in the above-identified patent and that said Letters Patent is hereby corrected as shown below:

DRAWING, Cont'd.

Sheet 25, Fig. 52, "CONVOLVA" should read --CONVOLVER--; and

Fig. 53, "CONVOLVA" should read --CONVOLVER--.

Signed and Sealed this

Thirtieth Day of May, 1995

Attest:

BRUCE LEHMAN

*Attesting Officer*    *Commissioner of Patents and Trademarks*